US012805045B2

(12) United States Patent
Yang et al.

(10) Patent No.: US 12,805,045 B2
(45) Date of Patent: Nov. 17, 2026

(54) PIXEL SENSOR ARRAYS AND METHODS OF FORMATION

(71) Applicant: Taiwan Semiconductor Manufacturing Company, Ltd., Hsinchu (TW)

(72) Inventors: Ming-Hsien Yang, Taichung City (TW); Chun-Hao Chou, Tainan City (TW); Kuo-Cheng Lee, Tainan City (TW); Chien Nan Tu, Kaohsiung City (TW); Chun-Wei Chia, Kaohsiung City (TW); Tse-Yu Tu, Tainan City (TW); Ya-Min Hung, Pingtung County (TW); Cheng-Hao Chiu, Changhua County (TW); Chun-Liang Lu, Tainan City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 746 days.

(21) Appl. No.: 18/169,642

(22) Filed: Feb. 15, 2023

(65) Prior Publication Data

US 2024/0274636 A1 Aug. 15, 2024

(51) Int. Cl.
*H10F 39/00* (2025.01)
*H10F 39/18* (2025.01)

(52) U.S. Cl.
CPC ......... *H10F 39/807* (2025.01); *H10F 39/014* (2025.01); *H10F 39/024* (2025.01);
(Continued)

(58) Field of Classification Search
CPC ........................................................ H10F 39/807
See application file for complete search history.

(56) References Cited

U.S. PATENT DOCUMENTS 3,899,363 A * 8/1975 Dennard ................. H01L 21/32
257/E21.258
5,618,751 A * 4/1997 Golden ................ H10B 12/038
257/E21.651

(Continued)

FOREIGN PATENT DOCUMENTS

| | | | |
|---|---|---|---|
| CN | 114245045 | A | 3/2022 |
| TW | 201212218 | A | 3/2012 |
| TW | 202243224 | A | 11/2022 |

*Primary Examiner* — Mounir S Amer
*Assistant Examiner* — Alexander Belousov
(74) *Attorney, Agent, or Firm* — Harrity & Harrity, LLP

(57) ABSTRACT

A pixel sensor array of an image sensor device described herein may include a deep trench isolation (DTI) structure that includes a plurality of DTI portions that extend into a substrate of the image sensor device. Two or more subsets of the plurality of DTI portions may extend around photodiodes of a pixel sensor of the pixel sensor array, and may extend into the substrate to different depths. The different depths enable the photocurrents generated by the photodiodes to be binned and used to generate unified photocurrent. In particular, the different depths enable photons to intermix in the photodiodes, which enables quadradic phase detection (QPD) binning for increased PDAF performance. The increased PDAF performance may include increased autofocus speed, increased high dynamic range, increased quantum efficiency (QE), and/or increased full well conversion (FWC), among other examples.

20 Claims, 51 Drawing Sheets

(52) U.S. Cl.
CPC ....... *H10F 39/182* (2025.01); *H10F 39/8053* (2025.01); *H10F 39/8063* (2025.01); *H10F 39/809* (2025.01)

(56) References Cited

U.S. PATENT DOCUMENTS

| | | | | |
|---|---|---|---|---|
| 5,871,659 | A * | 2/1999 | Sakano | H01L 21/3065 438/719 |
| 9,087,757 | B2 * | 7/2015 | Miyanami | H10F 39/807 |
| 11,425,323 | B2 * | 8/2022 | Kim | H04N 25/77 |
| 12,062,679 | B2 * | 8/2024 | Kao | H10F 39/8053 |
| 12,272,715 | B2 * | 4/2025 | Li | H01L 21/76898 |
| 2002/0144974 | A1 * | 10/2002 | Laermer | H01L 21/3065 216/37 |
| 2014/0030840 | A1 * | 1/2014 | Miyanami | H10F 39/014 438/57 |
| 2014/0264709 | A1 * | 9/2014 | Tsai | H01L 21/76898 438/26 |
| 2019/0067355 | A1 * | 2/2019 | Li | H10F 39/8067 |
| 2019/0067356 | A1 * | 2/2019 | Lin | H10F 39/182 |
| 2019/0096929 | A1 * | 3/2019 | Chiang | H10F 39/199 |
| 2020/0357832 | A1 * | 11/2020 | Shimotsusa | H10F 39/8063 |
| 2021/0118924 | A1 * | 4/2021 | Tamaki | H10F 39/8063 |
| 2022/0310678 | A1 * | 9/2022 | Li | H10F 39/199 |
| 2022/0344383 | A1 * | 10/2022 | Kao | H10F 39/018 |
| 2023/0043634 | A1 * | 2/2023 | Liu | G02B 6/43 |
| 2024/0274636 | A1 * | 8/2024 | Yang | H10F 39/8053 |
| 2025/0015115 | A1 * | 1/2025 | Furumoto | H10D 84/00 |

* cited by examiner

PIXEL SENSOR ARRAYS AND METHODS OF FORMATION

BACKGROUND

A complementary metal oxide semiconductor (CMOS) image sensor may include a plurality of pixel sensors. A pixel sensor of the CMOS image sensor may include a transfer transistor, which may include a photodiode configured to convert photons of incident light into a photocurrent of electrons and a transfer gate configured to control the flow of the photocurrent between the photodiode and a drain region. The drain region may be configured to receive the photocurrent such that the photocurrent can be measured and/or transferred to other areas of the CMOS image sensor.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
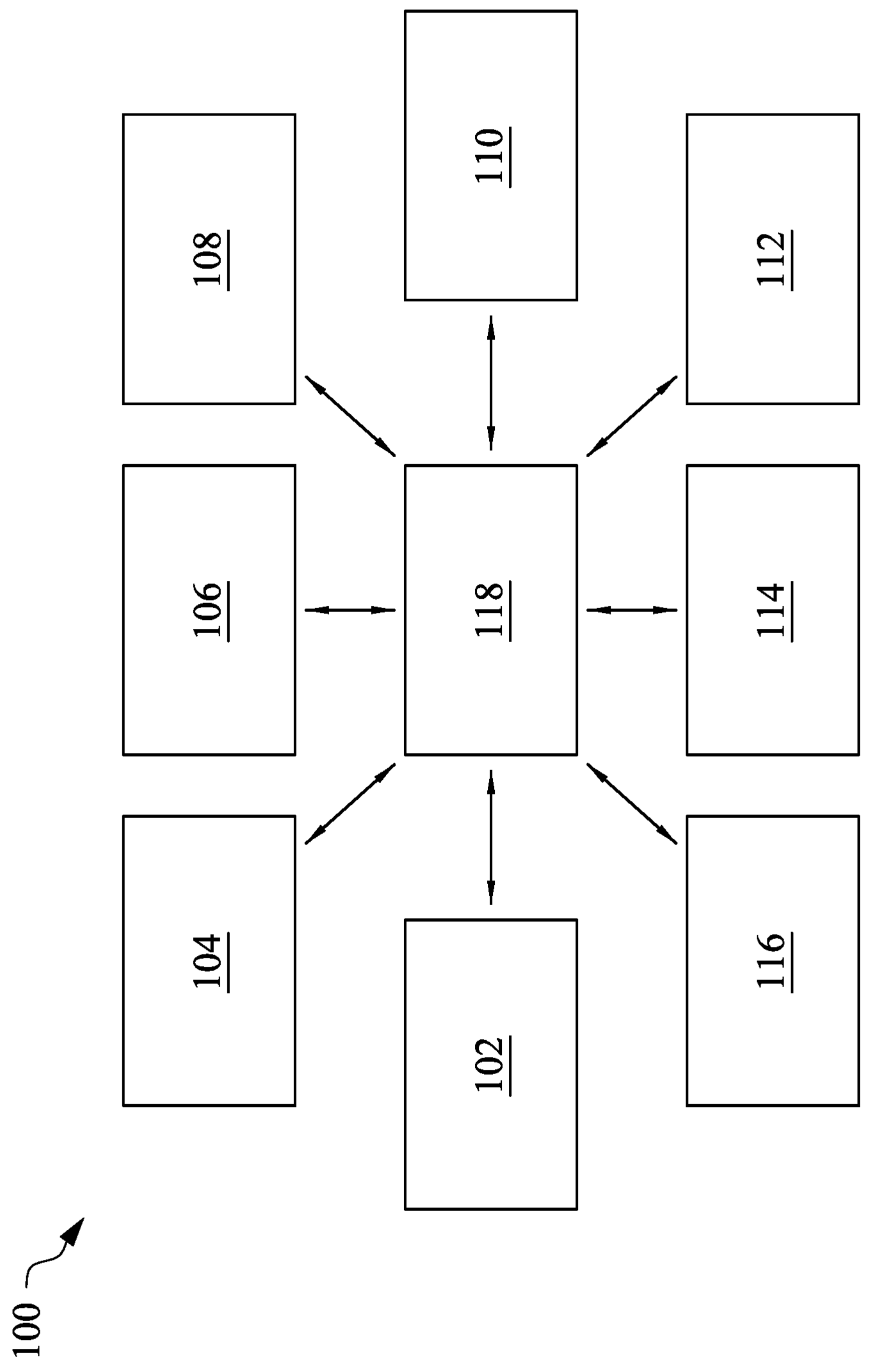
FIG. 1 is a diagram of an example environment in which systems and/or methods described herein may be implemented.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An image sensor device (e.g., a complementary metal oxide semiconductor (CMOS) image sensor device or another type of image sensor device) is a type of electronic semiconductor device that uses pixel sensors to generate a photocurrent based on light received at the pixel sensors. The magnitude of the photocurrent may be based on the intensity of the light, based on the wavelength of the light, and/or based on another attribute of the light. The photocurrent is then processed to generate an electronic image, an electronic video, and/or another type of electronic signal.

Typically, a camera device that includes the image sensor device may also include a separate phase detector auto focus (PDAF) device. A portion of incident light that is received through a lens of the camera device is directed to the PDAF device for the purpose of performing autofocus functions of the camera device to focus a field of view onto the image sensor device. Having a separate image sensor device and a separate PDAF device in a camera device increases complexity and cost of the camera device in that additional circuitry is needed to interconnect the separate image sensor device and the separate PDAF device in the camera device. Moreover, having a separate image sensor device and a separate PDAF device in a camera device may prohibit reducing the size or formfactor of the camera device in that the separate image sensor device and the separate PDAF device may occupy a relatively large area in the camera device. In addition, having a separate image sensor device and a separate PDAF device in a camera device may increase the manufacturing complexity of the camera device in that separate semiconductor manufacturing processes are used to manufacture the separate image sensor device and the separate PDAF device.

Some implementations described herein provide image sensor devices, and associated methods of formation, in which PDAF functionality is integrated into a pixel sensor array of the image sensor devices. This enables an image sensor device described herein to perform autofocus and image capture in the same pixel sensor array. In this way, integrating autofocus and image capture functionality into a single image sensor device may reduce complexity and cost of a camera device in which the image sensor device is included, in that the complexity of circuitry in the camera device may be reduced. Moreover, integrating autofocus and image capture functionality into a single image sensor device may reduce the size or formfactor of a camera device, in which the image sensor device is included, in that the image sensor device may occupy a lesser amount of area in the camera device relative to a separate image sensor device and a separate PDAF device. In addition, integrating autofocus and image capture functionality into a single image sensor device may reduce the manufacturing complexity of a camera device, in which the image sensor device is included, in that image sensor device can be manufactured with a single set of semiconductor manufacturing processes.

Moreover, as described herein, a pixel sensor array of an image sensor device described herein may include a deep trench isolation (DTI) structure that includes a plurality of DTI portions that extend into a substrate of the image sensor device. Two or more subsets of the plurality of DTI portions may extend around photodiodes of a pixel sensor of the pixel sensor array, and may extend into the substrate to different depths. The different depths enable the photocurrents generated by the photodiodes to be binned and used to generate unified photocurrent. In particular, the different depths enable photons to intermix in the photodiodes, which enables quadradic phase detection (QPD) binning for increased PDAF performance. The increased PDAF performance may include increased autofocus speed, increased high dynamic range, increased quantum efficiency (QE), and/or increased full well conversion (FWC), among other examples.

FIG. 1 is a diagram of an example environment 100 in which systems and/or methods described herein may be implemented. As shown in FIG. 1, environment 100 may include a plurality of semiconductor processing tools 102-116 and a wafer/die transport tool 118. The plurality of semiconductor processing tools 102-116 may include a deposition tool 102, an exposure tool 104, a developer tool 106, an etch tool 108, a planarization tool 110, a plating tool 112, an ion implantation tool 114, a bonding tool 116, and/or another type of semiconductor processing tool. The tools included in example environment 100 may be included in a semiconductor clean room, a semiconductor foundry, a semiconductor processing facility, and/or manufacturing facility, among other examples.

The deposition tool 102 is a semiconductor processing tool that includes a semiconductor processing chamber and one or more devices capable of depositing various types of materials onto a substrate. In some implementations, the deposition tool 102 includes a spin coating tool that is capable of depositing a photoresist layer on a substrate such as a wafer. In some implementations, the deposition tool 102 includes a chemical vapor deposition (CVD) tool such as a plasma-enhanced CVD (PECVD) tool, a low pressure CVD (LPCVD) tool, a high-density plasma CVD (HDP-CVD) tool, a sub-atmospheric CVD (SACVD) tool, an atomic layer deposition (ALD) tool, a plasma-enhanced atomic layer deposition (PEALD) tool, or another type of CVD tool. In some implementations, the deposition tool 102 includes a physical vapor deposition (PVD) tool, such as a sputtering tool or another type of PVD tool. In some implementations, the example environment 100 includes a plurality of types of deposition tools 102.

The exposure tool 104 is a semiconductor processing tool that is capable of exposing a photoresist layer to a radiation source, such as an ultraviolet light (UV) source (e.g., a deep UV light source, an extreme UV light (EUV) source, and/or the like), an x-ray source, an electron beam (e-beam) source, and/or the like. The exposure tool 104 may expose a photoresist layer to the radiation source to transfer a pattern from a photomask to the photoresist layer. The pattern may include one or more semiconductor device layer patterns for forming one or more semiconductor devices, may include a pattern for forming one or more structures of a semiconductor device, may include a pattern for etching various portions of a semiconductor device, and/or the like. In some implementations, the exposure tool 104 includes a scanner, a stepper, or a similar type of exposure tool.

The developer tool 106 is a semiconductor processing tool that is capable of developing a photoresist layer that has been exposed to a radiation source to develop a pattern transferred to the photoresist layer from the exposure tool 104. In some implementations, the developer tool 106 develops a pattern by removing unexposed portions of a photoresist layer. In some implementations, the developer tool 106 develops a pattern by removing exposed portions of a photoresist layer. In some implementations, the developer tool 106 develops a pattern by dissolving exposed or unexposed portions of a photoresist layer through the use of a chemical developer.

The etch tool 108 is a semiconductor processing tool that is capable of etching various types of materials of a substrate, wafer, or semiconductor device. For example, the etch tool 108 may include a wet etch tool, a dry etch tool, and/or the like. In some implementations, the etch tool 108 includes a chamber that is filled with an etchant, and the substrate is placed in the chamber for a particular time period to remove particular amounts of one or more portions of the substrate. In some implementations, the etch tool 108 may etch one or more portions of the substrate using a plasma etch or a plasma-assisted etch, which may involve using an ionized gas to isotropically or directionally etch the one or more portions.

The planarization tool 110 is a semiconductor processing tool that is capable of polishing or planarizing various layers of a wafer or semiconductor device. For example, a planarization tool 110 may include a chemical mechanical planarization (CMP) tool and/or another type of planarization tool that polishes or planarizes a layer or surface of deposited or plated material. The planarization tool 110 may polish or planarize a surface of a semiconductor device with a combination of chemical and mechanical forces (e.g., chemical etching and free abrasive polishing). The planarization tool 110 may utilize an abrasive and corrosive chemical slurry in conjunction with a polishing pad and retaining ring (e.g., typically of a greater diameter than the semiconductor device). The polishing pad and the semiconductor device may be pressed together by a dynamic polishing head and held in place by the retaining ring. The dynamic polishing head may rotate with different axes of rotation to remove material and even out any irregular topography of the semiconductor device, making the semiconductor device flat or planar.

The plating tool 112 is a semiconductor processing tool that is capable of plating a substrate (e.g., a wafer, a semiconductor device, and/or the like) or a portion thereof with one or more metals. For example, the plating tool 112 may include a copper electroplating device, an aluminum electroplating device, a nickel electroplating device, a tin electroplating device, a compound material or alloy (e.g., tin-silver, tin-lead, and/or the like) electroplating device, and/or an electroplating device for one or more other types of conductive materials, metals, and/or similar types of materials.

The ion implantation tool 114 is a semiconductor processing tool that is capable of implanting ions into a substrate. The ion implantation tool 114 may generate ions in an arc chamber from a source material such as a gas or a solid. The source material may be provided into the arc chamber, and an arc voltage is discharged between a cathode and an electrode to produce a plasma containing ions of the source material. One or more extraction electrodes may be used to extract the ions from the plasma in the arc chamber and accelerate the ions to form an ion beam. The ion beam may be directed toward the substrate such that the ions are implanted below the surface of the substrate.

The bonding tool 116 is a semiconductor processing tool that is capable of bonding two or more wafers (or two or more semiconductor substrates, or two or more semiconductor devices) together. For example, the bonding tool 116 may include a eutectic bonding tool that is capable of forming a eutectic bond between two or more wafers together. In these examples, the bonding tool may heat the two or more wafers to form a eutectic system between the materials of the two or more wafers. As another example, the bonding tool 116 may include a hybrid bonding tool, a direct bonding tool, and/or another type of bonding tool.

The wafer/die transport tool 118 may be included in a cluster tool or another type of tool that includes a plurality of processing chambers, and may be configured to transport substrates and/or semiconductor devices between the plurality of processing chambers, to transport substrates and/or semiconductor devices between a processing chamber and a buffer area, to transport substrates and/or semiconductor devices between a processing chamber and an interface tool such as an equipment front end module (EFEM), and/or to transport substrates and/or semiconductor devices between a processing chamber and a transport carrier (e.g., a front opening unified pod (FOUP)), among other examples. In some implementations, a wafer/die transport tool 118 may be included in a multi-chamber (or cluster) deposition tool 102, which may include a pre-clean processing chamber (e.g., for cleaning or removing oxides, oxidation, and/or other types of contamination or byproducts from a substrate and/or semiconductor device) and a plurality of types of deposition processing chambers (e.g., processing chambers for depositing different types of materials, processing chambers for performing different types of deposition operations).

In some implementations, one or more of the semiconductor processing tools 102-116 and/or the wafer/die transport tool 118 may perform one or more semiconductor processing operations described herein. For example, one or more of the semiconductor processing tools 102-116 and/or the wafer/die transport tool 118 may form a plurality of photodiodes in a substrate of a pixel sensor array; may perform a plurality of etch-deposition-etch cycles to form a plurality of trenches around the plurality of photodiodes in the substrate, where the plurality of trenches are formed from a top surface of the substrate; may fill the plurality of trenches with one or more dielectric layers to form a DTI structure that surrounds the plurality of photodiodes, wherein two or more DTI portions of the DTI structure extend, from the top surface of the substrate, to different depths in the substrate; may form a grid structure above the substrate and over the DTI structure; may form a color filter region in between the grid structure and above the plurality of photodiodes; and/or may form a micro lens over the color filter region, among other examples. One or more of the semiconductor processing tools 102-116 and/or the wafer/die transport tool 118 may perform other semiconductor processing operations described herein, such as in connection with FIGS. 3A, 6A-6D, 7, 8, 9A, 10A, 11A, 12A-12F, 14A-14C, 16A-16C, and/or 21, among other examples.

The number and arrangement of devices shown in FIG. 1 are provided as one or more examples. In practice, there may be additional devices, fewer devices, different devices, or differently arranged devices than those shown in FIG. 1. Furthermore, two or more devices shown in FIG. 1 may be implemented within a single device, or a single device shown in FIG. 1 may be implemented as multiple, distributed devices. Additionally, or alternatively, a set of devices (e.g., one or more devices) of the example environment 100 may perform one or more functions described as being performed by another set of devices of the example environment 100.

Figure 2:
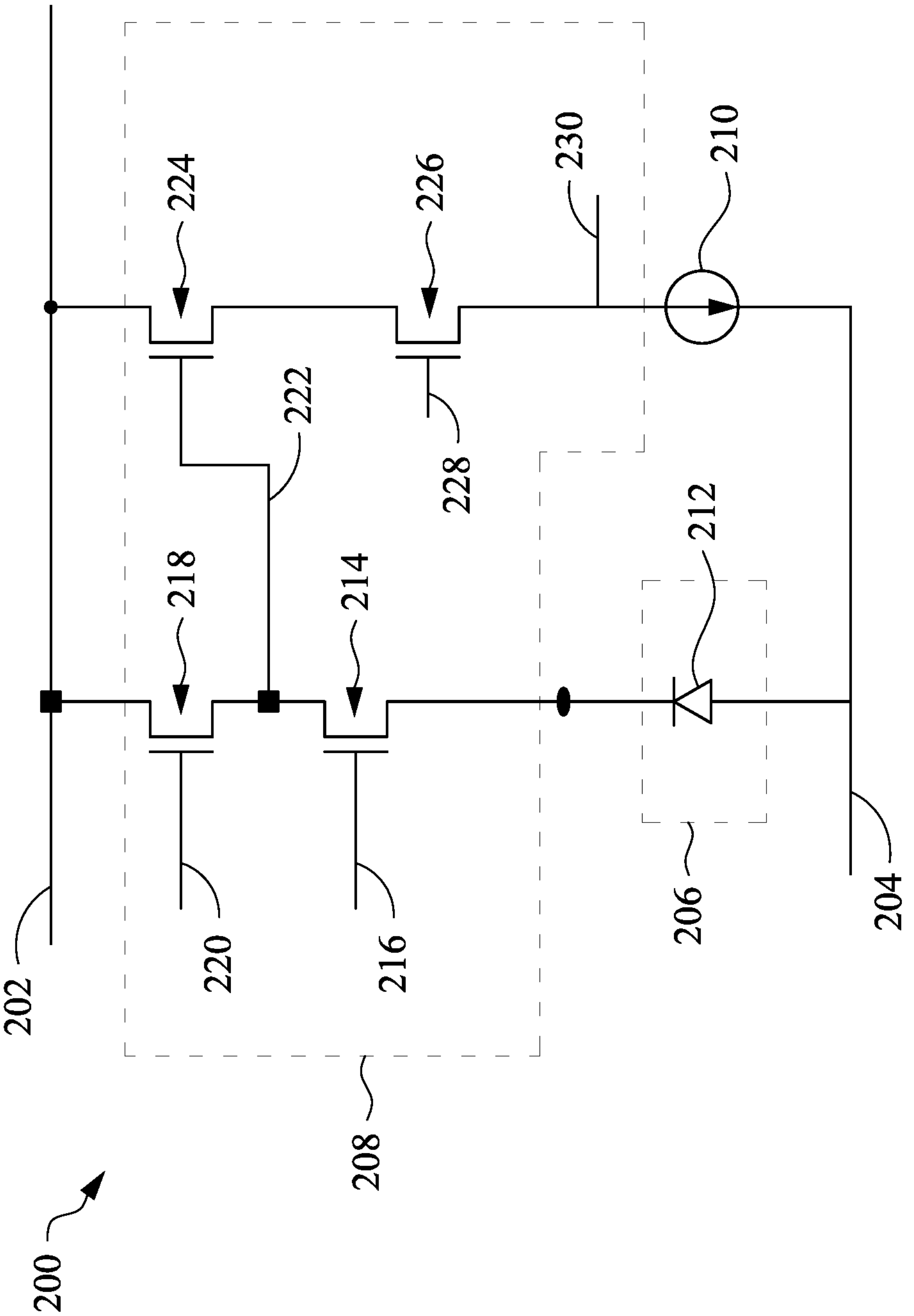
FIG. 2 is a diagram of an example of a pixel sensor described herein.

FIG. 2 is a diagram of an example of a pixel sensor 200 described herein. The pixel sensor 200 may include a front side pixel sensor (e.g., a pixel sensor that is configured to receive photons of light from a front side of a sensor die), a back side pixel sensor (e.g., a pixel sensor that is configured to receive photons of light from a back side of a sensor die), and/or another type of pixel sensor. The pixel sensor 200 may be electrically connected to a supply voltage ($V_{dd}$) 202 and an electrical ground 204.

The pixel sensor 200 includes a sensing region 206 that may be configured to sense and/or accumulate incident light (e.g., light directed toward the pixel sensor 200). The pixel sensor 200 also includes a control circuitry region 208. The control circuitry region 208 is electrically connected with the sensing region 206 and is configured to receive a photocurrent 210 that is generated by the sensing region 206. Moreover, the control circuitry region 208 is configured to transfer the photocurrent 210 from the sensing region 206 to downstream circuits such as amplifiers or analog-to-digital (AD) converters, among other examples.

The sensing region 206 includes a photodiode 212. The photodiode 212 may absorb and accumulate photons of the incident light, and may generate the photocurrent 210 based on absorbed photons. The magnitude of the photocurrent 210 is based on the amount of light collected in the photodiode 212. Thus, the accumulation of photons in the photodiode 212 generates a build-up of electrical charge that represents the intensity or brightness of the incident light (e.g., a greater amount of charge may correspond to a greater intensity or brightness, and a lower amount of charge may correspond to a lower intensity or brightness).

The photodiode 212 is electrically connected with a source of a transfer transistor 214 in the control circuitry region 208. The transfer transistor 214 is configured to control the discharge of the photocurrent 210 from the photodiode 212. The photocurrent 210 is provided from the source of the transfer transistor 214 to a drain of the transfer transistor 214 based on selectively switching a gate of the transfer transistor 214. The gate of the transfer transistor 214 may be selectively switched by applying a transfer voltage ($V_{tx}$) 216 to the gate of the transfer transistor 214. In some implementations, the transfer voltage 216 being applied to the gate of the transfer transistor 214 causes a conductive channel to form between the source and the drain of the transfer transistor 214, which enables the photocurrent 210 to traverse along the conductive channel from the source to the drain. In some implementations, the transfer voltage 216 being removed from the gate (or the absence of the transfer voltage 216) causes the conductive channel to be removed such that the photocurrent 210 cannot pass from the source to the drain.

The control circuitry region 208 further includes a reset transistor 218. The reset transistor 218 is electrically connected to the supply voltage 202 and to the drain of the transfer transistor 214. The reset transistor 218 is configured to pull the drain of the transfer transistor 214 to a high voltage (e.g., to the supply voltage 202) to "reset" the control circuitry region 208 prior to activation of the transfer transistor 214 to read the photocurrent 210 from the photodiode 212. The reset transistor 218 may be controlled by a reset voltage (Vrst) 220.

The output from the drain of the transfer transistor 214 is electrically connected by a floating diffusion node 222 with a gate of a source follower transistor 224. The output from the transfer transistor 214 is provided to the gate of the source follower transistor 224 by the floating diffusion node 222, which applies a floating diffusion voltage ($V_{fd}$) to the gate of the source follower transistor 224. This permits the photocurrent 210 to be observed without removing or discharging the photocurrent 210 from the floating diffusion node 222. The reset transistor 218 is instead used to remove or discharge the photocurrent 210 from the floating diffusion node 222.

The source follower transistor 224 functions as a high impedance amplifier for the pixel sensor 200. The source follower transistor 224 provides a voltage to current conversion of the floating diffusion voltage. The output of the source follower transistor 224 is electrically connected with a row select transistor 226, which is configured to control the flow of the photocurrent 210 to external circuitry. The row select transistor 226 is controlled by selectively applying a select voltage ($V_{di}$) 228 to the gate of the row select transistor 226. This permits the photocurrent 210 to flow to an output 230 of the pixel sensor 200.

As described herein, one or more transistors of the control circuitry region 208 of the pixel sensor 200 may be included in separate dies of a stacked image sensor device such as a 3D CMOS image sensor (3DCIS). In particular, the row select transistor 226 and/or the source follower transistor 224 may be included in a different die from the photodiode 212, the transfer transistor 214 and the reset transistor 218 to provide a greater amount of space or area for the photodiode 212. This enables the size of the photodiode 212 to be increased to increase the sensitivity and/or overall performance of the light sensing performance of the pixel sensor 200, and/or enables the size of the pixel sensor 200 to be decreased while maintaining the same size for the photodiode 212.

As indicated above, FIG. 2 is provided as an example. Other examples may differ from what is described with regard to FIG. 2.

Figure 3A:
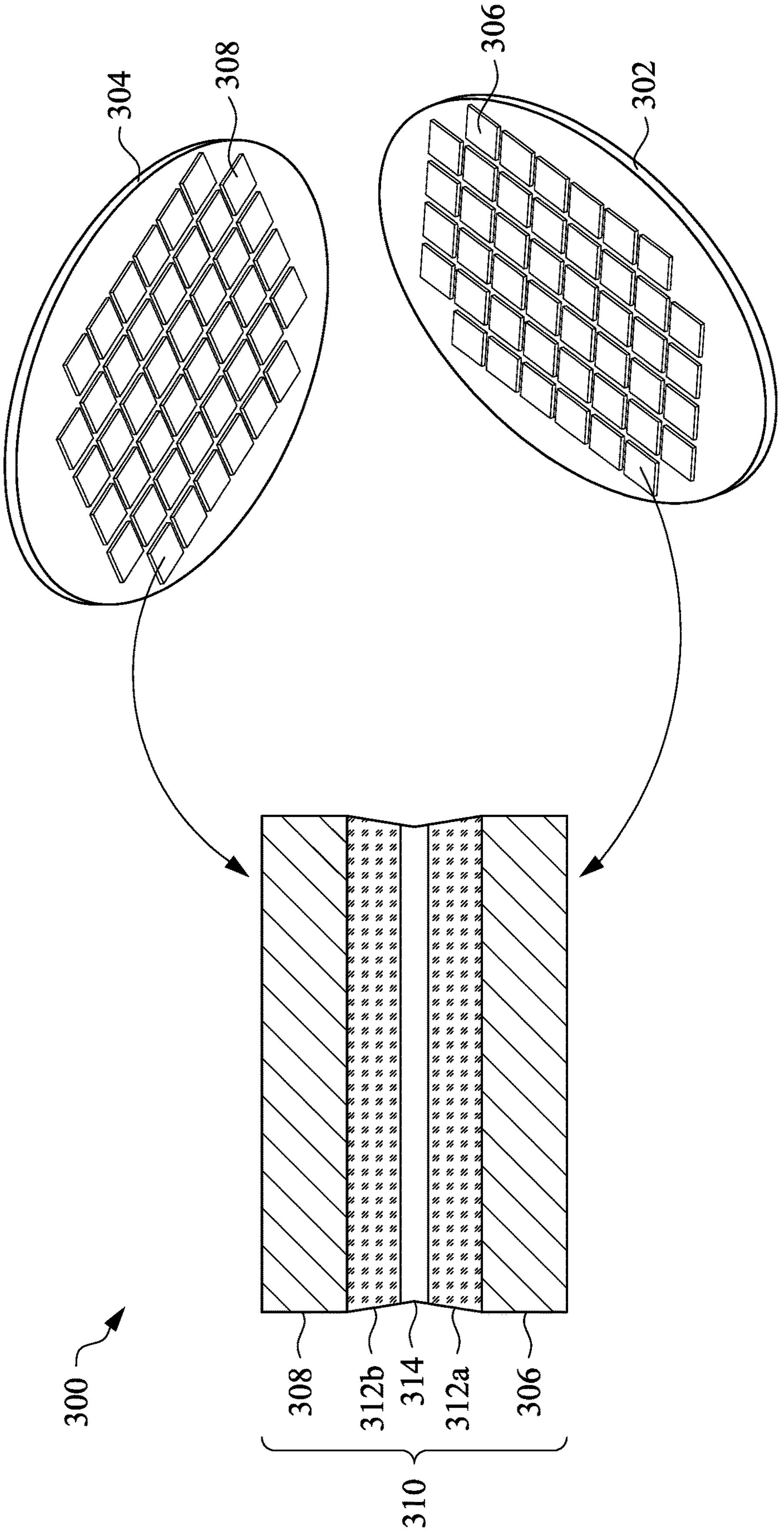
FIGS. 3A and 3B are diagrams of examples of a stacked image sensor device described herein.
Figure 3B:
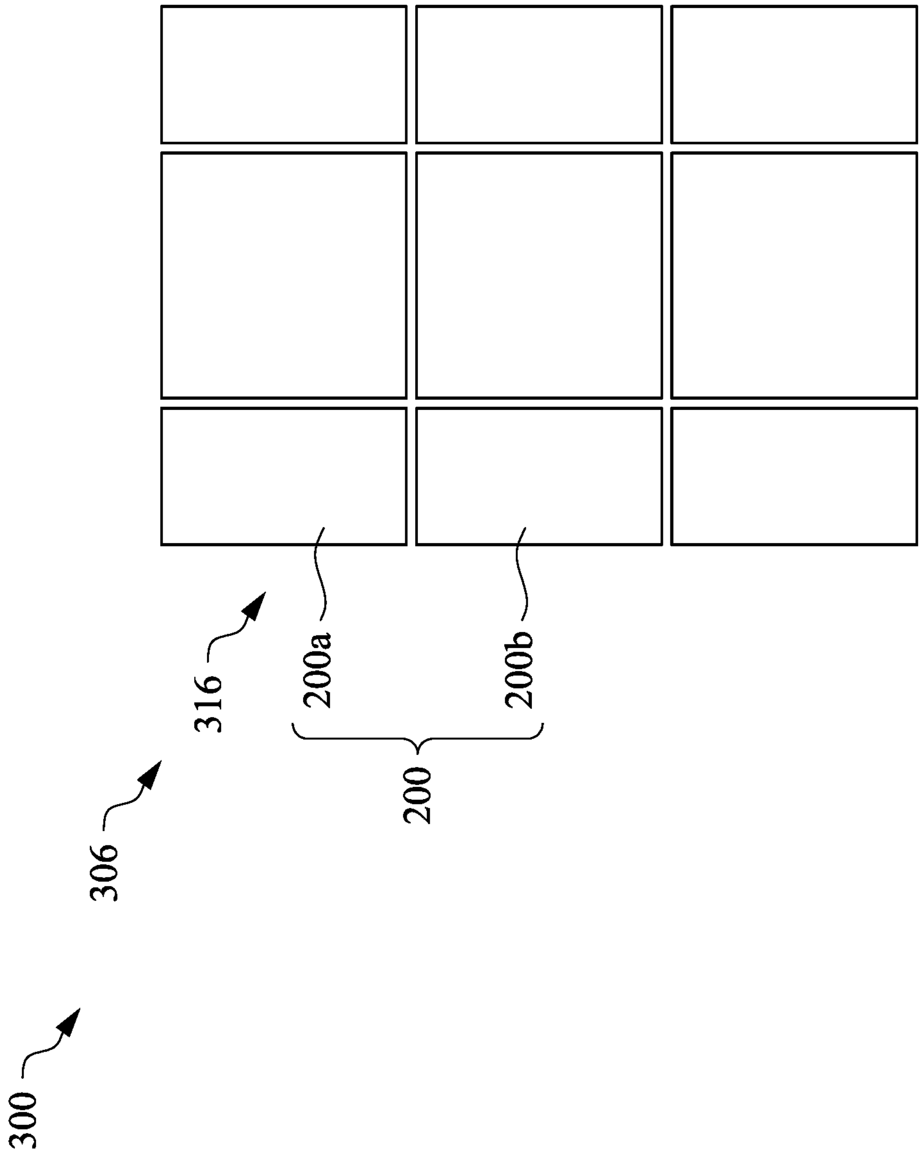

FIGS. 3A and 3B are diagrams of examples 300 of a stacked image sensor device described herein. As shown in FIG. 3A, the stacked image sensor device may be formed by bonding a sensor wafer 302 and a circuitry wafer 304. For example, the bonding tool 116 may perform a bonding operation to bond the sensor wafer 302 and the circuitry wafer 304 using a hybrid bonding technique, a direct bonding technique, a eutectic bonding technique, and/or another bonding technique. In the bonding operation, sensor dies 306 on the sensor wafer 302 are bonded with associated circuitry dies 308 on the circuitry wafer 304 to form stacked image sensor devices 310. The image sensor devices 310 are then diced and packaged. Other processing steps may be performed to form the image sensor devices 310.

Each image sensor device 310 includes a sensor die 306 and a circuitry die 308. The sensor die 306 includes a pixel sensor array that includes a plurality of pixel sensors 200, or portions of a plurality of pixel sensors 200. In particular, the pixel sensor array includes at least the sensing regions 206 (and thus, the photodiodes 212) of the pixel sensors 200. Accordingly, the sensor die 306 primarily is configured to sense photons of incident light and convert the photons to a photocurrent 210.

The circuitry die 308 includes circuitry that is configured to measure, manipulate, and/or otherwise use the photocurrent 210. Moreover, the circuitry die 308 includes at least a subset of the transistors of the control circuitry regions 208 of the pixel sensors 200. For example, the circuitry die 308 may include the row select transistors 226 of the pixel sensors 200, the source follower transistors 224 of the pixel sensor 200, and/or a combination thereof. This provides increased area on the sensor die 306 for the photodiodes 212, which enables the size of the photodiodes 212 to be increased to increase the sensitivity and/or overall performance of the light sensing performance of the pixel sensor 200, and/or enables the size of the pixel sensors 200 to be decreased while maintaining the same size for the photodiodes 212.

As further shown in FIG. 3A, the sensor die 306 may include a back end of line (BEOL) region 312*a* and the circuitry die 308 may include a BEOL region 312*b*. The BEOL region 312*a* and the BEOL region 312*b* may each include one or more metallization layers that are insulated by one or more dielectric layers. The BEOL region 312*a* and the BEOL region 312*b* may electrically connect the sensor die 306 and the circuitry die 308, and may electrically connect one or more components of the sensor die 306 and the circuitry die 308 to packaging and/or other structures, among other examples. The sensor die 306 and the circuitry die 308 may be bonded at a bonding region 314, which may be included between the BEOL region 312*a* and the BEOL region 312*b* or may be included in a portion of the BEOL region 312*a* and/or a portion of the BEOL region 312*b*.

FIG. 3B is a diagram of an example pixel sensor array 316 included on a sensor die 306. FIG. 3B illustrates a top-down view of the pixel sensor array 316. The pixel sensor array 316 may be included on a sensor die 306 of an image sensor device 310. As shown in FIG. 3B, the pixel sensor array 316 may include a plurality of pixel sensors 200 (or portions of the plurality of plurality of pixel sensors 200). As further shown in FIG. 3B, the pixel sensors 200 may be arranged in a grid. In some implementations, the pixel sensors 200 are square-shaped (as shown in the example in FIG. 3B). In some implementations, the pixel sensors 200 include other shapes such as rectangle shapes, circle shapes, octagon shapes, diamond shapes, and/or other shapes.

In some implementations, the size of the pixel sensors 200 (e.g., the width or the diameter) of the pixel sensors 200 is approximately 1 micron. In some implementations, the size (e.g., the width or the diameter) of the pixel sensors 200 is less than approximately 1 micron. For example, a width of one or more of the pixel sensors 200 may be included in a range of approximately 0.6 microns to approximately 0.7 microns. In these examples, the pixel sensors 200 may be referred to as sub-micron pixel sensors. Sub-micron pixel sensors may decrease the pixel sensor pitch (e.g., the distance between adjacent pixel sensors) in the pixel sensor array 316, which may enable increased pixel sensor density in the pixel sensor array 316 (which can increase the performance of the pixel sensor array 316). However, other values for the range of the size of the pixel sensors 200 are within the scope of the present disclosure.

In some implementations, the pixel sensor array 316 may include a plurality of types of pixel sensors. For example, the pixel sensor array 316 may include a first plurality of pixel sensors 200*a* that are configured to support autofocus operations of the image sensor device 310. The pixel sensors 200*a* may be referred to as QPD pixel sensors or PDAF pixel sensors. The circuitry on the circuitry die 308 may receive a photocurrent generated by the pixel sensors 200*a* and may perform PDAF for the image sensor device 310 based on the photocurrent.

As another example, the pixel sensor array 316 may include a second plurality of pixel sensors 200*b* that are configured to support image generation operations of the image sensor device 310. The pixel sensors 200*b* may be configured to generate information associated with color, light intensity, contrast, and/or another type of information associated with an image to be generated using the image sensor device 310.

As indicated above, FIGS. 3A and 3B are provided as examples. Other examples may differ from what is described with regard to FIGS. 3A and 3B.

Figure 4A:
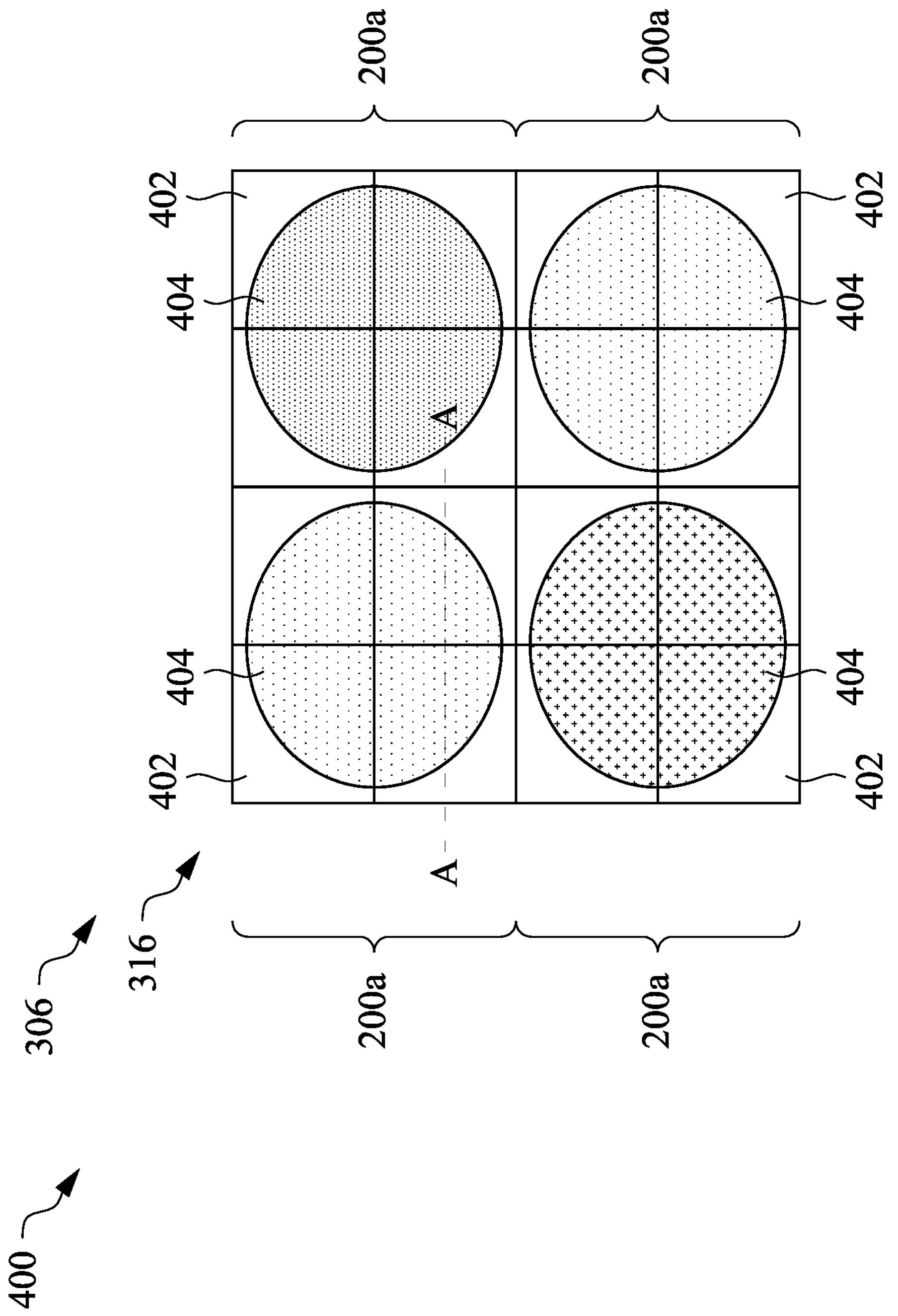
FIGS. 4A and 4B are diagrams of an example implementation of the pixel sensor array described herein.
Figure 4B:
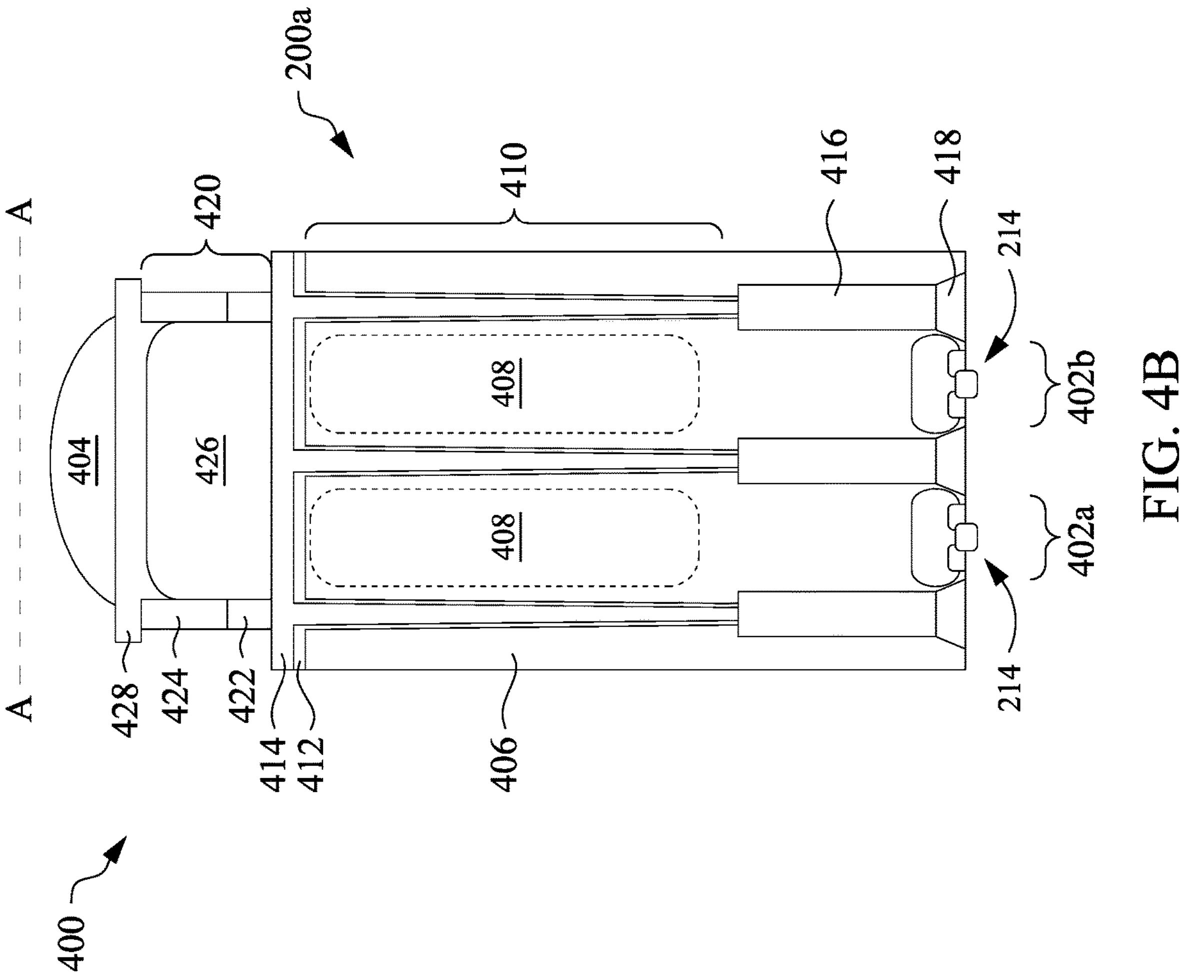

FIGS. 4A and 4B are diagrams of an example implementation 400 of the pixel sensor array 316 described herein. The pixel sensor array 316 may be included on the sensor die 306 of the image sensor device 310. In the example implementation 400, the pixel sensor array 316 includes a plurality of pixel sensors 200*a* (e.g., PDAF pixel sensors, QPD pixel sensors) that are configured to generate photocurrents for the purpose of performing autofocus and image capture for the image sensor device 310.

FIG. 4A illustrates a top-down view of a portion of the pixel sensor array 316. As shown in FIG. 4A, the pixel sensor array 316 may include a plurality of pixel sensor 200*a* that are arranged in a grid. At least a subset of the pixel sensors 200*a* may be configured to absorb photons of light in a particular wavelength range of visible light (e.g., red light, blue light, or green light). For example, one or more first pixel sensors 200*a* may be configured to absorb photons of light in a particular wavelength range of visible light corresponding to green light, one or more second pixel sensors 200*a* may be configured to absorb photons of light in a particular wavelength range of visible light corresponding to red light, one or more third pixel sensors 200*a* may be configured to absorb photons of light in a particular wavelength range of visible light corresponding to blue light, and so on.

In some implementations, the pixel sensor array 316 may include groups or regions of pixel sensors 200*a* that are configured for quadradic photodetection. As an example, the portion of the pixel sensor array 316 illustrated in FIG. 4A may be referred to as a 4-cell (4C) QPD region, and may include two green pixel sensors 200*a*, a blue pixel sensor 200*a*, and a red pixel sensor 200*a*. The pixel sensor array 316 may include one or more of the 4-cell QPD regions illustrated in FIG. 4A. A pixel sensor 200*a* in the 4-cell QPD region may include a plurality of subregions 402 and a micro lens (e.g., a single micro lens) 404 over the plurality of subregions 402. Each subregion 402 of a pixel sensor 200*a* may include a photodiode that is configured to generate a photocurrent based on photon absorption in the photodiode. The photocurrents generated by the photodiodes in the subregions 402 of a pixel sensor 200*a* may be binned such that a single unified photocurrent is provided from the pixel sensor 200*a* to the circuitry on the circuitry die 308 for performing autofocus for the image sensor device 310.

FIG. 4B illustrates a cross-section view, along the line A-A illustrated in FIG. 4A, of an example pixel sensor 200*a* in the 4-cell QPD region illustrated in FIG. 4A. As shown in FIG. 4B, the pixel sensor 200*a* may include a plurality of subregions 402, such as subregion 402*a* and subregion 402*b*. Subregion 402*a* and subregion 402*b* may be arranged in a horizontally adjacent or side-by-side configuration in a substrate 406 of the sensor die 306.

The substrate 406 may include a semiconductor die substrate, a semiconductor wafer, a stacked semiconductor wafer, or another type of substrate in which semiconductor pixels may be formed. In some implementations, the substrate 406 is formed of silicon (Si) (e.g., a silicon substrate), a material including silicon, a III-V compound semiconductor material such as gallium arsenide (GaAs), a silicon on insulator (SOI), or another type of semiconductor material that is capable of generating a charge from photons of incident light. In some implementations, the substrate 406 is formed of a doped material (e.g., a p-doped material or an n-doped material) such as a doped silicon.

Each of the subregions 402 may include a respective photodiode 408 that is included in the substrate 406. The photodiodes 408 may include a plurality of regions that are doped with various types of ions to form a p-n junction or a PIN junction (e.g., a junction between a p-type portion, an intrinsic (or undoped) type portion, and an n-type portion). For example, the substrate 406 may be doped with an n-type dopant to form one or more n-type regions of a photodiode 408, and the substrate 406 may be doped with a p-type dopant to form a p-type region of the photodiode 408. The photodiode 408 may be configured to absorb photons of incident light. The absorption of photons causes the photodiode 408 to accumulate a charge (referred to as a photocurrent) due to the photoelectric effect. Photons may bombard the photodiode 408, which causes emission of electrons in the photodiode 408.

The regions included in a photodiode 408 may be stacked and/or vertically arranged. For example, the p-type region may be included over the one or more n-type regions. The p-type region may provide noise isolation for the one or more n-type regions and may facilitate photocurrent generation in the photodiode 408. In some implementations, the p-type region (and thus, the photodiode 408) is spaced away (e.g., downward) from a top surface (e.g., a first surface) of the substrate 406 to provide noise isolation and/or light-leakage isolation from one or more metallization layers of the pixel sensor 200*a*. The gap between the surface of the substrate 406 and the p-type region may decrease charging of the pixel sensor 200*a*, may decrease the likelihood of plasma damage to the photodiode 408, and/or may reduce the dark current of the pixel sensor 200*a* and/or the white pixel performance of the pixel sensor 200*a*, among other examples.

As further shown in FIG. 4B, each of the subregions 402 may include a transfer transistor 214. A transfer transistor 214 may be located at a bottom surface (e.g., second surface opposing the first surface) of the substrate 406. A transfer transistor 214 in a subregion 402 of the pixel sensor 200*a* may be configured to receive the photocurrent generated by the photodiode 408 of the subregion 402, and transfer the photocurrent to circuitry on the circuitry die 308. A transfer transistor 214 may include a drain region and a transfer gate that selectively controls the flow of the photocurrent from a corresponding photodiode 408 to the drain region. A transfer transistor 214 may be implemented by a field effect transistor (FET), such as a planar FET, a finFET, a nanostructure FET (e.g., a GAA FET), and/or another type of FET.

The pixel sensor 200*a* may include a plurality of regions and/or structures that are configured to provide electrical isolation and/or optical isolation between the photodiodes 408 of the pixel sensor 200*a* and/or between the pixel sensor 200*a* and adjacent pixel sensors 200*a* in the pixel sensor array 316. For example, the pixel sensor 200*a* may include a DTI structure 410 that includes a grid-shaped structure that extends into the substrate 406 and around the photodiodes 408 of the pixel sensors 200*a* included in the pixel sensor array 316.

The DTI structure 410 may include one or more trenches that extend downward into the substrate 406. The trenches may extend into the substrate 406 from the top surface of the substrate 406. The image sensor device 310 may be referred to as a backside illuminated (BSI) image sensor device in that photons enter the photodiodes 408 from the backside of the pixel sensors 200*a*. Accordingly, the top surface (e.g., the first surface) of the substrate 406 may be referred to as the backside of the substrate 406. The trenches of the DTI structure 410 may extend into the substrate 406 from the backside of the substrate 406. Thus, the DTI structure 410 may be referred to as a backside DTI (BDTI) structure. Alternatively, the DTI structure 410 may include a frontside DTI (FDTI) structure that extends into the substrate from the bottom surface (e.g., the second surface) of the substrate 406.

Referring to the top-down view of the portion of the pixel sensor array 316 in FIG. 4A, the DTI structure 410 may extend in between the subregions 402 of a pixel sensor 200*a*, and in between the pixel sensors 200*a* of the pixel sensor array 316 in a grid-like manner. The DTI structure 410 may provide optical isolation between the pixel sensors 200*a* and the photodiodes 408 to reduce the amount of optical crosstalk between pixel sensors 200*a*. In particular, the DTI structure 410 may absorb, refract, and/or reflect photons of incident light, which may reduce the amount of incident light that travels through a pixel sensor 200*a* into an adjacent pixel sensor and is absorbed by the adjacent pixel sensor 200*a*.

The DTI structure 410 may include one or more layers. The one or more layers may include a high dielectric constant (high-k) dielectric liner 412 and an oxide layer 414, among other examples. In some implementations, the high-k dielectric liner 412 and/or the oxide layer 414 extend along the top surface (e.g., the first surface) of the substrate 406, as shown in the example in FIG. 4B.

The high-k dielectric liner 412 may include a silicon nitride ($SiN_x$), a silicon carbide ($SiC_x$), an aluminum oxide ($Al_xO_y$ such as $Al_2O_3$), a tantalum oxide ($Ta_xO_y$ such as $Ta_2O_5$), a hafnium oxide ($HfO_x$ such as $HfO_2$) and/or another high-k dielectric material. The oxide layer 414 may function to reflect incident light toward the photodiodes 408 to increase the quantum efficiency of the pixel sensor 200*a* and to reduce optical crosstalk between the pixel sensor 200*a* and one or more adjacent pixel sensors 200*a*. In some implementations, the oxide layer 414 includes an oxide material such as a silicon oxide ($SiO_x$). In some implementations, a silicon nitride ($SiN_x$), a silicon carbide ($SiC_x$), or a mixture thereof, such as a silicon carbon nitride (SiCN), a silicon oxynitride (SiON), or another type of dielectric material is used in place of the oxide layer 414.

As further shown in FIG. 4B, the pixel sensor 200*a* may include deep p-well (DPW) regions 416 under the trenches of the DTI structure 410 in the substrate 406. Moreover, the pixel sensor 200*a* may include shallow trench isolation (STI) regions 418 under the DPW regions 416 in the substrate 406. The combination of the DTI structure 410, the DPW regions 416, and the STI regions 418 may provide continuous electrical isolation and/or optical isolation between the top surface (e.g., the first surface) and the bottom surface (e.g., the second surface) for the photodiodes 408 of the pixel sensor 200*a*.

The DPW regions 416 and the STI regions 418 may each include a grid-shaped region in a top-down view in the substrate 406, similar to the DTI structure 410. The deep p-well regions 416 may include a $p^+$ doped silicon material, such as boron-doped silicon or another $p^+$ doped material. The STI regions 418 may include an oxide material such as a silicon oxide ($SiO_x$). In some implementations, a silicon nitride ($SiN_x$), a silicon carbide ($SiC_x$), or a mixture thereof, such as a silicon carbon nitride (SiCN), a silicon oxynitride (SiON), or another type of dielectric material is used for the STI regions 418.

A grid structure 420 may be included over and/or on the oxide layer 414 above the top surface (e.g., the first surface) of the substrate 406. The grid structure 420 may include a plurality of interconnected columns formed from one or more layers that are etched to form the columns. The grid structure 420 may be arranged in a grid-shaped configuration similar to the DTI structure 410. In particular, the grid structure 420 may be over the DTI structure 410 and conform to the shape and/or arrangement of the DTI structure 410. The grid structure 420 may be configured to provide optical isolation and additional crosstalk reduction in combination with the DTI structure 410.

The grid structure 420 may include an oxide grid, a dielectric grid, a color filter in a box (CIAB) grid, and/or a composite metal grid (CMG), among other examples. In some implementations, the grid structure 420 includes a metal layer 422 and a dielectric layer 424 over and/or on the metal layer 422. The metal layer 422 may include tungsten (W), cobalt (Co), and/or another type of metal or metal-containing material. The dielectric layer 424 may include an organic material, an oxide, a nitride, and/or another type of dielectric material such as a silicon oxide ($SiO_x$) (e.g., silicon dioxide ($SiO_2$)), a hafnium oxide ($HfO_x$), a hafnium silicon oxide ($HfSiO_x$), an aluminum oxide ($Al_xO_y$), a silicon nitride ($Si_xN_y$), a zirconium oxide ($ZrO_x$), a magnesium oxide ($MgO_x$), a yttrium oxide ($Y_xO_y$), a tantalum oxide ($Ta_xO_y$), a titanium oxide ($TiO_x$), a lanthanum oxide ($La_xO_y$), a barium oxide ($BaO_x$), a silicon carbide (SiC), a lanthanum aluminum oxide ($LaAlO_x$), a strontium oxide (SrO), a zirconium silicon oxide ($ZrSiO_x$), and/or a calcium oxide (CaO), among other examples.

A color filter region 426 may be included in the areas between the grid structure 420. For example, the color filter region 426 may be formed in between columns of the grid structure 420 over the photodiodes 408 of the pixel sensor 200*a*. In this way, a single color filter region 426 is included over the photodiodes 408 of the pixel sensor 200*a*, as opposed to having individual color filter regions 426 over each of the photodiodes 408. Each pixel sensor 200*a* in the pixel sensor array 316 may include a single color filter region 426. A refractive index of the color filter region 426 may be greater relative to a refractive index of the grid structure 420 to increase a likelihood of a total internal reflection in the color filter regions 426 at an interface between the sidewalls of the color filter regions 426 and the sidewalls of the grid structure 420, which may increase the quantum efficiency of the pixel sensors 200*a*.

The color filter region 426 may be configured to filter incident light to allow a particular wavelength of the incident light to pass to the photodiodes 408 of the pixel sensor 200*a*. For example, the color filter region 426 may filter red light for the pixel sensor 200*a*. As another example, the color filter region 426 may filter green light for the pixel sensor 200*a*. As another example, the color filter region 426 may filter blue light for the pixel sensor 200*a*.

A blue filter region may permit the component of incident light near a 450 nanometer wavelength to pass through a color filter region 426 and block other wavelengths from passing. A green filter region may permit the component of incident light near a 550 nanometer wavelength to pass through a color filter region 426 and block other wavelengths from passing. A red filter region may permit the component of incident light near a 650 nanometer wavelength to pass through a color filter region 426 and block other wavelengths from passing. A yellow filter region may permit the component of incident light near a 580 nanometer wavelength to pass through a color filter region 426 and block other wavelengths from passing.

In some implementations, a color filter region 426 may be non-discriminating or non-filtering, which may define a white pixel sensor. A non-discriminating or non-filtering color filter region 426 may include a material that permits all wavelengths of light to pass into the associated photodiodes 408. In some implementations, a color filter region 426 may be a near infrared (NIR) bandpass color filter region, which may define an NIR pixel sensor. An NIR bandpass color filter region 426 may include a material that permits the portion of incident light in an NIR wavelength range to pass to the associated photodiodes 408 while blocking visible light from passing.

An under layer 428 may be included over and/or on the color filter region 426. The under layer 428 may include an approximately flat layer that provides an approximately flat dielectric substrate on which a micro lens 404 may be formed. The micro lens 404 may be included over the color filter region 426 of the pixel sensor 200*a*. In this way, a single micro lens 404 is included over the single color filter region 426, and over the photodiodes 408, of the pixel sensor 200*a* (e.g., as opposed to individual micro lenses for each of the photodiodes 408 of the pixel sensor 200*a*). The micro lens 404 may be formed to focus incident light toward the photodiodes 408 of the pixel sensor 200*a*.

As indicated above, FIGS. 4A and 4B are provided as examples. Other examples may differ from what is described with regard to FIGS. 4A and 4B.

FIGS. 5A-5D are diagrams of an example implementation 500 of the pixel sensor array 316 described herein. The pixel sensor array 316 may be included on the sensor die 306 of the image sensor device 310. The example implementation 500 includes an alternative implementation of the pixel sensor array 316 to the example implementation 400 of FIGS. 4A and 4B. In the example implementation 500, the pixel sensor array 316 includes a plurality of groups or sets of pixel sensors 200*a* (e.g., PDAF pixel sensors, QPD pixel sensors) that are arranged in QPD regions (e.g., QPD regions 502*a*-502*d*). The QPD regions are configured to generate photocurrents for the purpose of performing autofocus and image capture for the image sensor device 310. The increased quantity of pixel sensors 200*a* in the example implementation 500 of the pixel sensor array 316 may provide increased autofocus sensitivity and increased autofocus performance relative to the example implementation 400. However, the example implementation 400 may provide reduced manufacturing complexity relative to the example implementation 500.

Figure 5A:
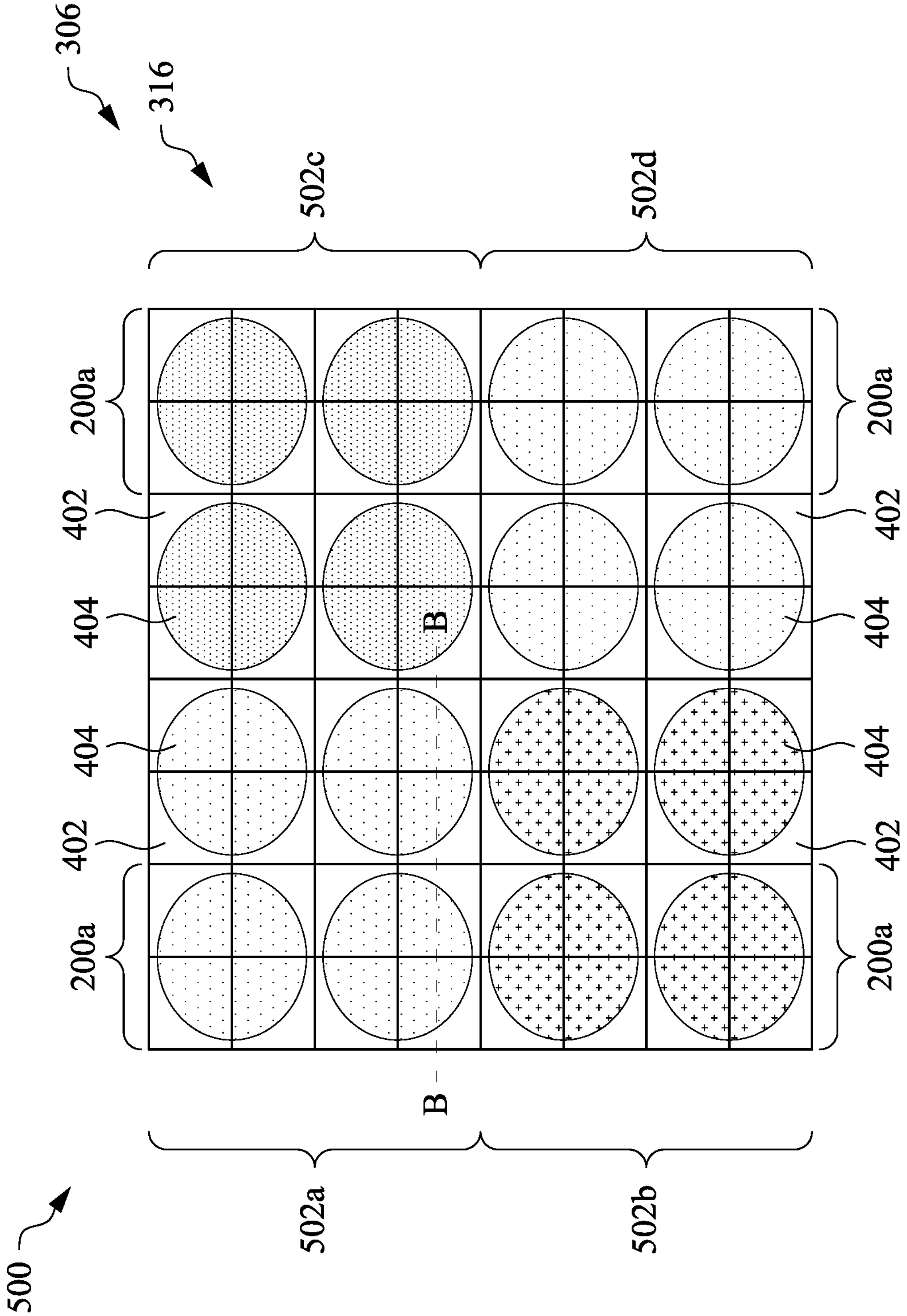
FIGS. 5A-5D are diagrams of an example implementation of the pixel sensor array described herein.

FIG. 5A illustrates a top-down view of the example implementation 500 of the pixel sensor array 316. As shown in FIG. 5A, the QPD regions 502*a*-502*d* may be arranged in a grid configuration. Similarly, the pixel sensors 200*a* in each QPD region may be arranged in a grid configuration (e.g., a 2×2 grid on the sensor die 306, as shown in FIG. 5A, or another grid configuration), and the subregions 402 of each pixel sensor 200*a* may be arranged in a grid configuration.

Each of the pixel sensors 200*a* in a particular QPD region may be configured to absorb photons of light in a particular wavelength range of visible light (e.g., red light, blue light, or green light). For example, the pixel sensors 200*a* in the QPD region 502*a* may be configured to absorb photons of light in a particular wavelength range of visible light corresponding to green light, the pixel sensors 200*a* in the QPD region 502*b* may be configured to absorb photons of light in a particular wavelength range of visible light corresponding to blue light, the pixel sensors 200*a* in the QPD region 502*c* may be configured to absorb photons of light in a particular wavelength range of visible light corresponding to red light, and so on.

Each of the QPD regions 502*a*-502*d* may be configured for quadradic photodetection to support and enable autofocus operations for the image sensor device 310. The portion of the pixel sensor array 316 illustrated in FIG. 5A may be referred to as a 16-cell (16C) QPD region, and may include two green QPD regions 502*a* and 502*d*, a blue QPD region 502*b*, and a red QPD region 502*c*. Each of the QPD regions 502*a*-502*d* may include 4 pixel sensors 200*a*, for a total of 16 pixel sensors 200*a*. The pixel sensor array 316 may include one or more of the 16-cell QPD regions illustrated in FIG. 5A. A pixel sensor 200*a* in the 16-cell QPD region may include a plurality of subregions 402 and a micro lens (e.g., a single micro lens) 404 over the plurality of subregions 402. Each subregion 402 of a pixel sensor 200*a* may include a photodiode that is configured to generate a photocurrent based on photon absorption in the photodiode. The photocurrents generated by the photodiodes in the subregions 402 of a pixel sensor 200*a* may be binned such that a single unified photocurrent is provided from the pixel sensor 200*a* to the circuitry on the circuitry die 308 for performing autofocus for the image sensor device 310.

Figure 5B:
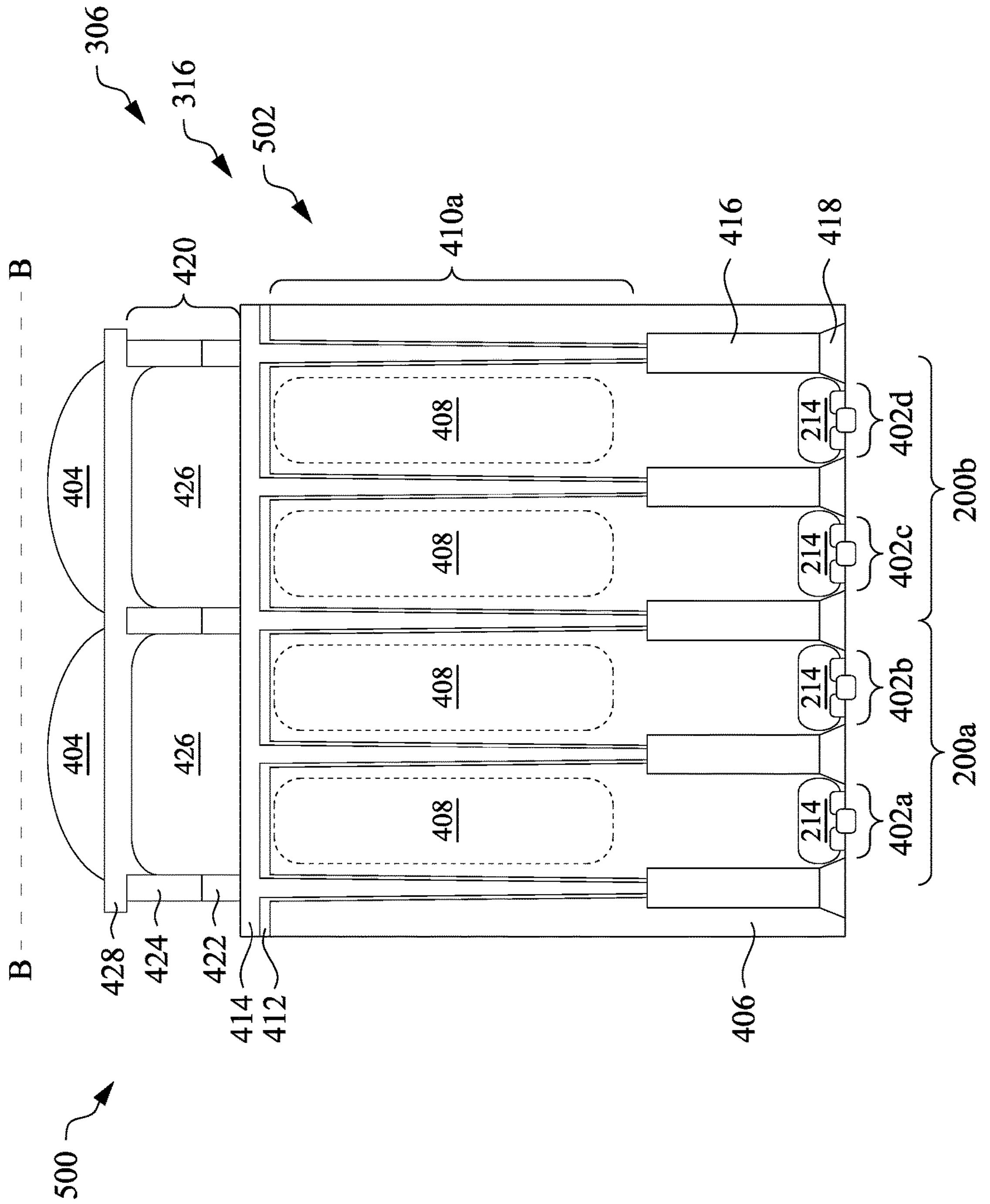

FIG. 5B illustrates a cross-section view along line B-B illustrated in FIG. 5A. FIG. 5B includes an example configuration of a DTI structure 410*a* that may be included in the pixel sensors 200*a* of a QPD region 502. As shown in FIG. 5B, the pixel sensors 200*a* may be arranged in a horizontally adjacent or side-by-side configuration. As further shown in FIG. 5B, the configuration of the pixel sensors 200*a* is similar to the configuration illustrated and described in connection with FIG. 4B. DTI structure 410*a* provides electrical isolation and/or optical isolation between adjacent pixel sensors 200*a* in the QPP region 502, and provides electrical isolation and/or optical isolation between adjacent QPD regions 502.

As further shown in FIG. 5B, the DTI structure 410*a* includes DTI portions (e.g., trenches) that extend into the substrate 406 from the top surface (e.g., the first surface) of the substrate 406 and along the sides of the photodiodes 408 of the pixel sensors 200*a*. Moreover, in the example configuration illustrated in FIG. 5B, the DTI structure 410*a* includes a tapered profile in that the DTI structure 410*a* includes tapered sidewalls that change in width from the top surface of the top surface (e.g., the first surface) of the substrate 406 into the substrate 406 toward the bottom surface (e.g., the second surface) of the substrate 406. The sidewalls may taper such that the trenches of the DTI structure 410*a* continuously reduce in width in a uniform manner from the top surface (e.g., the first surface) of the substrate 406 into the substrate 406 toward the bottom surface (e.g., the second surface) of the substrate 406. Alternatively, the DTI structure 410*a* may extend into the substrate 406 from the bottom surface (e.g., the second surface) of the substrate 406, and the sidewalls may taper such that the trenches of the DTI structure 410*a* continuously reduce in width in a uniform manner from the bottom surface (e.g., the second surface) of the substrate 406 into the substrate 406 toward the top surface (e.g., the first surface) of the substrate 406. The uniform and continuous taper of the DTI structure 410*a* may reduce optical scattering in the pixel sensor array 316 and/or may increase FWC in the pixel sensor array 316, among other examples.

Figure 5C:
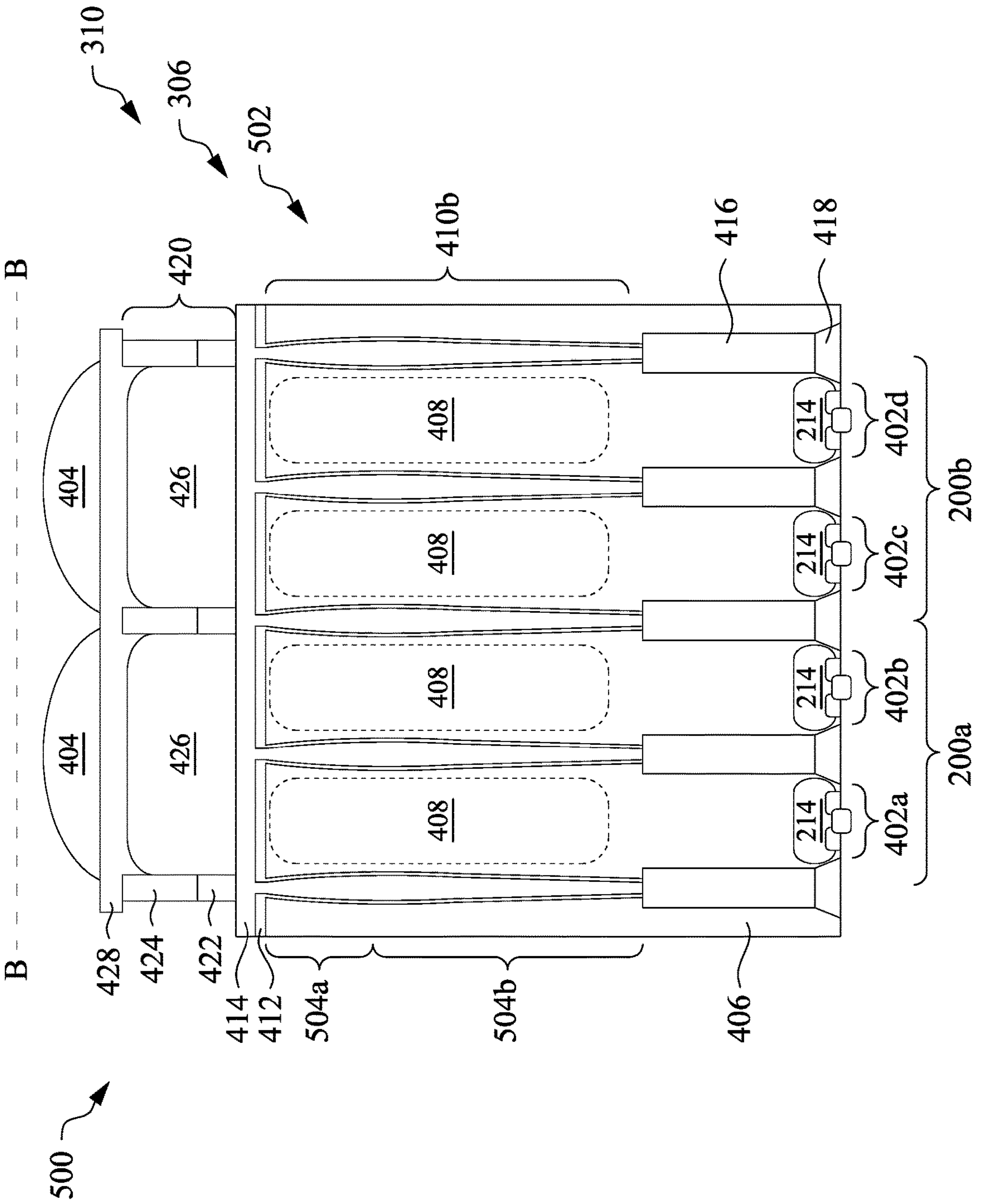

FIG. 5C illustrates a cross-section view along line B-B illustrated in FIG. 5A. FIG. 5C includes an example configuration of a DTI structure 410*b* that may be included in the pixel sensors 200*a* of a QPD region 502. As shown in FIG. 5C, the DTI structure 410*b* includes DTI portions (e.g., trenches) that extend into the substrate 406 from the top surface (e.g., the first surface) of the substrate 406 and along the sides of the photodiodes 408 of the pixel sensors 200*a*.

Moreover, in the example configuration illustrated in FIG. 5C, the DTI structure 410*b* includes a cross-sectional profile that approximately resembles a bowling pin. In particular, DTI portions (e.g., trenches) of the DTI structure 410*b* may include a flared section 504*a* and a tapered section 504*b*. The flared section 504*a* may be orientated toward the top surface (e.g., the first surface) of the substrate 406, and the tapered section 504*b* may be orientated toward the bottom surface (e.g., the second surface) of the substrate 406 such that the tapered section 504*b* is under the flared section 504*a*. Alternatively, the flared section 504*a* may be orientated toward the bottom surface (e.g., the second surface) of the substrate 406, and the tapered section 504*b* may be orientated toward the top surface (e.g., the first surface) of the substrate 406 such that the tapered section 504*b* is over the flared section 504*a*. The bowling pin cross-sectional profile of the DTI structure 410*b* may result in a reduced likelihood of plasma damage to the substrate 406 during manufacturing of the sensor die 306, and/or a reduced likelihood of white pixel formation in the pixel sensor array 316, among other examples.

In the flared section 504*a*, the sidewalls of the DTI portions of the DTI structure 410*b* may flare outward from the top surface (e.g., the first surface) of the substrate 406 toward the tapered section 504*b*. In other words, the width of the DTI portions of the DTI structure 410*b* may increase in a non-linear manner or in a non-uniform manner in the flared section 504*a*.

The tapered section 504*b* may include tapered sidewalls that change in width from the top surface of the top surface (e.g., the first surface) of the substrate 406 into the substrate 406 toward the bottom surface (e.g., the second surface) of the substrate 406. The sidewalls may taper in the tapered section 504*b* such that the trenches of the DTI structure 410*b* continuously reduce in width in a uniform manner from the top surface (e.g., the first surface) of the substrate 406 into the substrate 406 toward the bottom surface (e.g., the second surface) of the substrate 406. Alternatively, the DTI structure 410*b* may extend into the substrate 406 from the bottom surface (e.g., the second surface) of the substrate 406, and the sidewalls in the tapered section 504*b* may taper such that the trenches of the DTI structure 410*b* continuously reduce in width in a uniform manner from the bottom surface (e.g., the second surface) of the substrate 406 into the substrate 406 toward the top surface (e.g., the first surface) of the substrate 406.

Figure 5D:
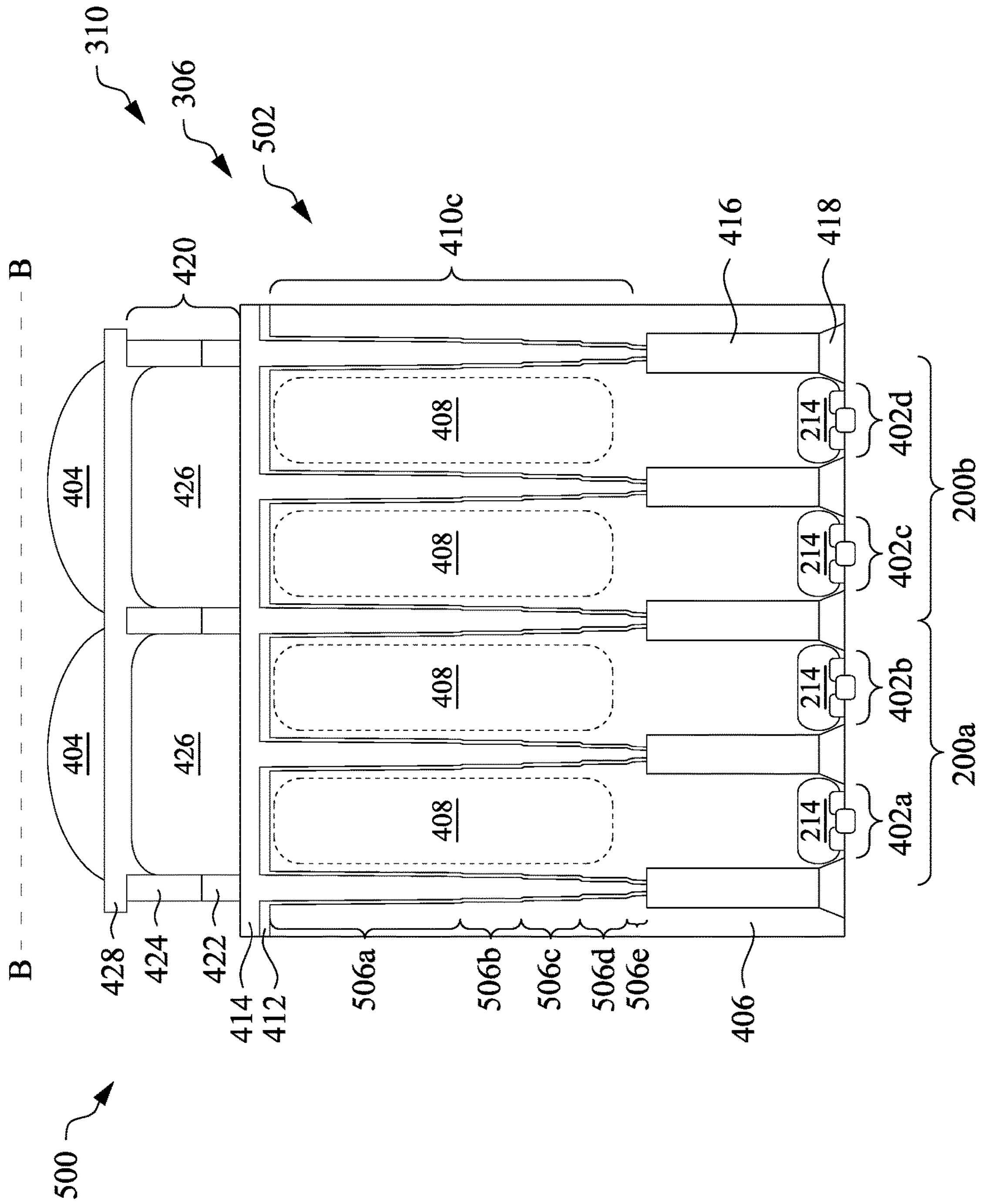

FIG. 5D illustrates a cross-section view along line B-B illustrated in FIG. 5A. FIG. 5D includes an example configuration of a DTI structure 410*c* that may be included in the pixel sensors 200*a* of a QPD region 502. As shown in FIG. 5D, the DTI structure 410*c* includes DTI portions (e.g., trenches) that extend into the substrate 406 from the top surface (e.g., the first surface) of the substrate 406 and along the sides of the photodiodes 408 of the pixel sensors 200*a*.

Moreover, in the example configuration illustrated in FIG. 5D, the DTI portions of the DTI structure 410*c* include a stepped cross-sectional profile having a plurality of stepped sections 506*a*-506*e* that change in width in a stepped manner (e.g., in a non-linear and/or in a non-uniform manner). For example, a DTI portion of the DTI structure 410*c* may include a stepped section 506*a* having a first width, a stepped section 506*b* under the stepped section 506*a* having a second width that is lesser relative to the first width, a stepped section 506*c* under the stepped section 506*b* having a third width that is lesser relative to the second width, and so on. The quantity of stepped sections 506*a*-506*e* illustrated in FIG. 5D is an example, and other quantities of stepped sections are within the scope of the present disclosure. The stepped cross-sectional profile of the DTI structure 410*c* may reduce optical scattering in the pixel sensor array 316, may increase FWC in the pixel sensor array 316, result in a reduced likelihood of plasma damage to the substrate 406 during manufacturing of the sensor die 306, and/or a reduced likelihood of white pixel formation in the pixel sensor array 316, among other examples.

The stepped sections 506*a*-506*e* may change (e.g., reduce) in width from the top surface of the top surface (e.g., the first surface) of the substrate 406 into the substrate 406 toward the bottom surface (e.g., the second surface) of the substrate 406. Alternatively, the DTI structure 410*c* may extend into the substrate 406 from the bottom surface (e.g., the second surface) of the substrate 406, and the stepped sections 506*a*-506*e* may change (e.g., reduce) in width from the bottom surface (e.g., the second surface) of the substrate 406 into the substrate 406 toward the top surface (e.g., the first surface) of the substrate 406.

It is to be noted that one or more subsets of the pixel sensors 200*a* in the QPD region 502*a*, the QPD region 502*b*, the QPD region 502*c*, the QPD region 502*d*, and/or another QPD region in the pixel sensor array 316 may include one or more of the DTI structure configurations illustrated in FIGS. 5A-5D. For example, one or more of the pixel sensors 200*a* in the QPD region 502*a* may include a portion of the DTI structure 410*a* (e.g., with approximately continuous and uniform tapered trenches), a portion of the DTI structure 410*b* (e.g., with trenches having flared sections 504*a* and tapered sections 504*b*), and/or a portion of the DTI structure 410*c* (e.g., with trenches having stepped sections 506*a*-506*e*). As another example, one or more of the pixel sensors 200*a* in the QPD region 502*b* may include a portion of the DTI structure 410*a* (e.g., with approximately continuous and uniform tapered trenches), a portion of the DTI structure 410*b* (e.g., with trenches having flared sections 504*a* and tapered sections 504*b*), and/or a portion of the DTI structure 410*c* (e.g., with trenches having stepped sections 506*a*-506*e*). As another example, one or more of the pixel sensors 200*a* in the QPD region 502*c* may include a portion of the DTI structure 410*a* (e.g., with approximately continuous and uniform tapered trenches), a portion of the DTI structure 410*b* (e.g., with trenches having flared sections 504*a* and tapered sections 504*b*), and/or a portion of the DTI structure 410*c* (e.g., with trenches having stepped sections 506*a*-506*e*). As another example, one or more of the pixel sensors 200*a* in the QPD region 502*d* may include a portion of the DTI structure 410*a* (e.g., with approximately continuous and uniform tapered trenches), a portion of the DTI structure 410*b* (e.g., with trenches having flared sections 504*a* and tapered sections 504*b*), and/or a portion of the DTI structure 410*c* (e.g., with trenches having stepped sections 506*a*-506*e*).

In some implementations, a particular DTI structure configuration(s) may be selected for the pixel sensors 200*a* in a QPD region to satisfy a QE parameter for the pixel sensor array 316, to satisfy a FWC parameter for the pixel sensor array 316, and/or to satisfy another parameter for the pixel sensor array 316.

As indicated above, FIGS. 5A-5D are provided as examples. Other examples may differ from what is described with regard to FIGS. 5A-5D.

FIGS. 6A-6D are diagrams of an example implementation 600 of forming a pixel sensor array 316 of a sensor die 306 described herein. In some implementations, one or more the semiconductor processing operations described in connection with FIGS. 6A-6D may be performed prior to the sensor die 306 being bonded with a circuitry die 308 to form an image sensor device 310. In some implementations, one or more the semiconductor processing operations described in connection with FIGS. 6A-6D may be performed by one or more of the semiconductor processing tools 102-116. In some implementations, one or more the semiconductor processing operations described in connection with FIGS. 6A-6D may be performed by another semiconductor processing tool. FIGS. 6A-6D are illustrated along the cross-section B-B of a QPD region 502 of the pixel sensor array 316 in FIG. 5A.

Figure 6A:
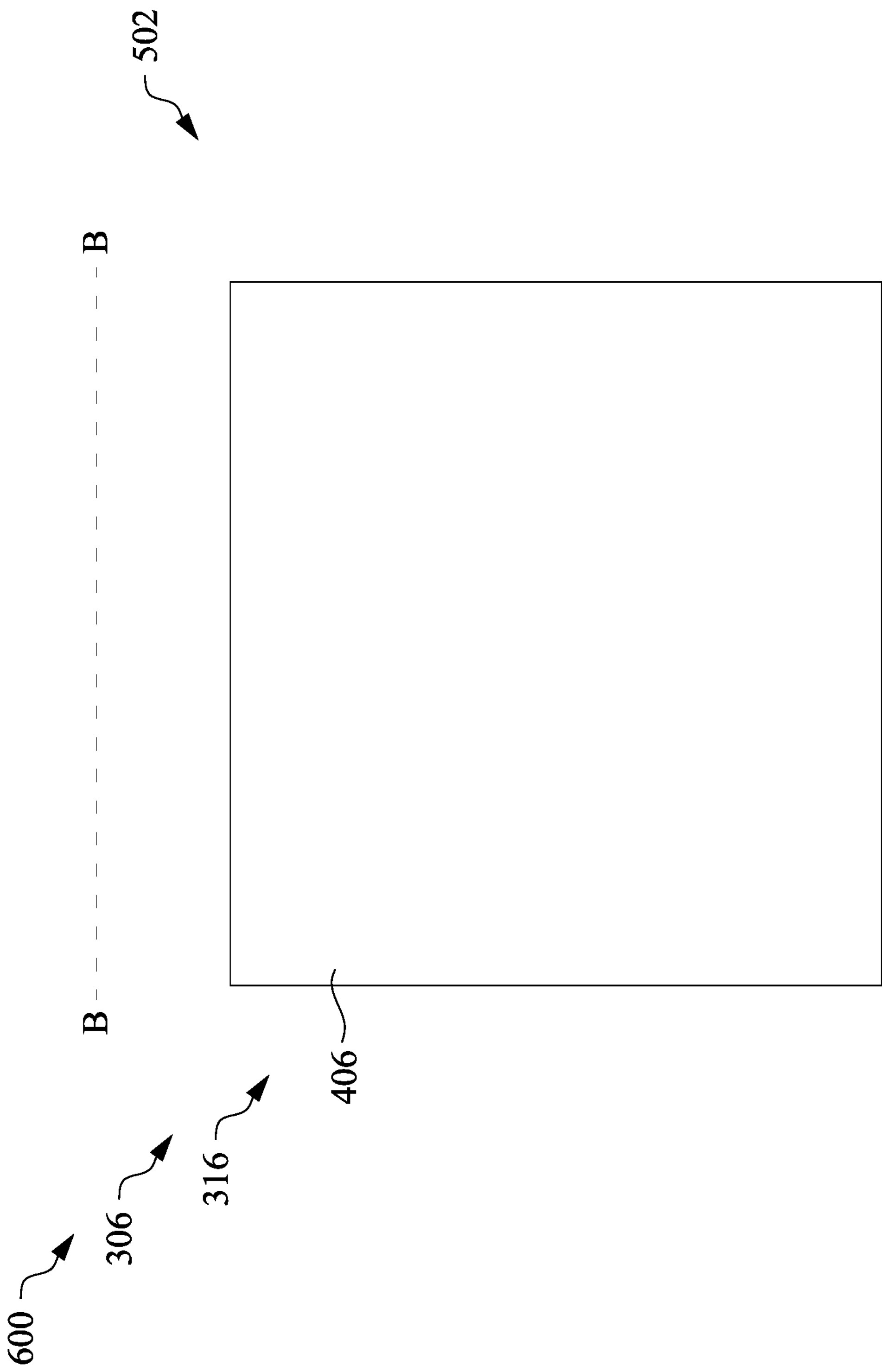
FIGS. 6A-6D are diagrams of an example implementation of forming a pixel sensor array of a sensor die described herein.

Turning to FIG. 6A, one or more of the semiconductor processing operations may be performed in connection with the substrate 406 of the sensor die 306. The substrate 406 may include a semiconductor wafer, a semiconductor die, and/or another type of semiconductor workpiece.

Figure 6B:
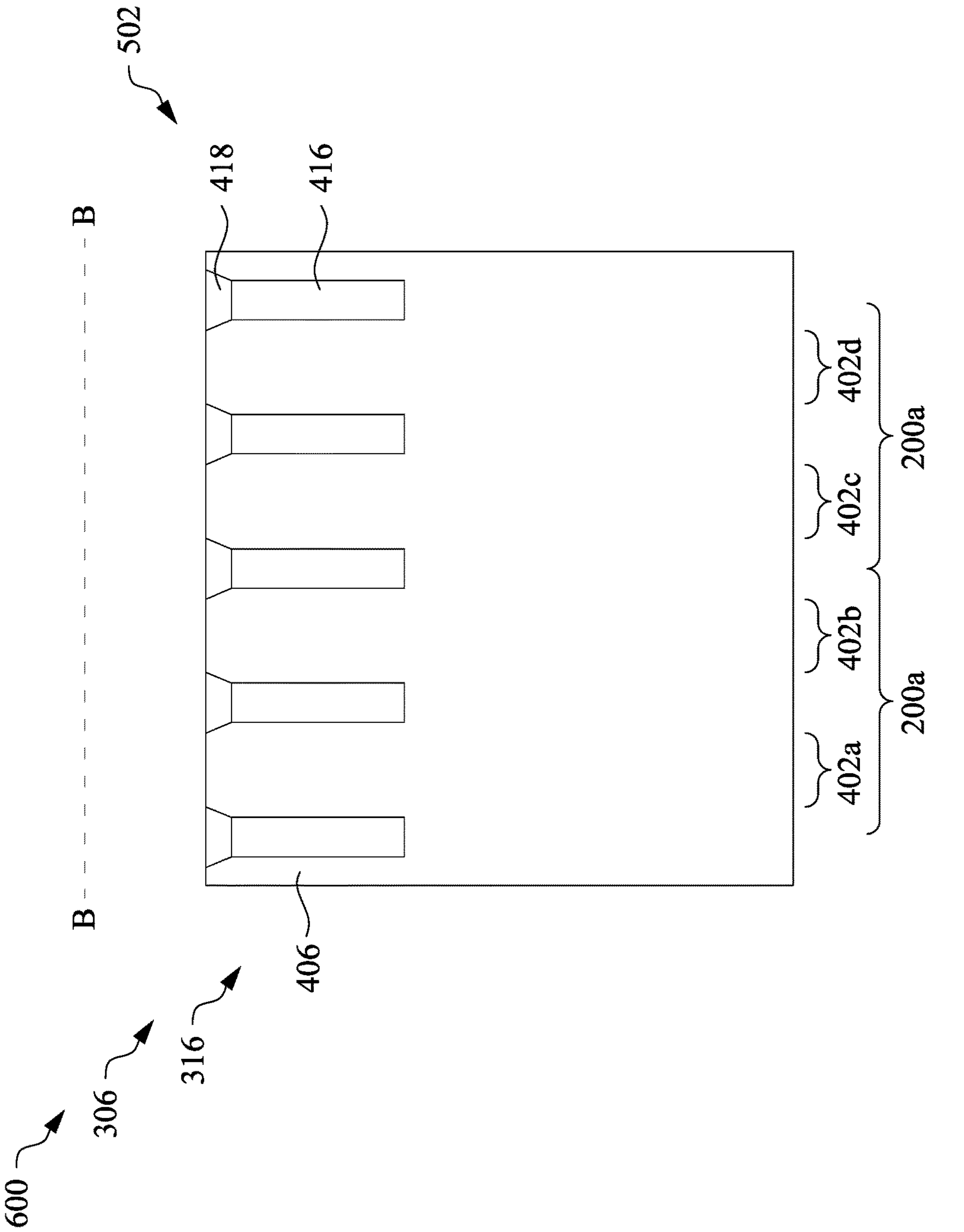

As shown in FIG. 6B, DPW regions 416 may be formed in the substrate 406. For example, the DPW regions 416 may be formed (e.g., as a circle or ring shape in a top-down view) in the substrate 406 to provide electrical isolation and/or optical isolation for the pixel sensors 200*a* in the QPD region 502 and/or for the subregions 402*a*-402*d* of the pixel sensors 200*a*. In some implementations, the ion implantation tool 114 dopes the substrate 406 by ion implantation to form the DPW regions 416. For example, the ion implantation tool 114 may implant $p^+$ ions into a first region of the substrate 406 to form the DPW regions 416. In some implementations, the substrate 406 may be doped using another doping technique such as diffusion to form the DPW regions 416.

As further shown in FIG. 6B, STI regions 418 may be formed over and/or on the DPW regions 416 in the substrate 406. To form the STI regions 418, the substrate 406 over the DPW regions 416 may be etched to form trenches (or another type of recesses) in the substrate 406 over the DPW regions 416. The trenches may be etched into the substrate 406 from the bottom surface (e.g., the second surface). The trenches may then be filled with one or more dielectric materials to form the STI regions 418 in the trenches.

To form the trenches, the deposition tool 102 may form a photoresist layer on the substrate 406. The exposure tool 104 may expose the photoresist layer to a radiation source to pattern the photoresist layer, the developer tool 106 may develop and remove portions of the photoresist layer to expose the pattern, and the etch tool 108 may etch portions of the substrate 406 to form the trenches. In some implementations, a photoresist removal tool removes the remaining portions of the photoresist layer (e.g., using a chemical stripper, a plasma asher, and/or another technique) after the etch tool 108 etches the substrate 406 to form the trenches.

The deposition tool 102 may deposit one or more dielectric materials in the trenches. The deposition tool 102 may deposit the one or more dielectric materials using a CVD technique, a PVD technique, an ALD technique, or another type of deposition technique. The planarization tool 110 may planarize the STI regions 418 after the one or more dielectric materials are deposited in the trenches such that a top surface of the STI regions 418 and bottom surface of the substrate 406 are approximately a same height (or coplanar).

Figure 6C:
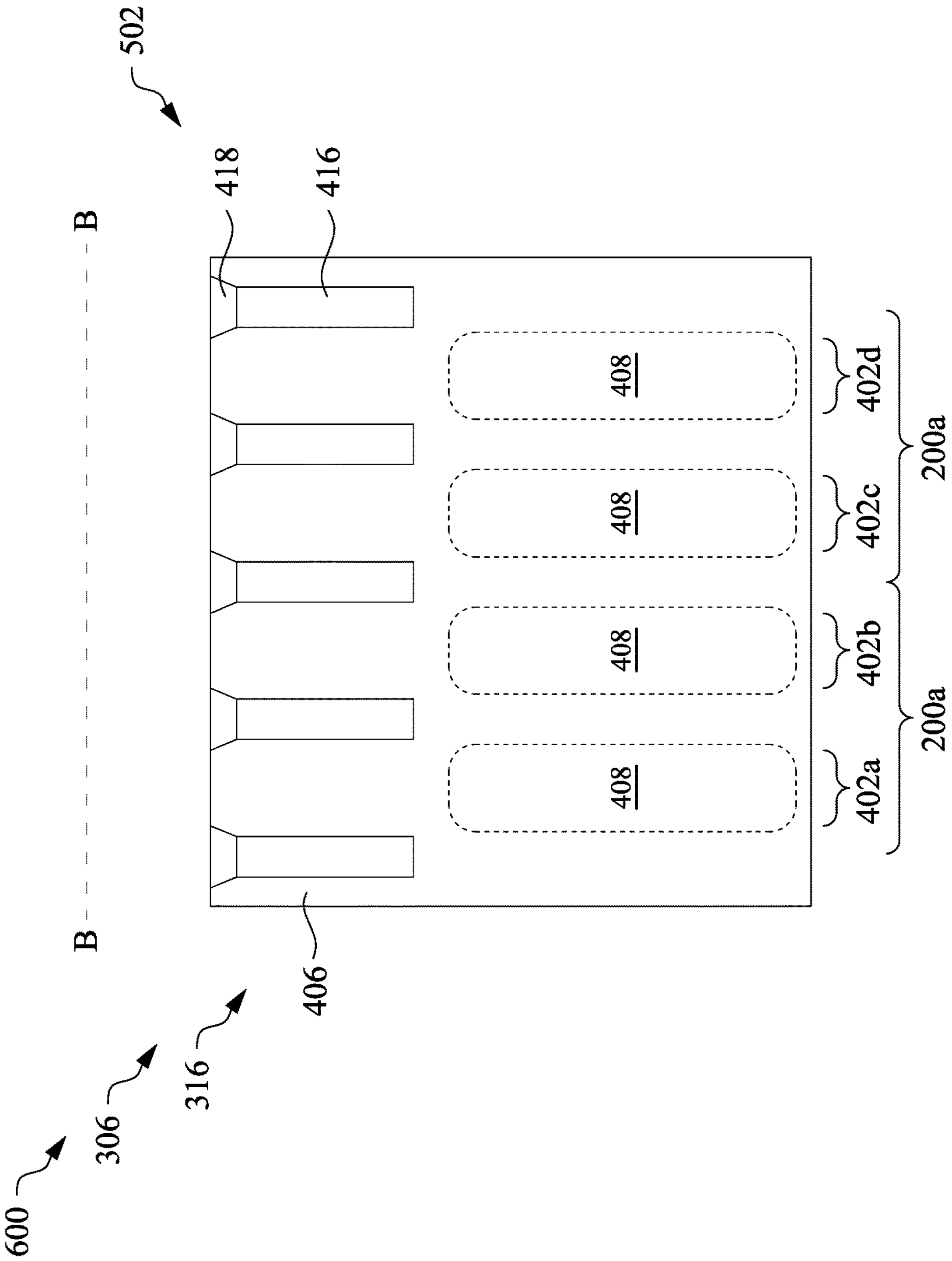

As shown in FIG. 6C, the substrate 406 may be doped to form the photodiodes 408 of the pixel sensors 200*a* in the QPD region 502. In some implementations, the ion implantation tool 114 dopes a plurality of regions of the substrate 406 with different types of dopants and/or with different concentrations of dopants. For example, the ion implantation tool 114 may implant $p^+$ ions in the substrate 406 to form a p-type region and/or may implant $n^+$ ions in the substrate to form a n-type region to form the photodiodes 408. The ion implantation tool 114 may form the n-type region and/or the p-type region in between the DPW regions 416 and the STI regions 418. In some implementations, the plurality of regions of the substrate 406 may be doped using another doping technique such as diffusion to form the photodiodes 408.

Figure 6D:
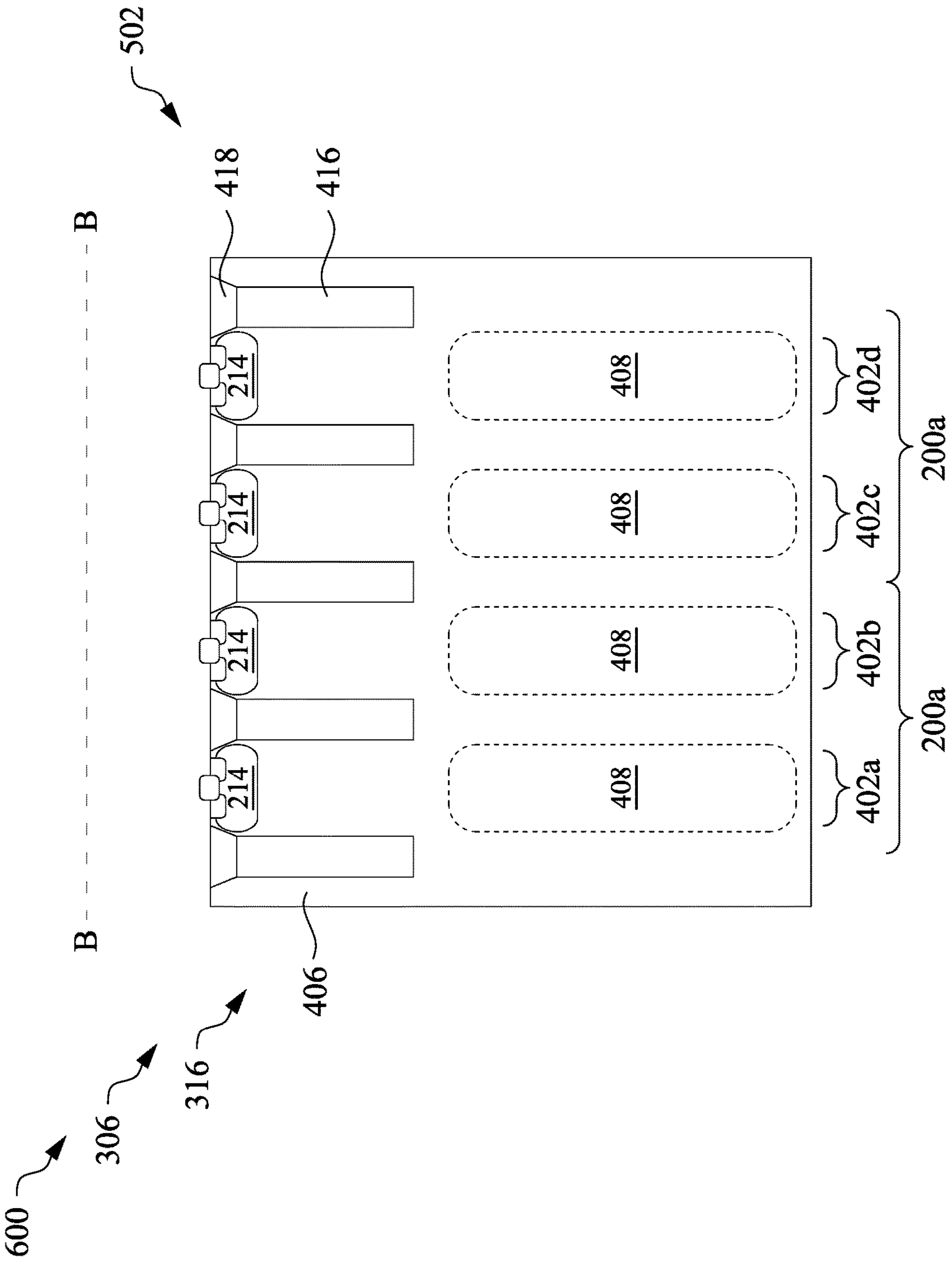

As shown in FIG. 6D, transfer transistors 214 may be formed in and/or on the substrate 406. In some implementations, a respective transfer transistor 214 may be formed in each of the subregions 402*a*-402*d* of the pixel sensors 200*a*. For example, a first transfer transistor 214 may be formed in between DPW regions 416 and STI regions 418 (and above a photodiode 408) in the subregion 402*a*, a second transfer transistor 214 may be formed in between DPW regions 416 and STI regions 418 (and above a photodiode 408) in the subregion 402*b*, a third transfer transistor 214 may be formed in between DPW regions 416 and STI regions 418 (and above a photodiode 408) in a subregions 402*c*, a fourth transfer transistor 214 may be formed in between DPW regions 416 and STI regions 418 (and above a photodiode 408) in a subregions 402*d*, and so on.

One or more of the semiconductor processing tools 102-116 may form the transfer transistors 214 using various semiconductor processing techniques, such as photolithography, etching, deposition, electroplating, doping, epitaxy, ion implantation, and/or another suitable semiconductor processing technique. In some implementations, one or more of the semiconductor processing tools 102-116 may form one or more layers and/or structures on the sensor die 306, such the BEOL region 312*a* and one or more layers and/or structures in the BEOL region 312*a*.

As indicated above, FIGS. 6A-6D are provided as an example. Other examples may differ from what is described with regard to FIGS. 6A-6D.

Figure 7:
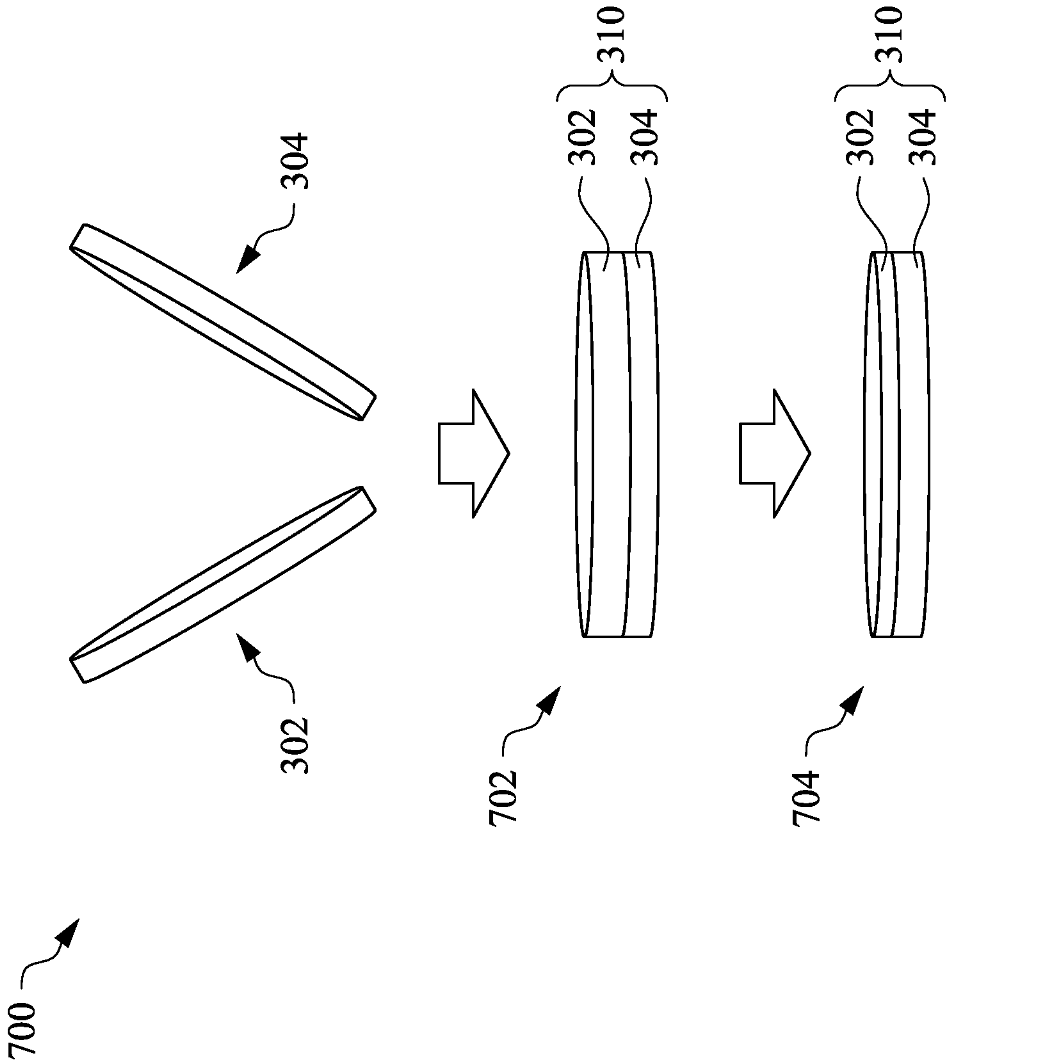
FIG. 7 is a diagram of an example implementation of semiconductor substrate bonding described herein.

FIG. 7 is a diagram of an example implementation 700 of semiconductor substrate bonding described herein. As shown in FIG. 7, a bonding operation may be performed to bond a sensor wafer 302 and a circuitry wafer 304 to form an image sensor device 310 (e.g., a stacked image sensor device). In some implementations, one or more of the operations described in connection with FIG. 7 may be performed after one or more operations described in connection with FIGS. 6A-6D. In some implementations, one or more the semiconductor processing operations described in connection with FIG. 7 may be performed by one or more of the semiconductor processing tools 102-116. In some implementations, one or more the semiconductor processing operations described in connection with FIG. 7 may be performed by another semiconductor processing tool.

At 702, an image sensor device 310 may be formed by bonding a sensor wafer 302 and a circuitry wafer 304. For example, the bonding tool 116 may perform a bonding operation to bond the sensor wafer 302 and the circuitry wafer 304 using a hybrid bonding technique, a direct bonding technique, a eutectic bonding technique, and/or another bonding technique. In the bonding operation, sensor dies 306 on the sensor wafer 302 are bonded with associated circuitry dies 308 on the circuitry wafer 304 to form image sensor devices 310 (e.g., stacked image sensor devices).

At 704, the substrate 406 of the sensor wafer 302 may be grinded down to reduce a thickness of the substrate 406 of the sensor dies 306 on the sensor wafer 302 after the sensor wafer 302 and the circuitry wafer 304 are bonded at 702. In some implementations, the planarization tool 110 performs a CMP operation or another planarization operation to reduce the thickness of the substrate 406 in preparation of backside processing for the sensor dies 306. In some implementations, the thickness of the substrate 406 of the sensor dies 306 is reduced to a range of approximately 3 microns to approximately 10 microns to facilitate backside processing of the sensor dies 306 while enabling a sufficiently high QE for the pixel sensors 200 of the sensor dies 306 to be achieved. However, other values for the range are within the scope of the present disclosure.

As indicated above, FIG. 7 is as an example. Other examples may differ from what is described with regard to FIG. 7.

Figure 8:
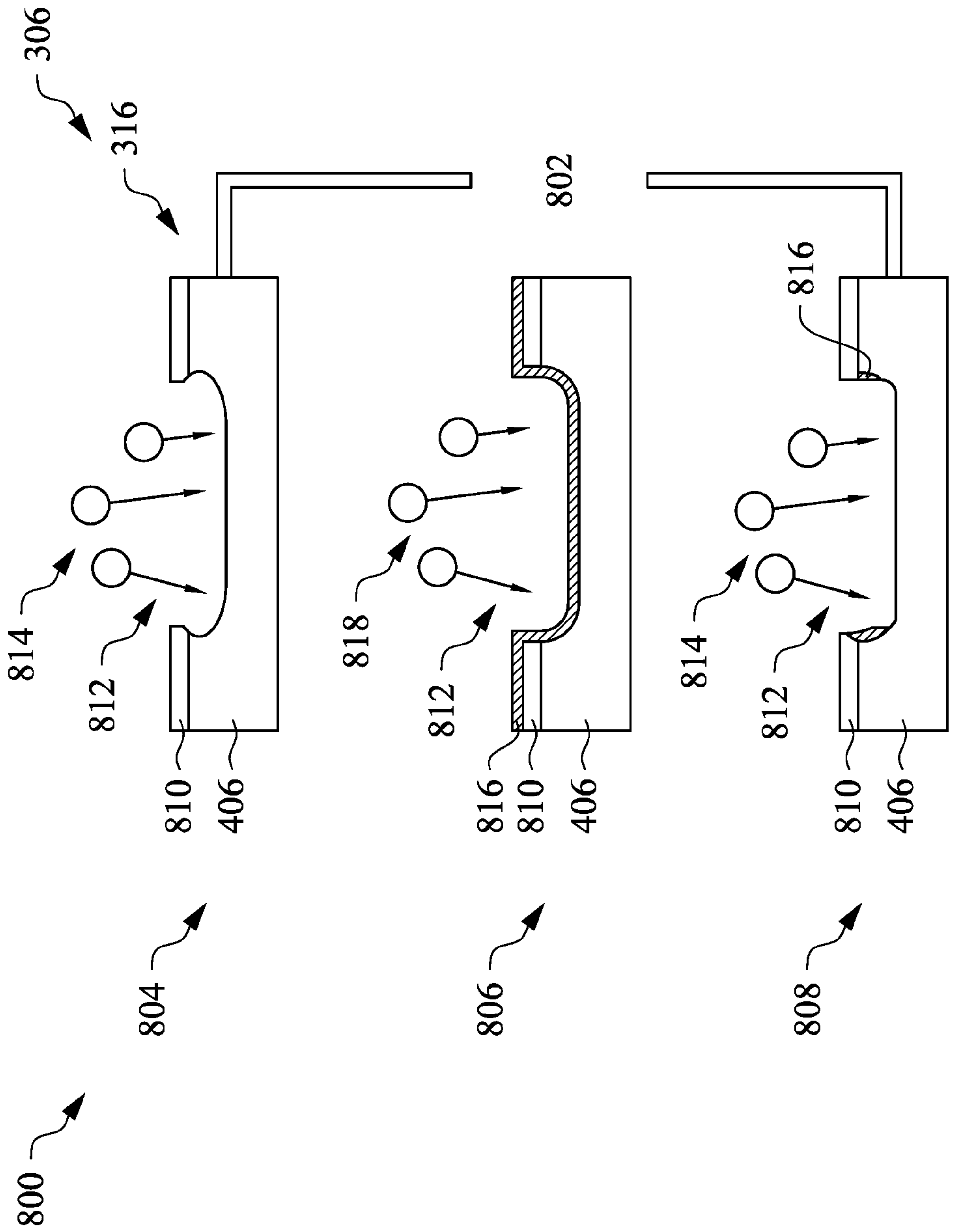
FIG. 8 is a diagram of an example implementation of forming a trench described herein.

FIG. 8 is a diagram of an example implementation 800 of forming a trench described herein. As shown in FIG. 8, an etch-deposition-etch cycle 802 may be performed to form trenches in a substrate 406 of a sensor die 306 included in an image sensor device 310. The trenches may be used to form a DTI structure 410 in a pixel sensor array 316 of the sensor die 306. In some implementations, one or more of the operations described in connection with FIG. 8 may be performed after one or more operations described in connection with FIG. 7 (e.g., after bonding of the sensor wafer 302 and the circuitry wafer 304 to form the image sensor device 310). In some implementations, one or more the semiconductor processing operations described in connection with FIG. 8 may be performed by one or more of the semiconductor processing tools 102-116. In some implementations, one or more the semiconductor processing operations described in connection with FIG. 8 may be performed by another semiconductor processing tool.

As shown in FIG. 8, a first etch-deposition-etch cycle 802 may include a first etch operation 804, a deposition operation 806, and a second etch operation 808. In the first etch operation 804, the deposition tool 102 may form a photoresist layer 810 on the substrate 406. The exposure tool 104 may expose the photoresist layer 810 to a radiation source to pattern the photoresist layer 810, the developer tool 106 may develop and remove portions of the photoresist layer 810 to expose the pattern. The etch tool 108 may etch portions of the substrate 406 to form a trench 812 to a first depth. The etch tool 108 may use an etchant 814 to perform an isotropic etch operation to form the trench 812, in which the substrate 406 is etched in an approximately omnidirectional manner based on the pattern in the photoresist layer 810. The etchant 814 may include sulfur hexafluoride ($SF_6$) and/or another suitable etchant.

In the deposition operation 806, the deposition tool 102 may deposit a sidewall protection layer 816 in the trench 812 and over the photoresist layer 810. The deposition tool 102 may deposit the sidewall protection layer 816 using a CVD technique, a PVD technique, an ALD technique, or another type of deposition technique. In some implementations, the deposition tool 102 may use a deposition gas, such as perfluorocyclobutane ($C_4F_8$) to deposit the material of the sidewall protection layer 816. The sidewall protection layer 816 may include a dielectric material, a polymer material, and/or another suitable material.

In the second etch operation 808, the etch tool 108 may remove the sidewall protection layer 816 from the bottom surface of the trench 812 and from the photoresist layer 810. The second etch operation 808 may include the etch tool 108 performing an anisotropic etch operation (e.g., a directional etch) to remove the sidewall protection layer 816 from the bottom surface of the trench 812 and from the photoresist layer 810. The highly directional property of the anisotropic etch operation enables the sidewall protection layer 816 to be removed from the bottom surface of the trench 812 while enabling the sidewall protection layer 816 to remain on the sidewalls of the trench 812. The etch tool 108 may use an etchant 814 to perform the anisotropic etch operation. The etchant 814 may include sulfur hexafluoride ($SF_6$) and/or another suitable etchant.

Subsequently, a second etch-deposition-etch cycle 802 may be performed to increase the depth of the plurality of trenches from the first depth to a second depth. In the second etch-deposition-etch cycle 802, the sidewall protection layer 816 protects sidewalls of the trench 812 during the first etch operation 804 of the second etch-deposition-etch cycle 802. This enables the depth of the plurality of trenches from the first depth to the second depth while minimizing the growth or increase in the width of the trench 812. This enables the trench 812 to be formed using a plurality of etch-deposition-etch cycle 802 to a relatively high aspect ratio (e.g., a ratio of the depth of the trench 812 to the width of the trench 812). The relatively high aspect ratio of the trench 812 enables reduced spacing between adjacent pixel sensors 200*a* in the pixel sensor array 316 and increased pixel sensor density in the pixel sensor array 316.

In some implementations, a plurality of the etch-deposition-etch cycle 802 illustrated and described in connection with FIG. 8 may be performed to form the trench 812 to a particular depth. In some implementations, the quantity of etch-deposition-etch cycle 802 may be selected to achieve a particular depth, a particular aspect ratio, a particular semiconductor processing throughput, and/or to satisfy another parameter.

As indicated above, FIG. 8 is as an example. Other examples may differ from what is described with regard to FIG. 8.

Figure 9A:
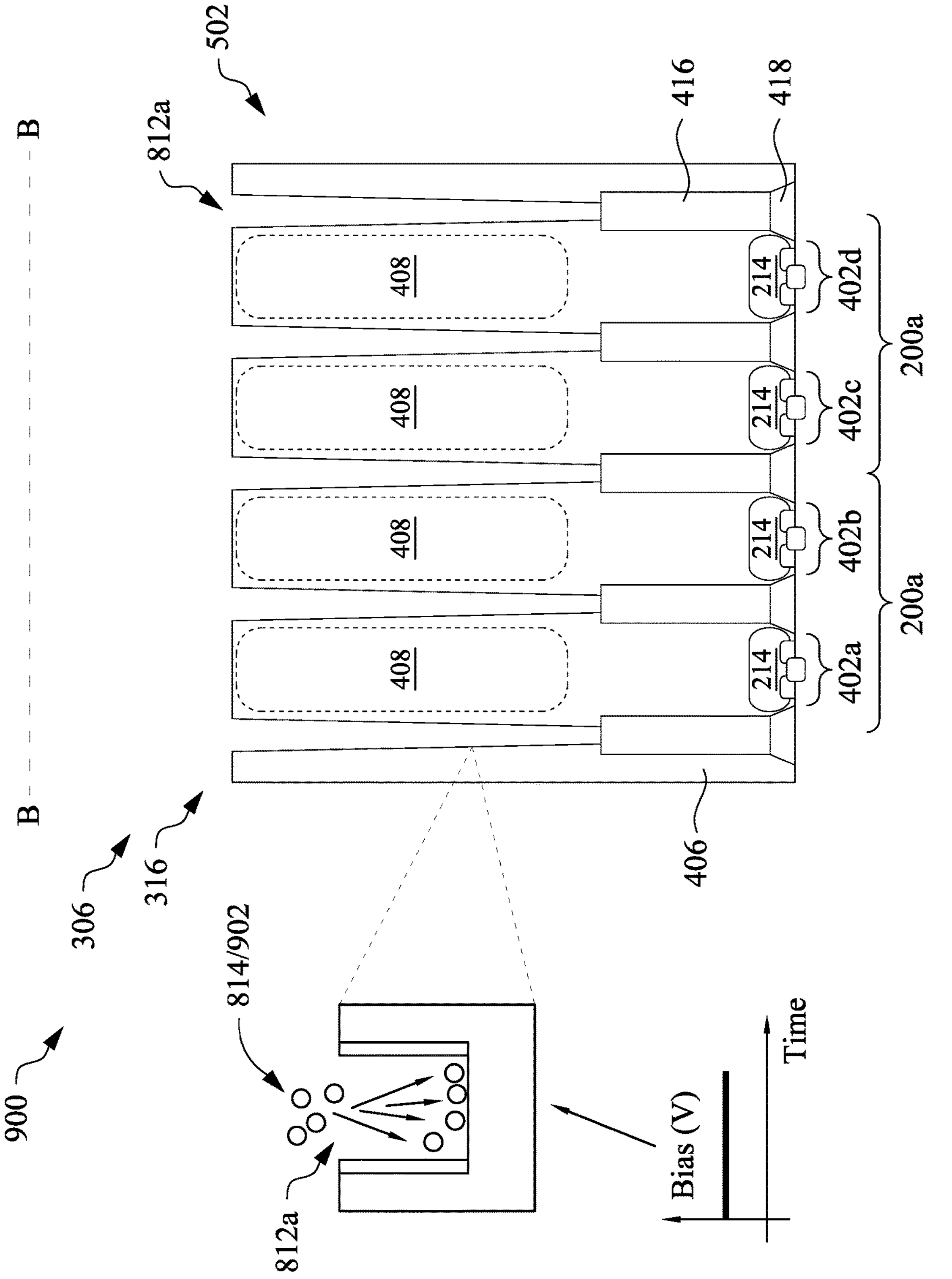
FIGS. 9A and 9B are diagrams of an example implementation of forming trenches described herein.
Figure 9B:
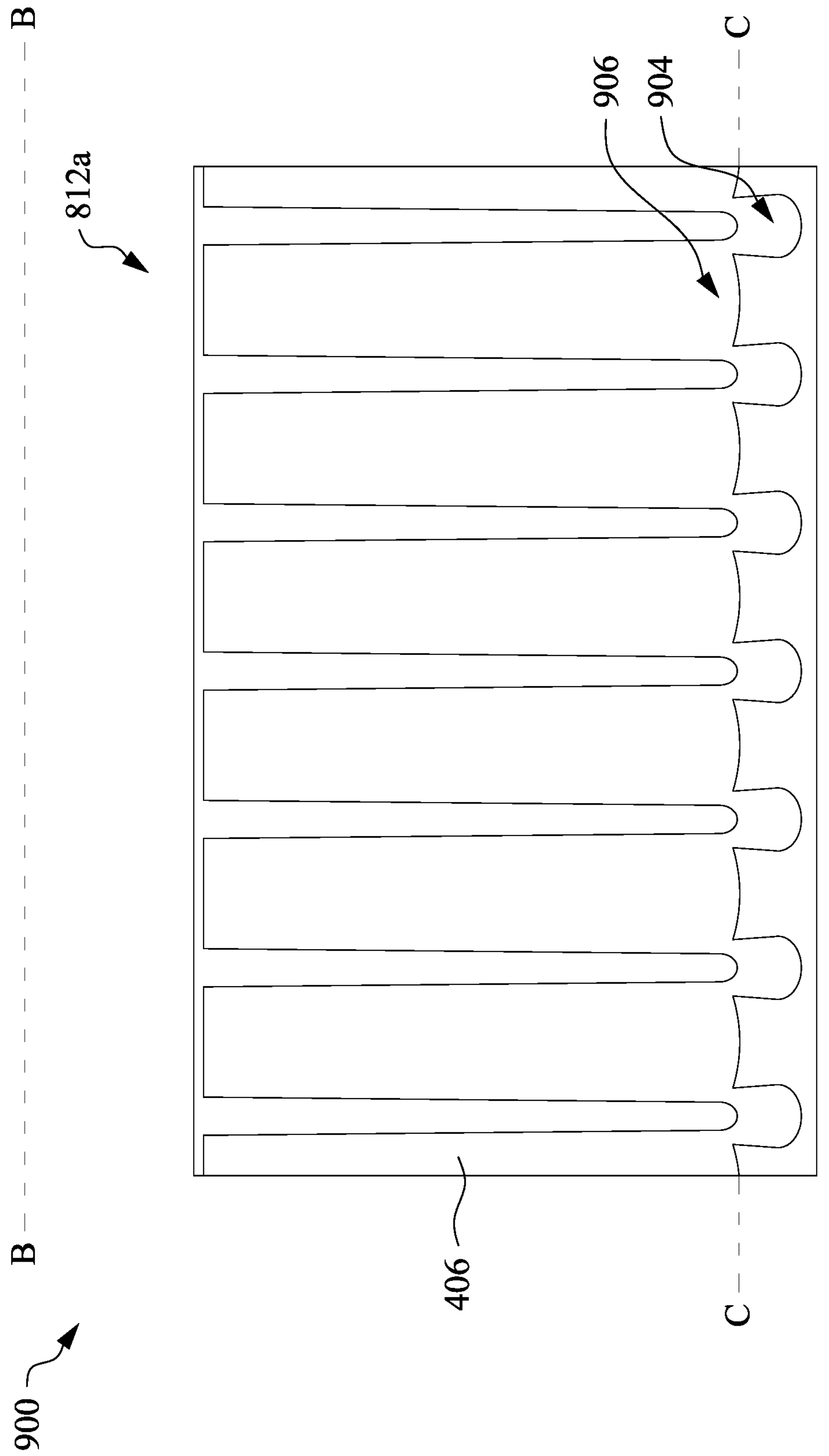

FIGS. 9A and 9B are diagrams of an example implementation 900 of forming trenches described herein. As shown in FIGS. 9A and 9B, the example implementation 900 includes an example of forming trenches 812*a* in a substrate 406 of a sensor die 306 included in an image sensor device 310. The trenches 812*a* may be used to form a DTI structure 410*a* in a pixel sensor array 316 of the sensor die 306, where the DTI structure 410*a* includes tapered sidewalls that change in width from the top surface (e.g., the first surface) of the substrate 406 into the substrate 406 toward the bottom surface (e.g., the second surface) of the substrate 406.

In some implementations, one or more of the operations described in connection with FIGS. 9A and 9B may be performed after one or more operations described in connection with FIG. 7 (e.g., after bonding of the sensor wafer 302 and the circuitry wafer 304 to form the image sensor device 310). In some implementations, one or more the semiconductor processing operations described in connection with FIGS. 9A and 9B may be performed by one or more of the semiconductor processing tools 102-116. In some implementations, one or more the semiconductor processing operations described in connection with FIGS. 9A and 9B may be performed by another semiconductor processing tool. In some implementations, one or more the semiconductor processing operations described in connection with FIGS. 9A and 9B may be performed in connection with the example implementation 800 of FIG. 8.

As shown in FIG. 9A, the trenches 812*a* include tapered sidewalls that change in width from the top surface of the top surface (e.g., the first surface) of the substrate 406 into the substrate 406 toward the bottom surface (e.g., the second surface) of the substrate 406. The sidewalls may taper such that the trenches 812*a* continuously reduce in width in a uniform manner from the top surface (e.g., the first surface) of the substrate 406 into the substrate 406 toward the bottom surface (e.g., the second surface) of the substrate 406.

To form the profile of the trenches 812*a* illustrated in FIG. 9A, the etch tool 108 may use a plasma etch technique in which a bias voltage is used to control the bombardment of the etchant 814 and/or the bombardment of ions 902 in the plasma. To create the uniform and continuous taper of the sidewalls of the trenches 812*a*, the etch tool 108 may use a constant bias voltage (e.g., a bias voltage with a constant frequency), where the bias voltage is included in a range of approximately 30 volts to approximately 100 volts. However, other values for the range are within the scope of the present disclosure.

In FIG. 9B, a cross section along a trench 812*a* (shown along line C-C) is superimposed on the cross section across a plurality of trenches 812*a* (shown along line B-B). As shown in FIG. 9B, the depth of the trench 812*a* along the line C-C is different at different locations along the trench 812*a*. As an example, the depth of the trench 812*a* may be greater at intersections 904, between the trench 812*a* going across FIG. 9B and trenches 812*a* going into the page in FIG. 9B, relative to the depth of the trench 812*a* in transition regions 906 between intersections 904. As further shown in FIG. 9B, the plasma etch technique described in connection with FIG. 9A may result in an approximately U-shaped profile for the intersections 904 and an approximately flat-shaped profile with upward curved ends for the transition regions 906.

As indicated above, FIGS. 9A and 9B are provided as an example. Other examples may differ from what is described with regard to FIGS. 9A and 9B.

Figure 10A:
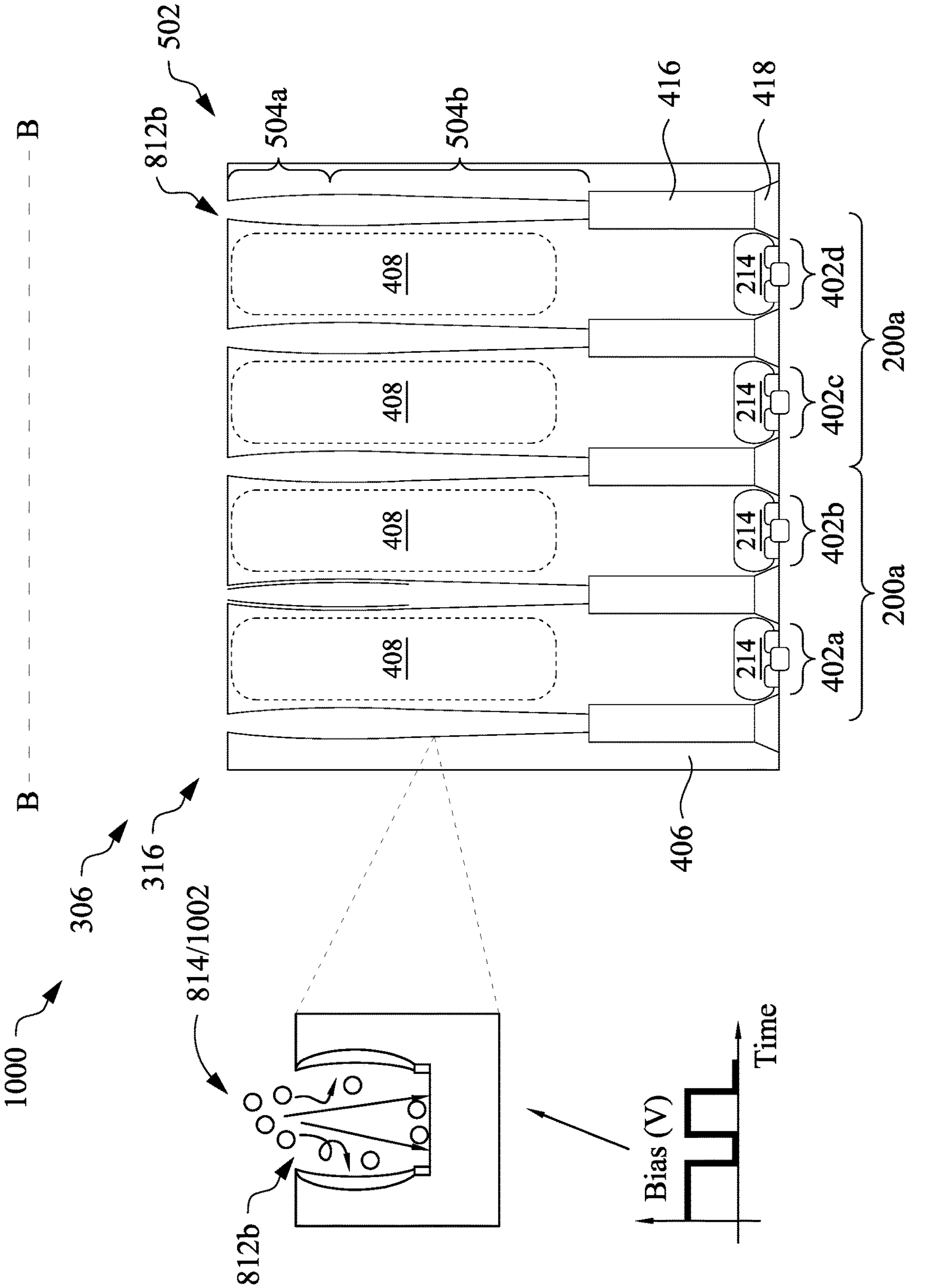
FIGS. 10A and 10B are diagrams of an example implementation of forming trenches described herein.
Figure 10B:
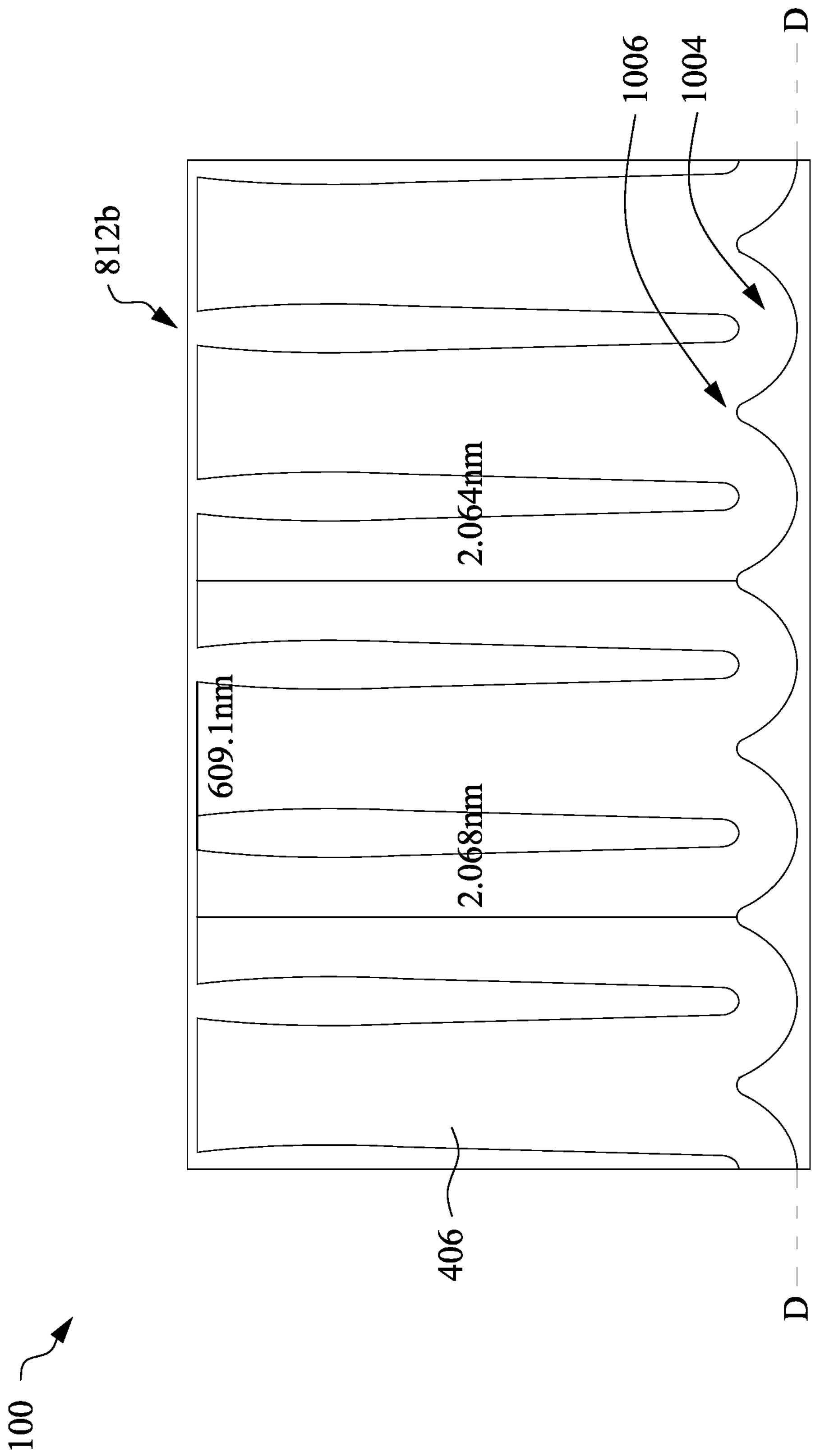

FIGS. 10A and 10B are diagrams of an example implementation 1000 of forming trenches described herein. As shown in FIGS. 10A and 10B, the example implementation 1000 includes an example of forming trenches 812*b* in a substrate 406 of a sensor die 306 included in an image sensor device 310. The trenches 812*b* may be used to form a DTI structure 410*b* in a pixel sensor array 316 of the sensor die 306, where the DTI structure 410*b* includes a flared section and a tapered section. Thus, the trenches 812*b* resemble a bowling pin profile.

In some implementations, one or more of the operations described in connection with FIGS. 10A and 10B may be performed after one or more operations described in connection with FIG. 7 (e.g., after bonding of the sensor wafer 302 and the circuitry wafer 304 to form the image sensor device 310). In some implementations, one or more the semiconductor processing operations described in connection with FIGS. 10A and 10B may be performed by one or more of the semiconductor processing tools 102-116. In some implementations, one or more the semiconductor processing operations described in connection with FIGS. 10A and 10B may be performed by another semiconductor processing tool. In some implementations, one or more the semiconductor processing operations described in connection with FIGS. 10A and 10B may be performed in connection with the example implementation 800 of FIG. 8.

As shown in FIG. 10A, the trenches 812*b* include a flared section 504*a* and a tapered section 504*b*. The flared section 504*a* may be orientated toward the top surface (e.g., the first surface) of the substrate 406, and the tapered section 504*b* may be orientated toward the bottom surface (e.g., the second surface) of the substrate 406 such that the tapered section 504*b* is under the flared section 504*a*. Alternatively, the flared section 504*a* may be orientated toward the bottom surface (e.g., the second surface) of the substrate 406, and the tapered section 504*b* may be orientated toward the top surface (e.g., the first surface) of the substrate 406 such that the tapered section 504*b* is over the flared section 504*a*.

To form the profile of the trenches 812*b* illustrated in FIG. 10A, the etch tool 108 may use a plasma etch technique in which a bias voltage is used to control the bombardment of the etchant 814 and/or the bombardment of ions 1002 in the plasma. To create the flared section 504*a* and the tapered section 504*b*, the etch tool 108 may use a time-varying bias voltage, where the bias voltage is included in a range of approximately 30 volts to approximately 100 volts. However, other values for the range are within the scope of the present disclosure. The time-varying bias voltage changes the directionality of the bombardment of the etchant 814 and/or the bombardment of ions 1002 in the plasma such that a greater amount of isotropic etching occurs in the flared section 504*a*, and a greater amount of anisotropic etching occurs in the tapered section 504*b*.

In FIG. 10B, a cross section along a trench 812*b* (shown along line D-D) is superimposed on the cross section across a plurality of trenches 812*b* (shown along line B-B). As shown in FIG. 10B, the depth of the trench 812*b* along the line D-D is different at different locations along the trench 812*b*. As an example, the depth of the trench 812*b* may be greater at intersections 1004, between the trench 812*b* going across FIG. 10B and trenches 812*b* going into the page in FIG. 10B, relative to the depth of the trench 812*b* in transition regions 1006 between intersections 1004. As further shown in FIG. 10B, the plasma etch technique described in connection with FIG. 10A may result in an approximately bowl-shaped (or curved) profile for the intersections 1004. The transition regions 910 may resemble sharp peaks or triangles between the intersections 1004.

As indicated above, FIGS. 10A and 10B are provided as an example. Other examples may differ from what is described with regard to FIGS. 10A and 10B.

Figure 11A:
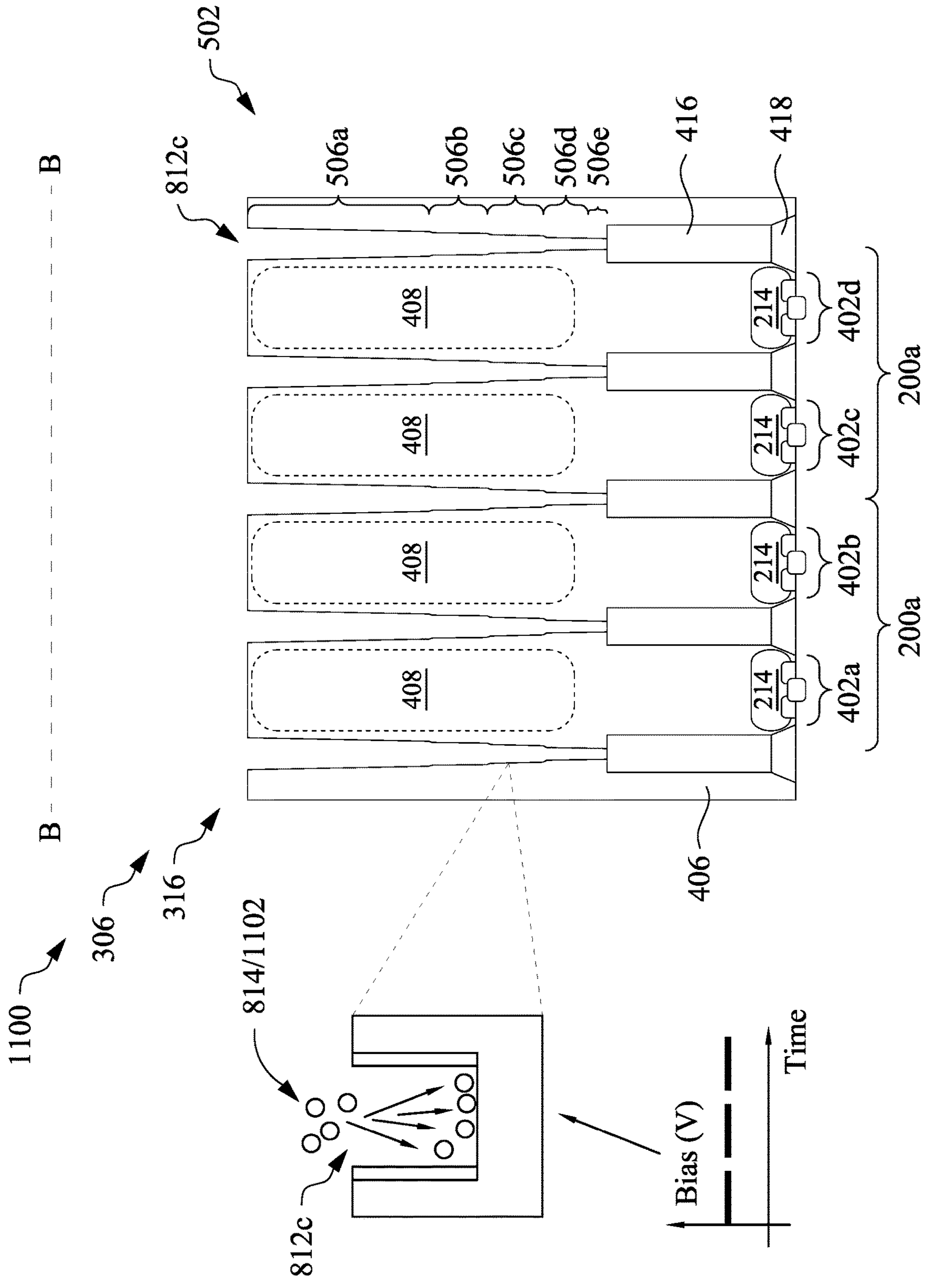
FIGS. 11A and 11B are diagrams of an example implementation of forming trenches described herein.
Figure 11B:
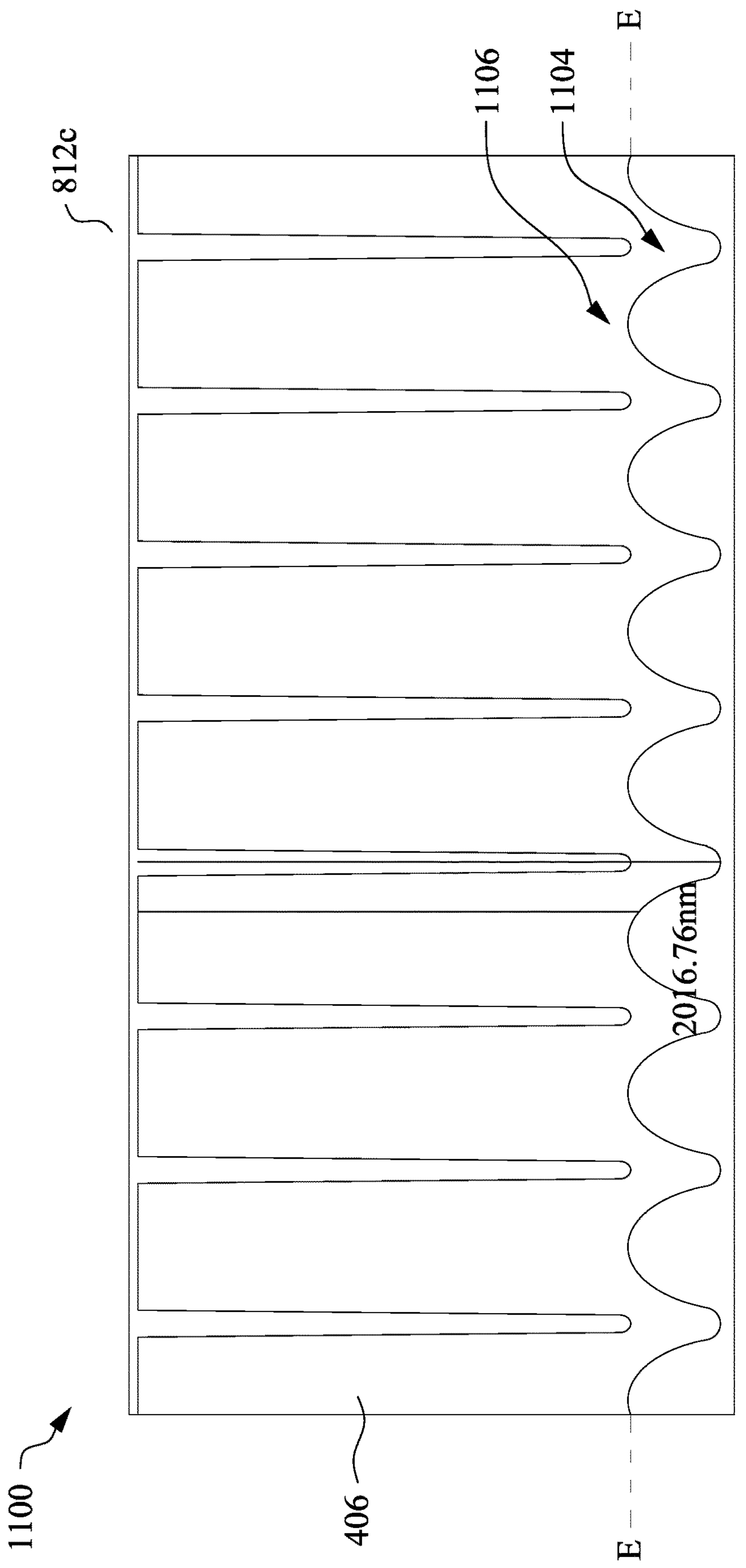

FIGS. 11A and 11B are diagrams of an example implementation 1100 of forming trenches described herein. As shown in FIGS. 11A and 11B, the example implementation 1100 includes an example of forming trenches 812*c* in a substrate 406 of a sensor die 306 included in an image sensor device 310. The trenches 812*c* may be used to form a DTI structure 410*c* in a pixel sensor array 316 of the sensor die 306, where the DTI structure 410*c* includes a stepped cross-sectional profile having a plurality of stepped sections.

In some implementations, one or more of the operations described in connection with FIGS. 11A and 11B may be performed after one or more operations described in connection with FIG. 7 (e.g., after bonding of the sensor wafer 302 and the circuitry wafer 304 to form the image sensor device 310). In some implementations, one or more the semiconductor processing operations described in connection with FIGS. 11A and 11B may be performed by one or more of the semiconductor processing tools 102-116. In some implementations, one or more the semiconductor processing operations described in connection with FIGS. 11A and 11B may be performed by another semiconductor processing tool. In some implementations, one or more the semiconductor processing operations described in connection with FIGS. 11A and 11B may be performed in connection with the example implementation 800 of FIG. 8.

As shown in FIG. 11A, the trenches 812*c* include a stepped cross-sectional profile having a plurality of stepped sections 506*a*-506*e* that change in width in a stepped manner (e.g., in a non-linear and/or in a non-uniform manner). For example, a trench 812*c* may include a stepped section 506*a* having a first width, a stepped section 506*b* under the stepped section 506*a* having a second width that is lesser relative to the first width, a stepped section 506*c* under the stepped section 506*b* having a third width that is lesser relative to the second width, and so on.

The stepped sections 506*a*-506*e* may change (e.g., reduce) in width from the top surface of the top surface (e.g., the first surface) of the substrate 406 into the substrate 406 toward the bottom surface (e.g., the second surface) of the substrate 406. Alternatively, the trench 812*c* may extend into the substrate 406 from the bottom surface (e.g., the second surface) of the substrate 406, and the stepped sections 506*a*-506*e* may change (e.g., reduce) in width from the bottom surface (e.g., the second surface) of the substrate 406 into the substrate 406 toward the top surface (e.g., the first surface) of the substrate 406.

To form the profile of the trenches 812*c* illustrated in FIG. 11A, the etch tool 108 may use a plasma etch technique in which a bias voltage is used to control the bombardment of the etchant 814 and/or the bombardment of ions 1102 in the plasma. To create the stepped profile of the sidewalls of the trenches 812*c*, the etch tool 108 may use a constant bias voltage setting. However, instead of using the bias voltage at a constant frequency, the etch tool 108 may pulse the bias voltage at the bias voltage setting such that the bias voltage is used for discrete time periods. The discrete time periods in which the bias voltage is used results in the stepped profile of the sidewalls of the trenches 812*c*. The bias voltage setting is included in a range of approximately 30 volts to approximately 100 volts. However, other values for the range are within the scope of the present disclosure.

In FIG. 11B, a cross section along a trench 812*c* (shown along line E-E) is superimposed on the cross section across a plurality of trenches 812*c* (shown along line B-B). As shown in FIG. 11B, the depth of the trench 812*c* along the line E-E is different at different locations along the trench 812*c*. As an example, the depth of the trench 812*c* may be greater at intersections 1104, between the trench 812*c* going across FIG. 11B and trenches 812*c* going into the page in FIG. 11B, relative to the depth of the trench 812*c* in transition regions 1106 between intersections 1104. As further shown in FIG. 11B, the plasma etch technique described in connection with FIG. 11A may result in an approximately V-shaped profile for the intersections 1104. The transition regions 1106 may resemble rounded peaks or may have a convex profile between the intersections 1104.

As indicated above, FIGS. 11A and 11B are provided as an example. Other examples may differ from what is described with regard to FIGS. 11A and 11B.

FIGS. 12A-12F are diagrams of an example implementation 1200 of forming a pixel sensor array 316 of a sensor die 306 described herein. In some implementations, one or more the semiconductor processing operations described in connection with FIGS. 12A-12F may be performed after one or more of the operations described in connection with FIGS. 8, 9A, 10A, and/or 11A, among other examples. In some implementations, one or more the semiconductor processing operations described in connection with FIGS. 12A-12F may be performed by one or more of the semiconductor processing tools 102-116. In some implementations, one or more the semiconductor processing operations described in connection with FIGS. 12A-12F may be performed by another semiconductor processing tool. FIGS. 12A-12F are illustrated along the cross-section B-B of a QPD region 502 of the pixel sensor array 316 in FIG. 5A.

Figure 12A:
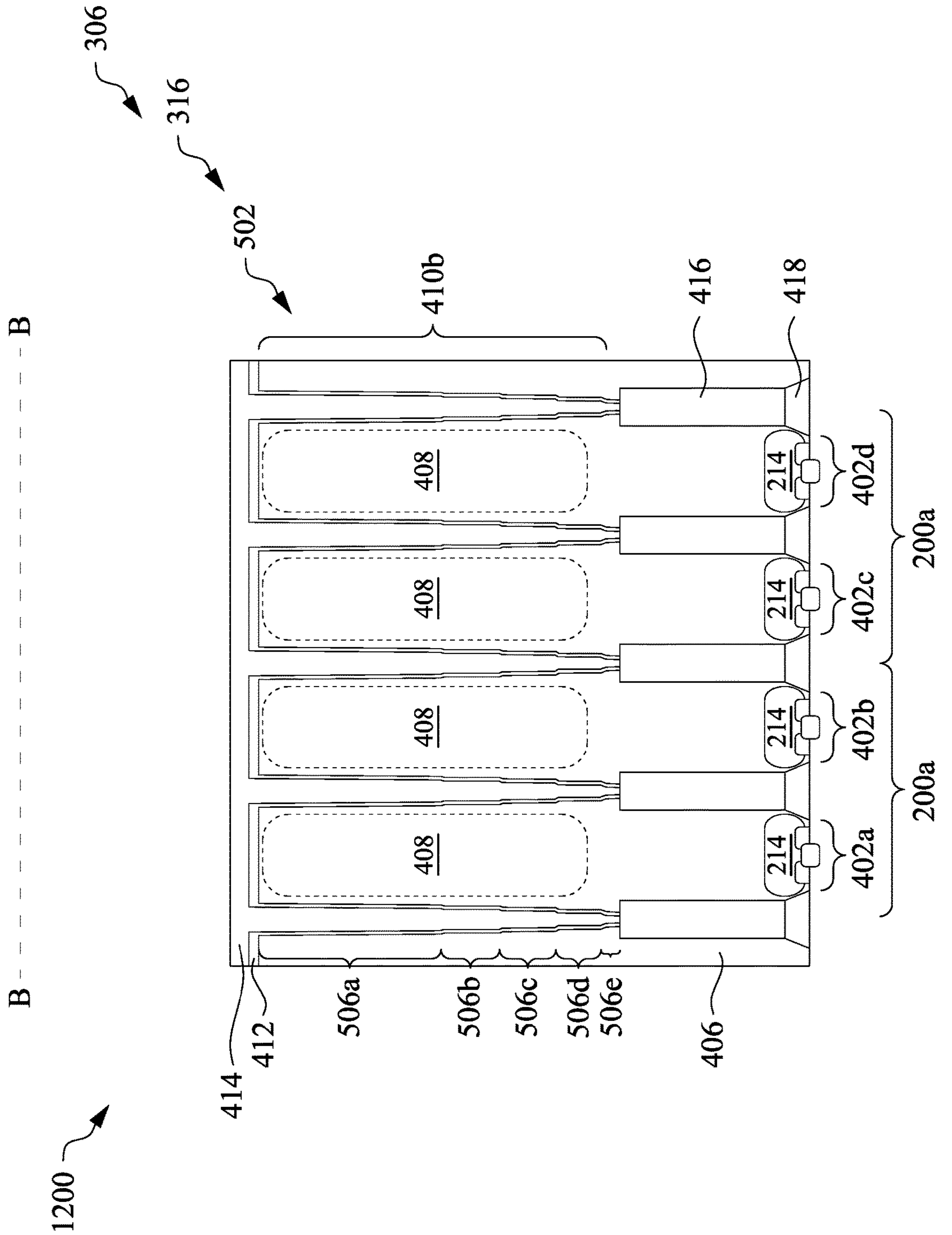
FIGS. 12A-12F are diagrams of an example implementation of forming a pixel sensor array of a sensor die described herein.

As shown in FIG. 12A, trenches (e.g., trenches 812, 812*a*, 812*b*, and/or 812*c*) may be filled in with one or more dielectric materials to form a DTI structure 410*b*. While the example implementation 1200 is illustrated in connection with a DTI structure 410*b* (e.g., a DTI structure having a stepped profile), the operations described in connection with FIGS. 12A-12F may be performed in connection with other DTI structures described herein.

The deposition tool 102 may deposit one or more dielectric materials in the trenches. For example, the deposition tool 102 may conformally deposit the high-k dielectric liner 412 such that the high-k dielectric liner 412 conforms to the profile of the trenches. As another example, the deposition tool 102 may deposit the oxide layer 414 over and/or on the high-k dielectric liner 412 such that the oxide layer 414 fills in the trenches. The deposition tool 102 may also deposit the high-k dielectric liner 412 and/or the oxide layer 414 over and/or on the top surface (e.g., the first surface) of the substrate 406. The deposition tool 102 may deposit the high-k dielectric liner 412 and/or the oxide layer 414 using a CVD technique, a PVD technique, an ALD technique, or another type of deposition technique. The planarization tool 110 may planarize the high-k dielectric liner 412 and/or the oxide layer 414 after the high-k dielectric liner 412 and/or the oxide layer 414 are deposited in the trenches.

Figure 12B:
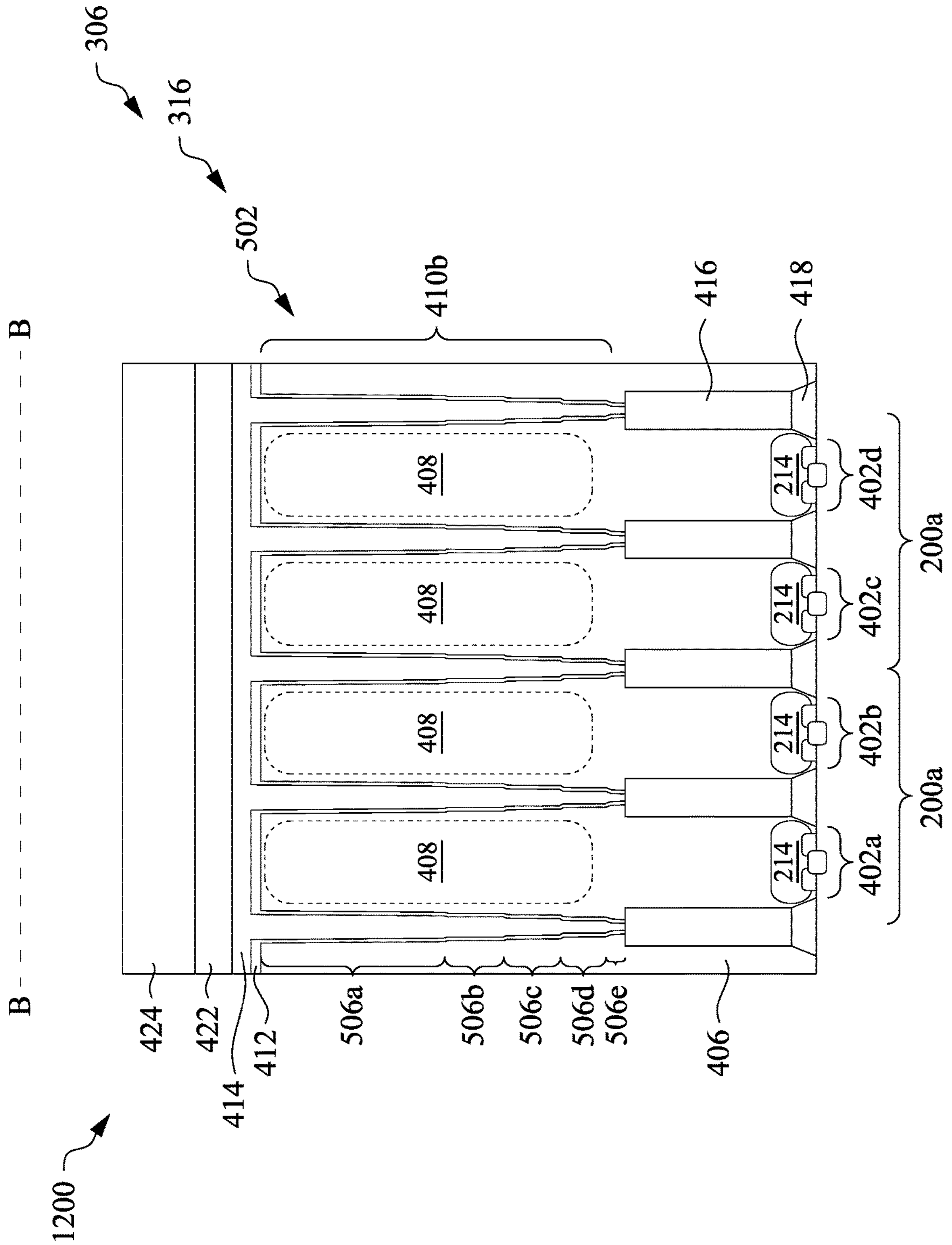

As shown in FIG. 12B, a metal layer 422 may be formed over and/or on the oxide layer 414. A dielectric layer 424 may be formed over and/or on the metal layer 422. The deposition tool 102 may deposit the material of the metal layer 422 using a CVD technique, a PVD technique, an ALD technique, or another type of deposition technique, the plating tool 112 may deposit the material of the metal layer 422 using an electroplating operation, or a combination thereof. The planarization tool 110 may planarize the metal layer 422 after the metal layer 422 is deposited. The deposition tool 102 may deposit the dielectric layer 424 using a CVD technique, a PVD technique, an ALD technique, or another type of deposition technique. The planarization tool 110 may planarize the dielectric layer 424 after the dielectric layer 424 is deposited.

Figure 12C:
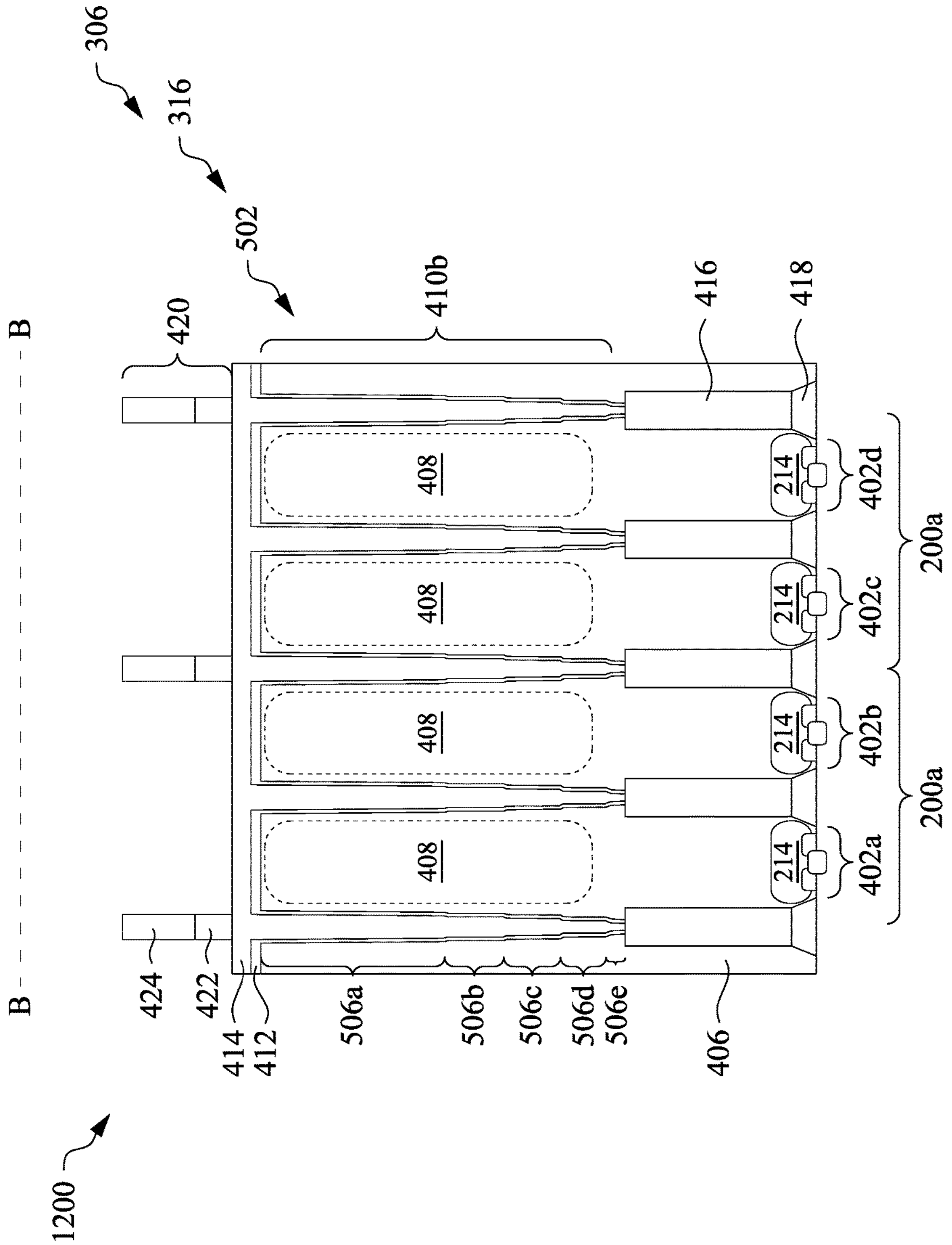

As shown in FIG. 12C, portions of the metal layer 422 and the dielectric layer 424 may be removed to form a grid structure 420 over the DTI structure 410*b*. To form the grid structure 420, the deposition tool 102 may form a photoresist layer on the dielectric layer 424. The exposure tool 104 may expose the photoresist layer to a radiation source to pattern the photoresist layer, the developer tool 106 may develop and remove portions of the photoresist layer to expose the pattern, and the etch tool 108 may etch portions of the dielectric layer 424 and portions of the metal layer 422 to form the grid structure 420. In some implementations, a photoresist removal tool removes the remaining portions of the photoresist layer (e.g., using a chemical stripper, a plasma asher, and/or another technique) after the etch tool 108 etches the dielectric layer 424 and the metal layer 422 to form the grid structure 420.

Figure 12D:
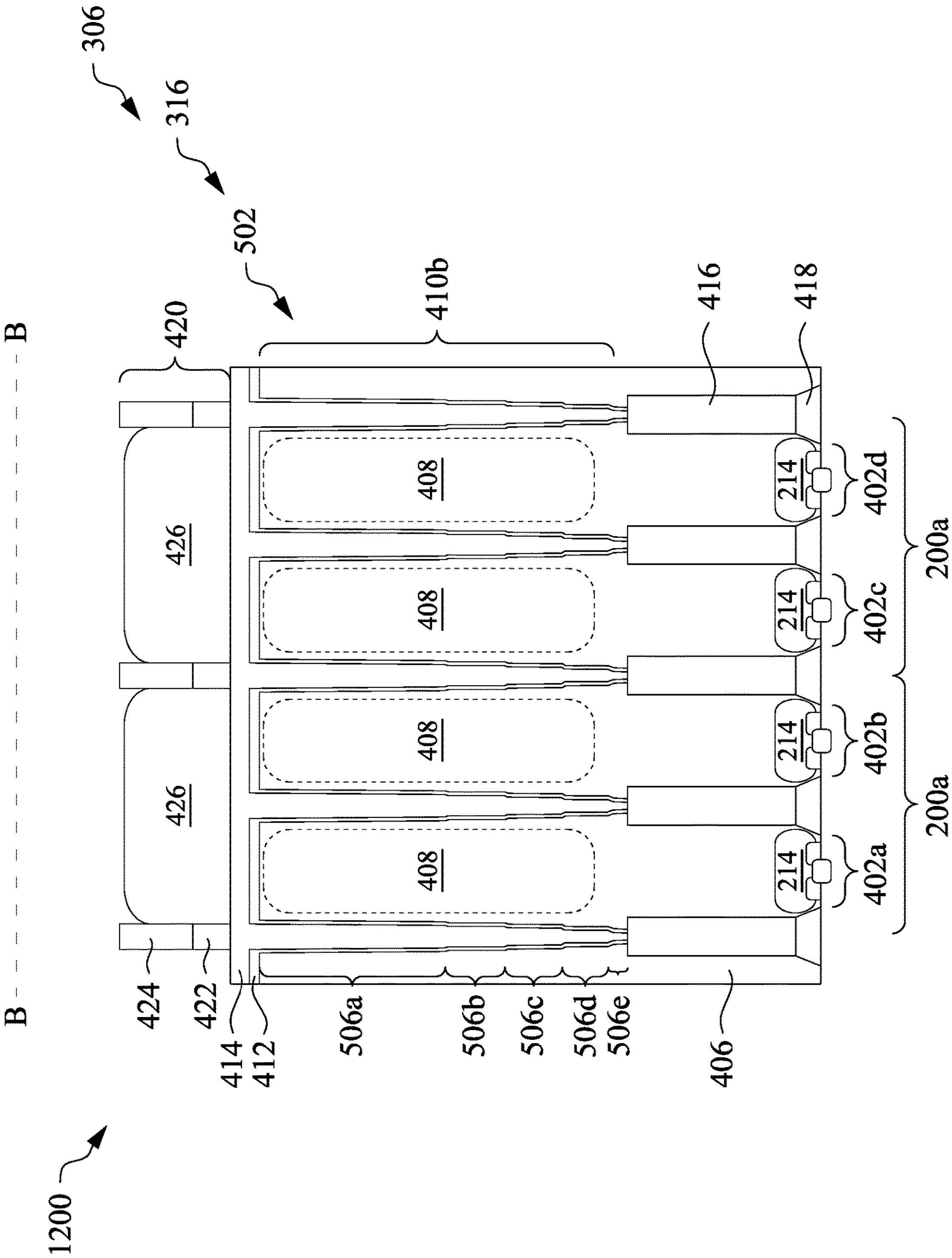

As shown in FIG. 12D, color filter regions 426 may be formed over the photodiodes 408 of the pixel sensors 200*a*. For example, a first color filter region 426 may be formed over the photodiodes 408 in the subregions 402*a* and 402*b* of a first pixel sensor 200*a*, a second color filter region 426 may be formed over the photodiodes 408 in the subregions 402*c* and 402*d* of a second pixel sensor 200*a*, and so on. The deposition tool 102 may deposit the color filter regions 426 using a CVD technique, a PVD technique, an ALD technique, or another type of deposition technique.

Figure 12E:
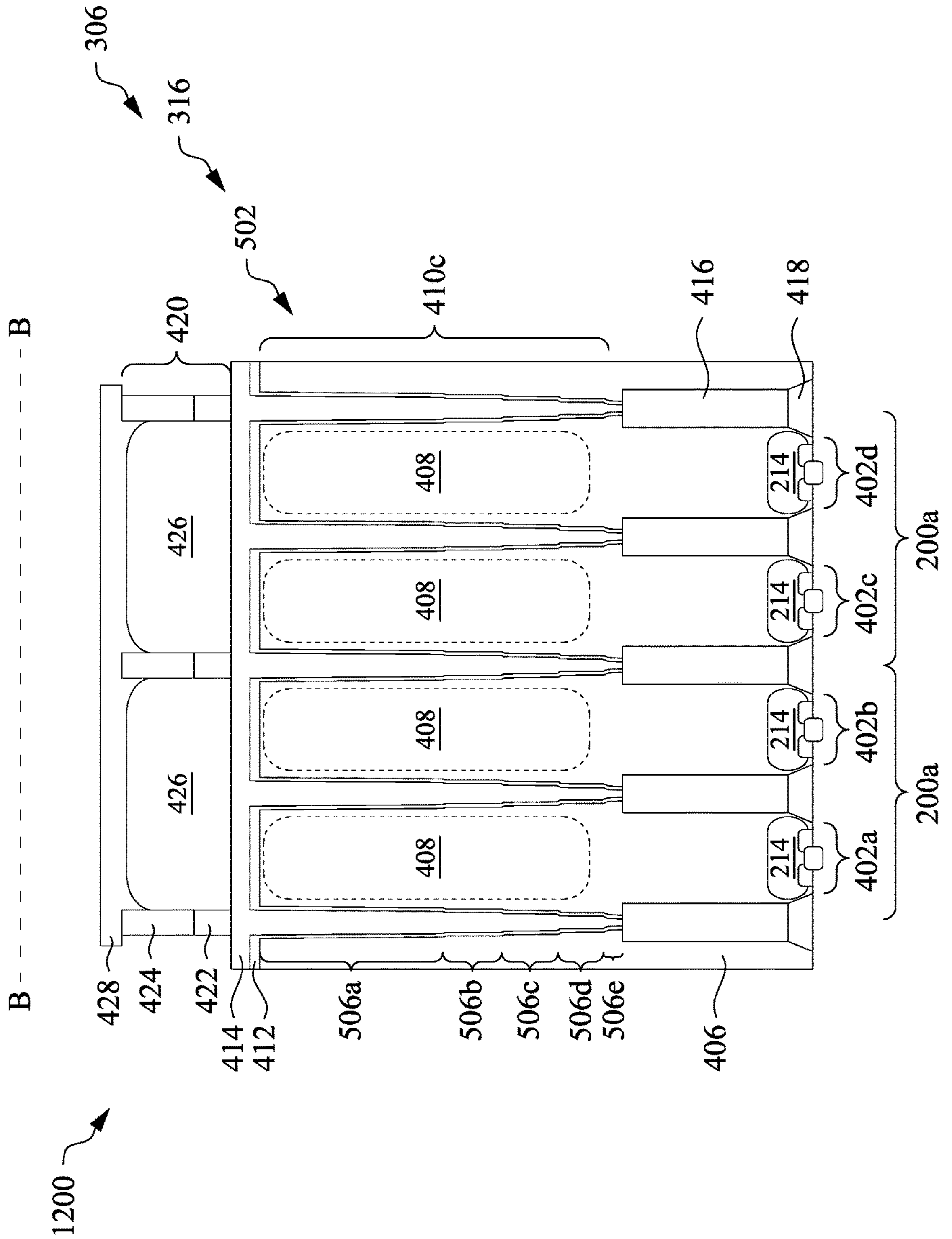

As shown in FIG. 12E, under layers 428 may be formed over and/or on the color filter regions 426 and/or over and/or on the grid structure 420. The deposition tool 102 may deposit the under layers 428 using a CVD technique, a PVD technique, an ALD technique, or another type of deposition technique. The under layers 428 may conform to the shape of the color filter regions 426. The planarization tool 110 may planarize the under layers 428 after the under layers 428 are deposited.

Figure 12F:
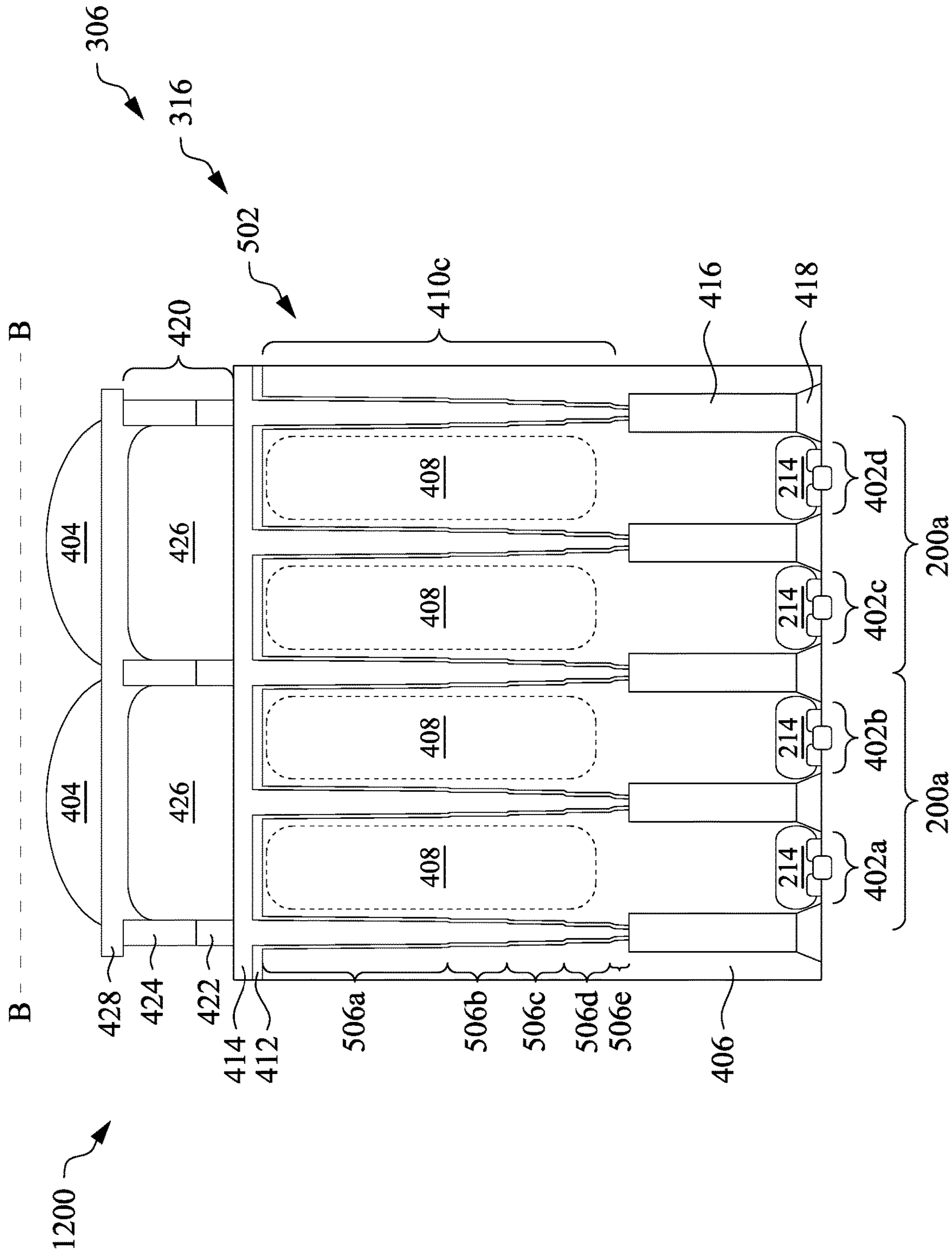

As shown in FIG. 12F, micro lenses 404 may be formed over and/or on the under layers 428. For example, a first micro lens 404 may be formed over the color filter region 426 of a first pixel sensor 200*a*, a second micro lens 404 may be formed over the color filter region 426 of a second pixel sensor 200*a*, and so on.

As indicated above, FIGS. 12A-12F are provided as an example. Other examples may differ from what is described with regard to FIGS. 12A-12F.

Figure 13A:
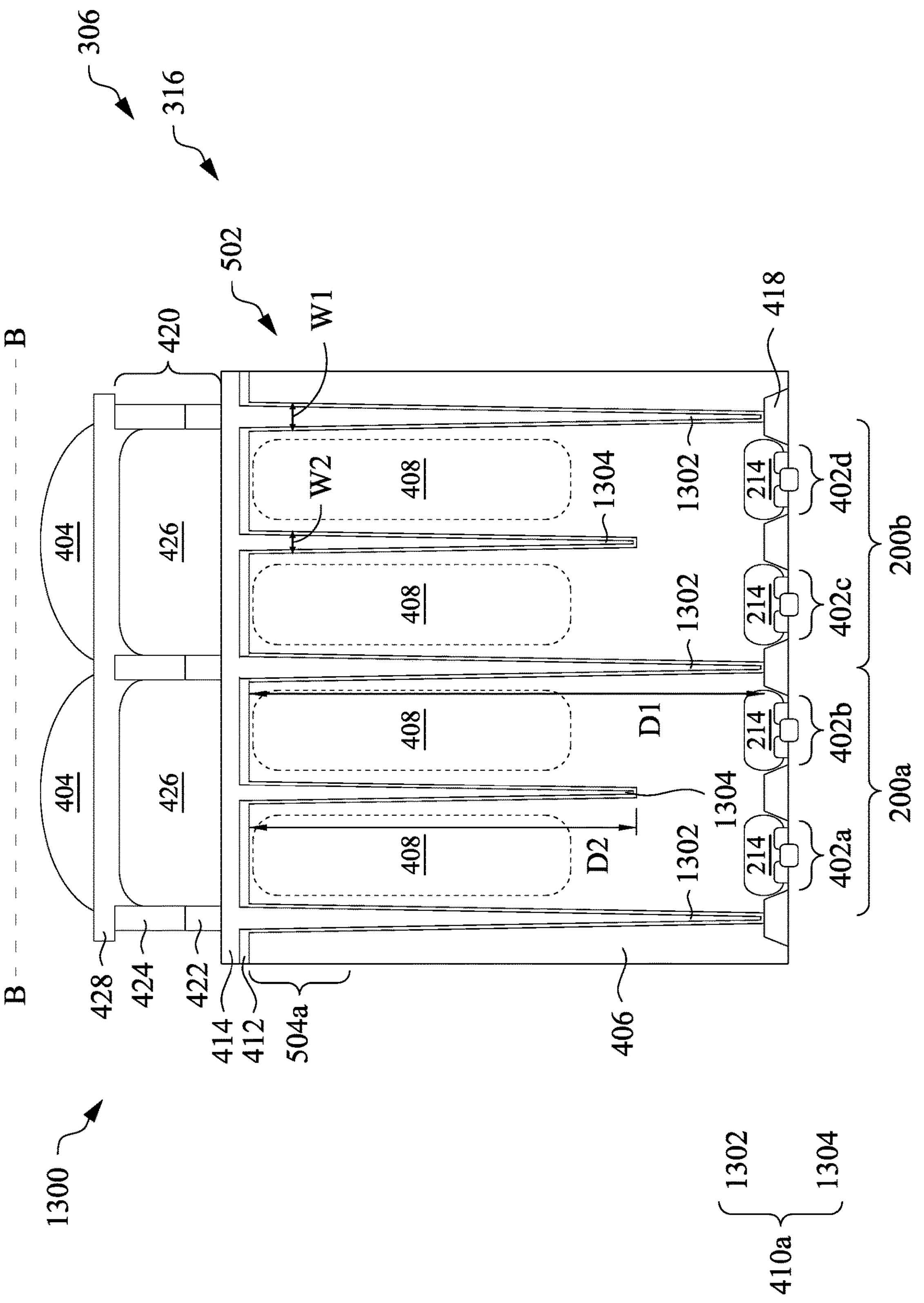
FIGS. 13A-13C are diagrams of example implementations of a pixel sensor array described herein.
Figure 13B:
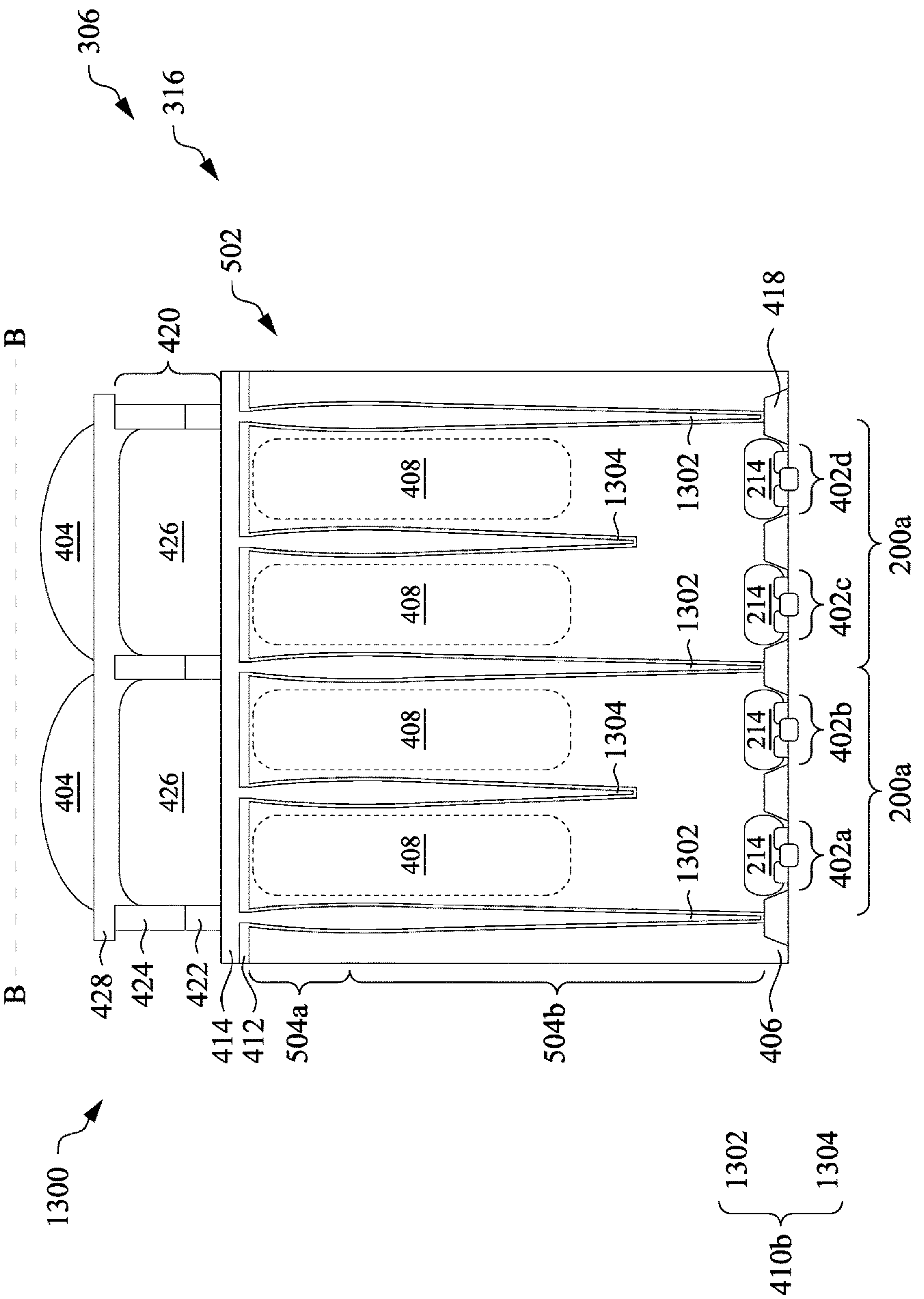
Figure 13C:
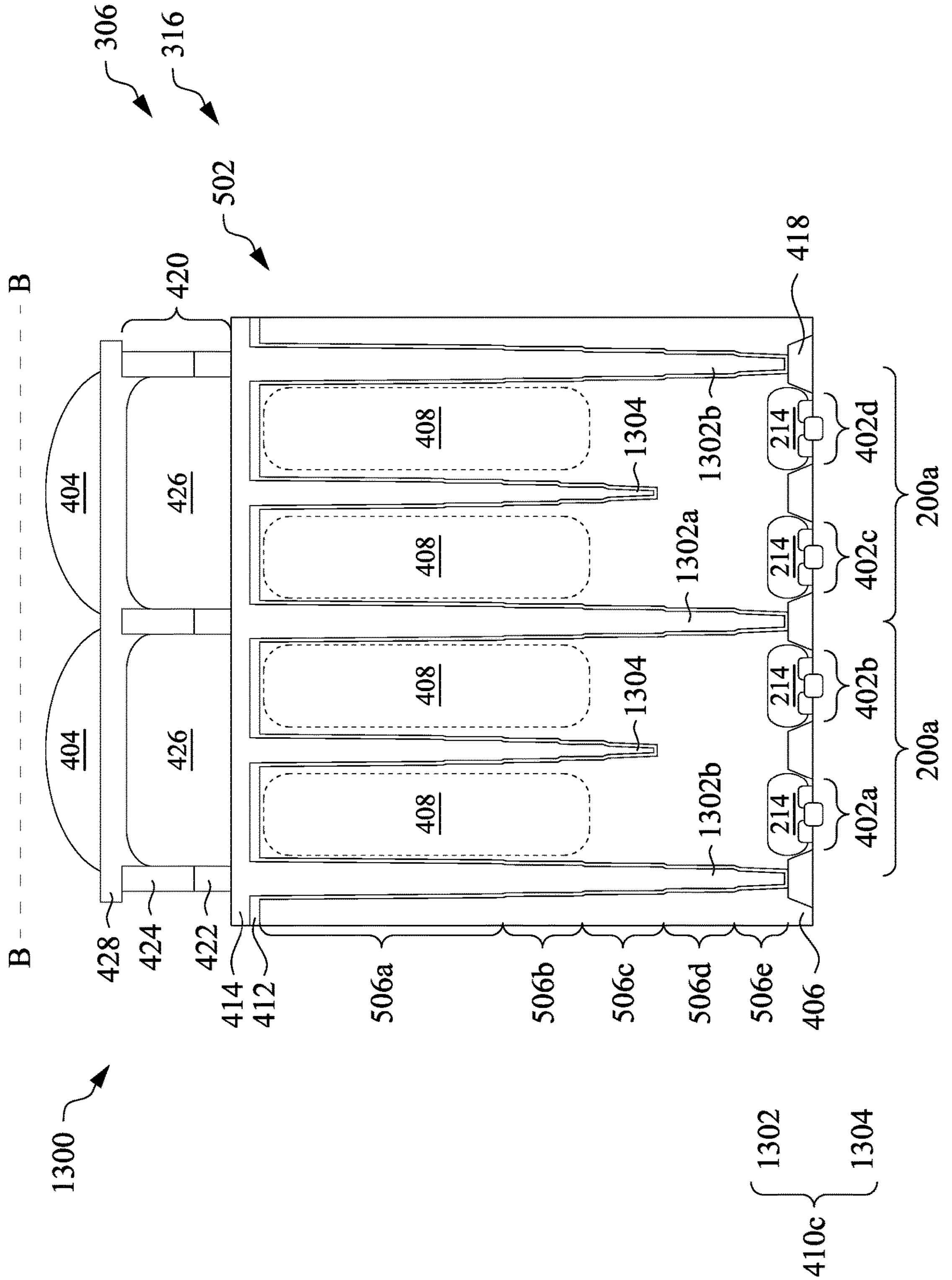

FIGS. 13A-13C are diagrams of example implementations 1300 of a pixel sensor array 316 described herein. The pixel sensor array 316 may be included in a sensor die 306, which may be included in an image sensor device 310. In the example implementations 1300, the DPW regions 416 are omitted from pixel sensor array 316, and pixel sensor array 316 includes DTI structures that have two or more DTI portions that extend to depths in the substrate 406. The different depths of the DTI portions enable photocurrents generated by the photodiodes 408 of a pixel sensor 200*a* to be combined into a unified photocurrent that may be used for autofocus operations for an image sensor device 310 that includes the sensor die 306.

FIG. 13A illustrates a cross-section view along line B-B illustrated in FIG. 5A. FIG. 13A includes an example implementation 1300 in which the pixel sensor array 316 includes a DTI structure 410*a* similar to the DTI structure 410*a* illustrated in FIG. 5B, in which sidewalls of the DTI structure 410*a* taper such that a width of the DTI structure 410*a* continuously reduces in a uniform manner.

FIG. 13A includes an example configuration of the DTI structure 410*a* in which the DTI structure 410*a* includes two or more DTI portions that extend into the substrate 406 from the top surface (e.g., the first surface) of the substrate 406 to different depths in the substrate 406. For example, the DTI structure 410*a* may include DTI portions 1302 that extend into the substrate 406 to approximately a same depth D1, and may include DTI portions 1304 that extend into the substrate 406 to approximately a same depth D2, where the depth D1 is greater relative to the depth D2. The depth D1 may be selected such that the DTI portions 1302 extend from the top surface (e.g., the first surface) of the substrate 406 to the STI regions 418 at the bottom surface (e.g., the second surface) of the substrate 406. The depth D2 may be selected such that the DTI portions 1304 extend from the top surface (e.g., the first surface) of the substrate 406 into a portion of the substrate 406 such that the substrate 406 separates the DTI portions 1304 from the STI regions 418 at the bottom surface (e.g., the second surface) of the substrate 406. In other words, the DTI portions 1304 do not extend to any STI regions 418 at the bottom surface (e.g., the second surface) of the substrate 406 and are instead spaced apart from the STI regions 418 by the substrate 406.

The DTI portions 1302 may be located around the outer perimeters of the pixel sensors 200*a* and may provide electrical isolation and/or optical isolation between adjacent pixel sensors 200*a*. The DTI portions 1304 may be located between subregions 402 within a pixel sensor 200*a*. For example, a first DTI portion 1304 may be located between subregion 402*a* and subregion 402*b* of a first pixel sensor 200*a*, a second DTI portion 1304 may be located between subregion 402*c* and subregion 402*d* of a second pixel sensor 200*a*, and so on.

The gap in the substrate 406 between the bottom of a DTI portion 1304 in a pixel sensor 200*a* enables photocurrents generated by the photodiodes 408 of the pixel sensor 200*a* to be binned and combined into a unified photocurrent that is transferred by the transfer transistors 214 of the pixel sensor 200*a*. This enables quadratic photo detection for supporting autofocus operations for the image sensor device 310. In particular, photocurrents generated by the photodiodes 408 of the pixel sensor 200*a* may be binned and combined into a unified photocurrent such that different QEs of the photodiodes 408 may be averaged across the photodiodes to achieve more even saturation times in the photodiodes 408 and reduced autofocus times.

In some implementations, the depth D1 is included in a range of approximately 0.5 microns to approximately 10 microns so that a sufficient amount of photon absorption can occur in the photodiodes 408 while providing sufficient electrical isolation and/or optical isolation between adjacent pixel sensors 200*a*. However, other values for the range are within the scope of the present disclosure. In some implementations, the depth D2 is included in a range of approximately 62% of the depth D1 to approximately 78% of the depth D1 to reduce the likelihood of uncontrollable implant diffusion while providing sufficient photo-electron overflow between photodiodes 408 in a pixel sensor 200*a*. However, other values for the range are within the scope of the present disclosure.

In some implementations, a width W1 of a DTI portion 1302, at a top of the DTI portion 1302, is included in a range of approximately 80 nanometers to approximately 200 nanometers so that a sufficient amount of photon absorption can occur in the photodiodes 408 while providing sufficient electrical isolation and/or optical isolation between adjacent pixel sensors 200*a*. However, other values for the range are within the scope of the present disclosure. In some implementations, a width W2 of a DTI portion 1304, at a top of the DTI portion 1304, is included in a range of approximately 62% of the width W1 to approximately 78% of the width W1 to reduce light scattering in the pixel sensor array 316 while achieving a sufficient high yield of pixel sensors 200*a* in the pixel sensor array 316. However, other values for the range are within the scope of the present disclosure.

FIG. 13B illustrates a cross-section view along line B-B illustrated in FIG. 5A. FIG. 13B includes an example implementation 1300 in which the pixel sensor array 316 includes a DTI structure 410*b* similar to the DTI structure 410*b* illustrated in FIG. 5C, in which the DTI structure 410*b* includes a cross-sectional profile that approximately resembles a bowling pin. In particular, DTI portions 1302 and 1304 of the DTI structure 410*b* may include a flared section 504*a* and a tapered section 504*b*. The DPW regions 416 are omitted, and the DTI portions 1302 extend to the STI regions 418 at the bottom surface (e.g., the second surface) of the substrate 406. The DTI portions 1304 extend into the substrate 406 and do not extend to the STI regions 418 such that gaps in the substrate 406 between the DTI portions 1304 and the STI regions 418 enable photo-electron overflow between the photodiodes 408 of a pixel sensor 200*a*.

FIG. 13C illustrates a cross-section view along line B-B illustrated in FIG. 5A. FIG. 13C includes an example implementation 1300 in which the pixel sensor array 316 includes a DTI structure 410*c* similar to the DTI structure 410*c* illustrated in FIG. 5D, in which the DTI structure 410*c* includes a stepped cross-sectional profile having a plurality of stepped sections 506*a*-506*e*. The DPW regions 416 are omitted, and the DTI portions 1302 extend to the STI regions 418 at the bottom surface (e.g., the second surface) of the substrate 406. The DTI portions 1304 extend into the substrate 406 and do not extend to the STI regions 418 such that gaps in the substrate 406 between the DTI portions 1304 and the STI regions 418 enable photo-electron overflow between the photodiodes 408 of a pixel sensor 200*a*.

As indicated above, FIGS. 13A-13C are provided as examples. Other examples may differ from what is described with regard to FIGS. 13A-13C.

Figure 14A:
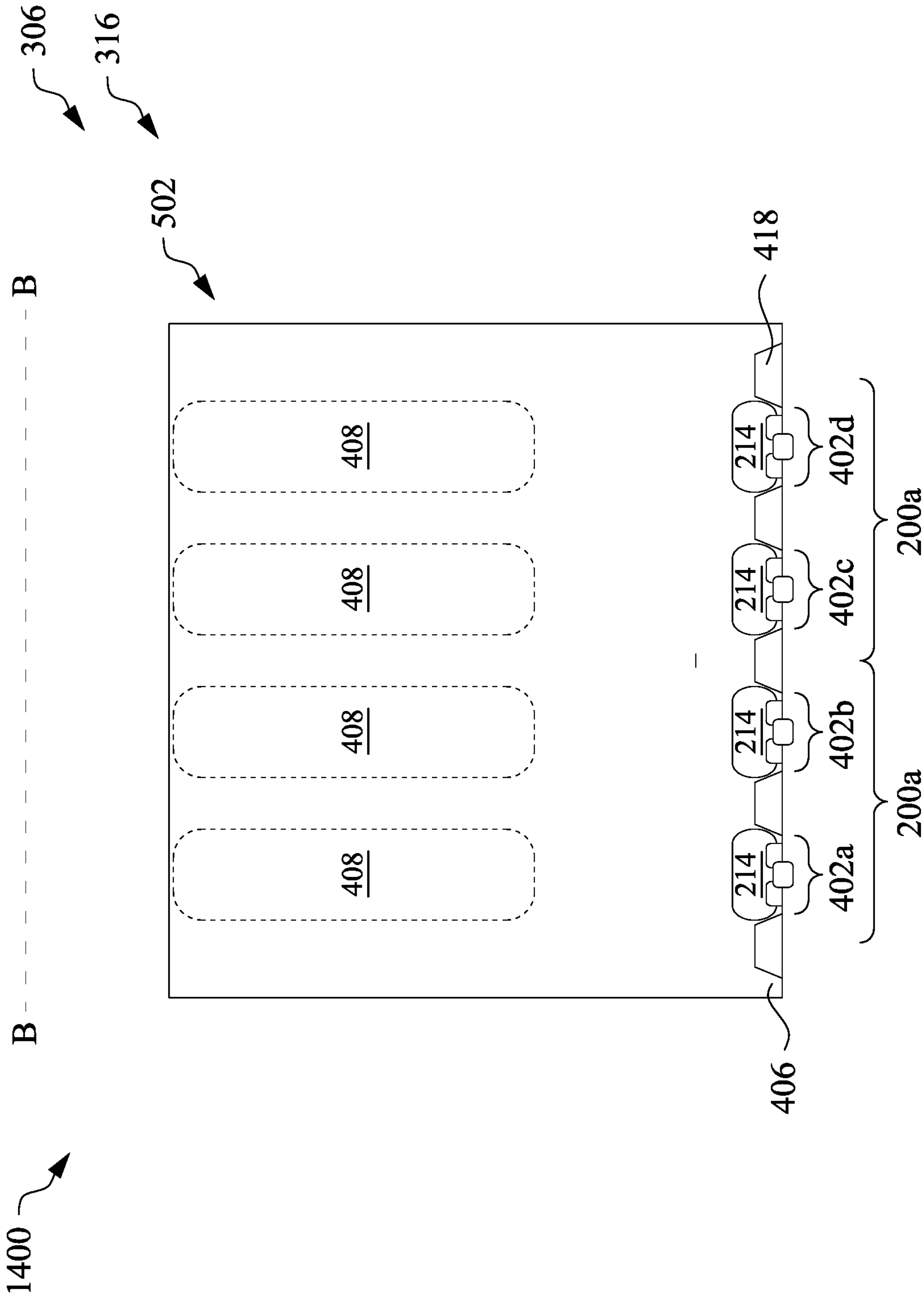
FIGS. 14A-14C are diagrams of an example implementation of forming trenches described herein.
Figure 14B:
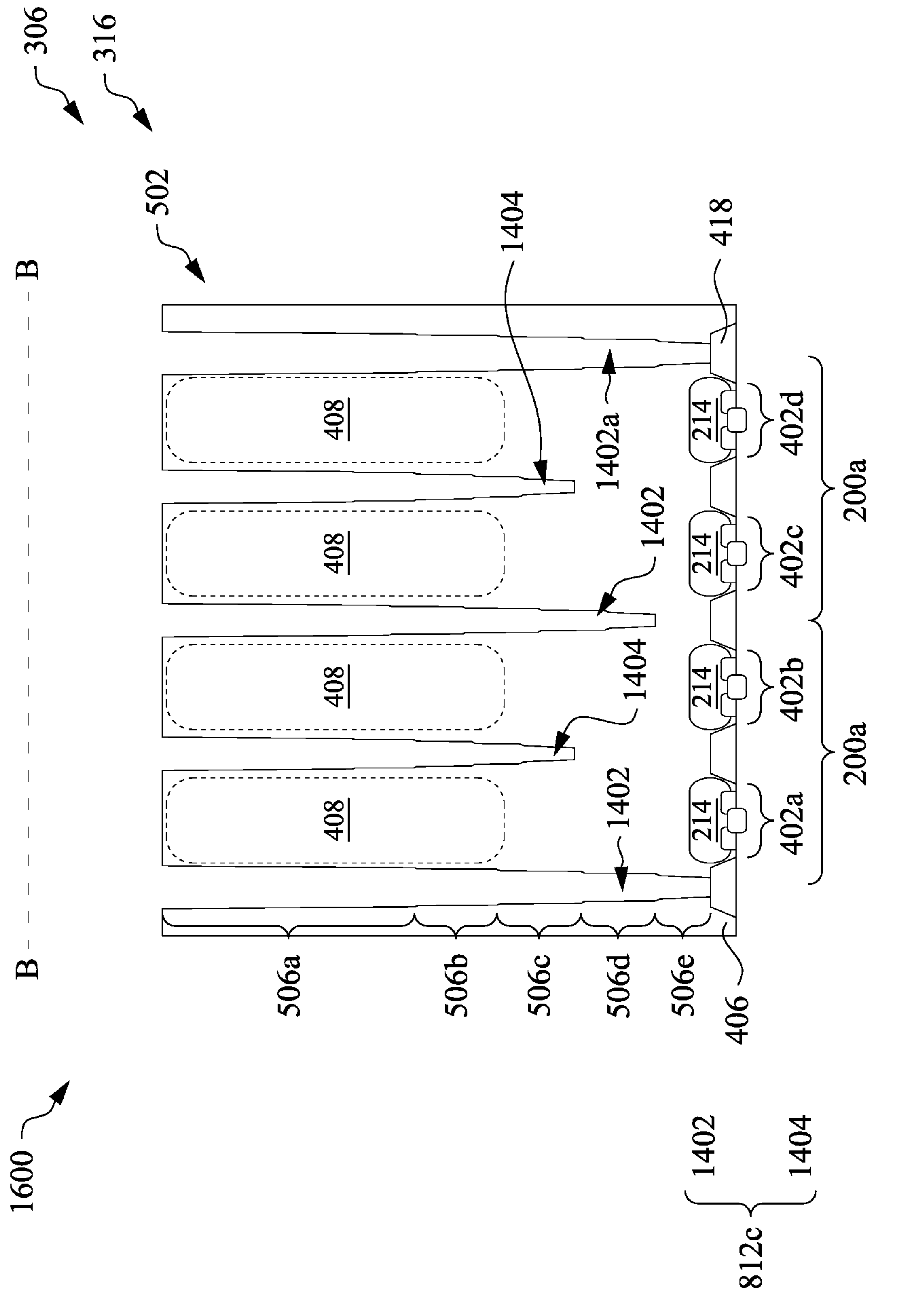
Figure 14C:
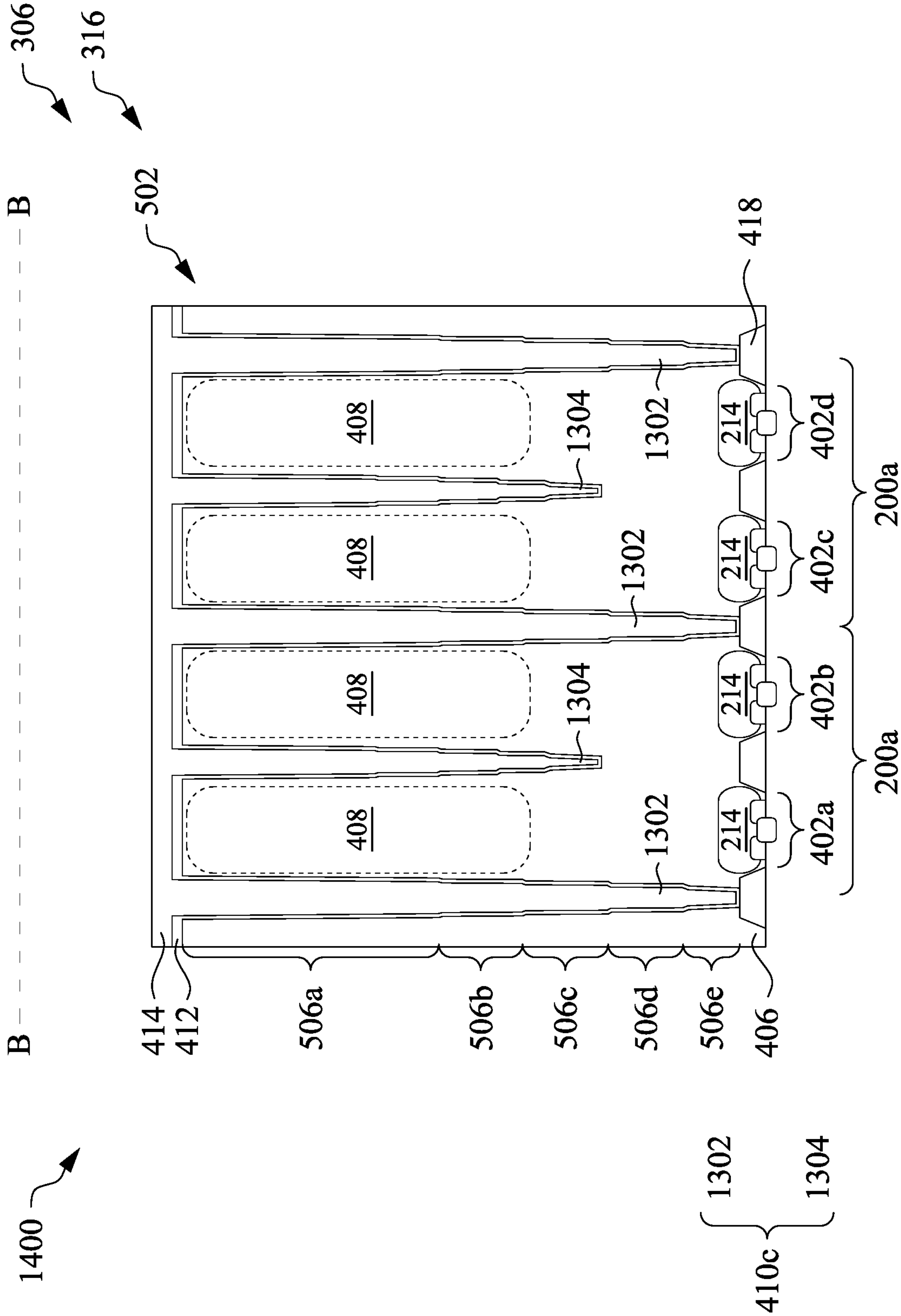

FIGS. 14A-14C are diagrams of an example implementation 1400 of forming trenches described herein. As shown in FIGS. 14A-14C, the example implementation 1400 includes an example of forming trenches 812*c* in a substrate 406 of a sensor die 306 included in an image sensor device 310. The trenches 812*c* may be used to form a DTI structure 410*c* in a pixel sensor array 316 of the sensor die 306, where the DTI structure 410*c* includes a stepped cross-sectional profile having a plurality of stepped sections. In particular, the trenches 812*c* may be used to form a DTI structure 410*c* that includes DTI portions 1302 and DTI portions 1304 having different depths in the pixel sensor array 316, as illustrated in FIG. 13C. However, the techniques described in connection with FIGS. 14A-14C may be used to form trenches 812*a* for forming the DTI structure 410*a* of FIG. 13A and/or to form trenches 812*b* for forming the DTI structure 410*b* of FIG. 13B, among other examples.

As shown in FIG. 14A, one or more of the operations described in connection with FIGS. 14A-14C may be performed after one or more operations described in connection with FIGS. 6A-6D and/or FIG. 7 (e.g., after bonding of the sensor wafer 302 and the circuitry wafer 304 to form the image sensor device 310). In some implementations, one or more the semiconductor processing operations described in connection with FIGS. 14A-14C may be performed by one or more of the semiconductor processing tools 102-116. In some implementations, one or more the semiconductor processing operations described in connection with FIGS. 14A-14C may be performed by another semiconductor processing tool.

As shown in FIG. 14B, trenches 812*c* may be formed in the substrate 406 along sides of the photodiodes 408 of the subregions 402*a*-402*d* of the pixel sensors 200*a*. In some implementations, one or more etch-deposition-etch cycles 802 may be performed by one or more of the semiconductor processing tools 102-116 to form trench portions 1402 and 1404 of the trenches 812*c*. As further shown in FIG. 14B, the trench portions 1402 may extend from a top surface (e.g., a first surface) of the substrate 406 into the substrate 406 to STI regions 418 at a bottom surface (e.g., a second surface) of the substrate 406. The trench portions 1404 may extend from a top surface (e.g., a first surface) of the substrate 406 into the substrate 406 and do not extend to any STI regions 418. In this way, portions of the substrate 406 remain between the trench portions 1404 and the STI regions 418.

As shown in FIG. 14C, the trenches 812*c* may be filled in with one or more dielectric materials to form a DTI structure 410*c* that includes DTI portions 1302 and 1304. For example, the trenches 812*c* may be filled with a high-k dielectric liner 412 and an oxide layer 414, among other examples. In some implementations, the trenches 812*c* may be filled in with the one or more dielectric materials as described above in connection with FIG. 12A. Moreover, additional processing operations described in connection with FIGS. 12B-12F may be performed to manufacture the pixel sensor array 316 of the sensor die 306.

As indicated above, FIGS. 14A-14C are provided as an example. Other examples may differ from what is described with regard to FIGS. 14A-14C.

Figure 15A:
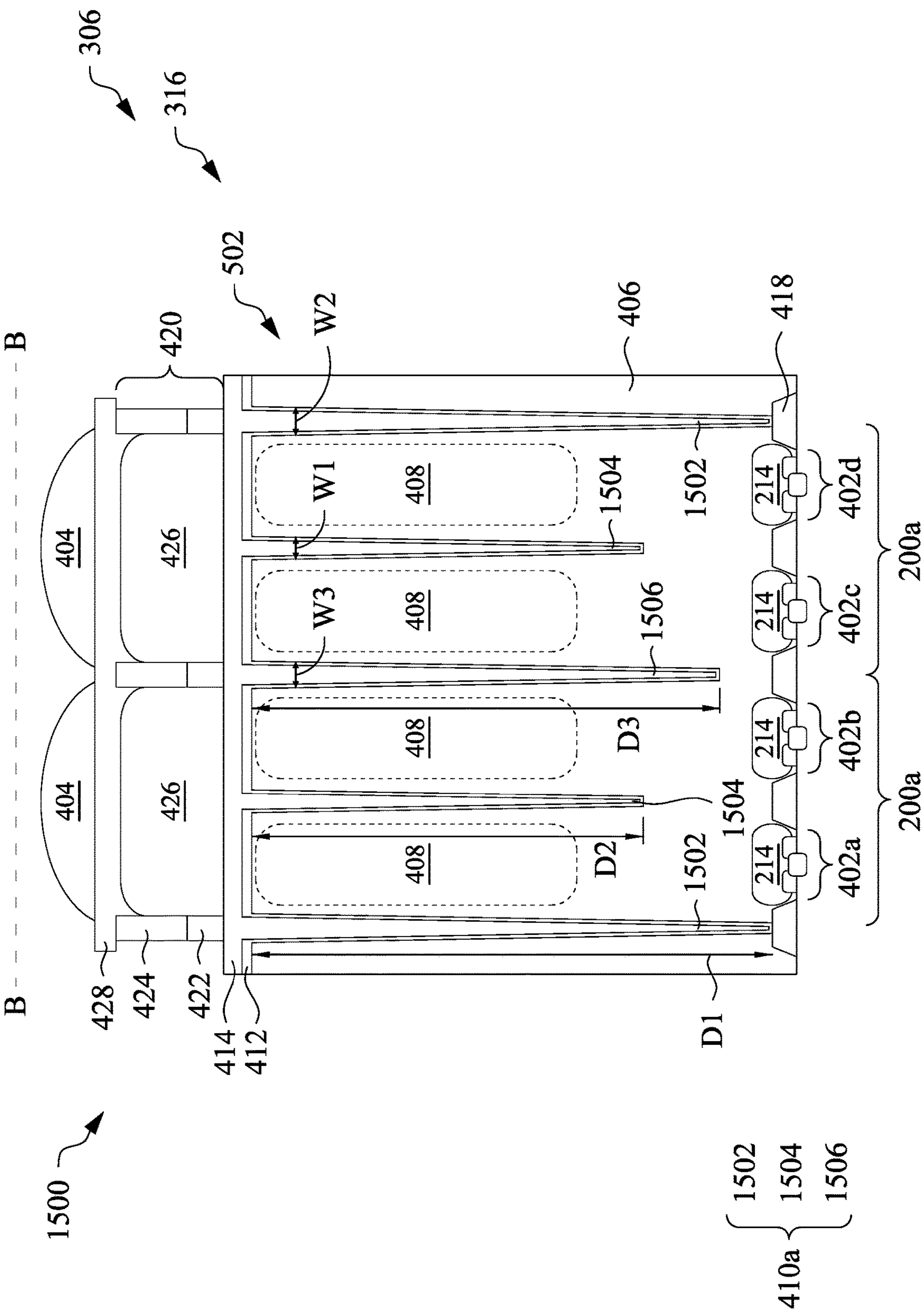
FIGS. 15A-15C are diagrams of example implementations of a pixel sensor array described herein.
Figure 15B:
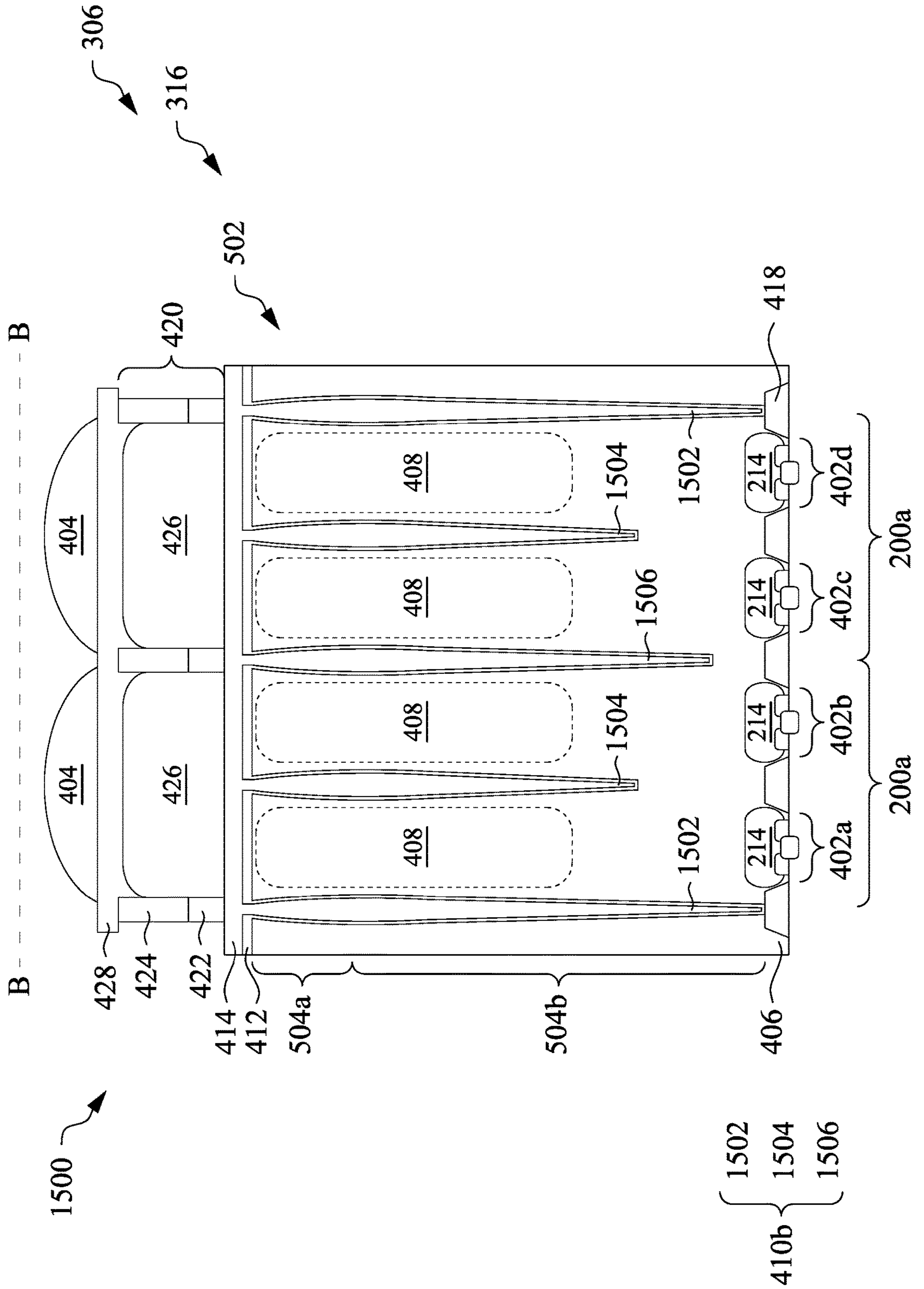
Figure 15C:
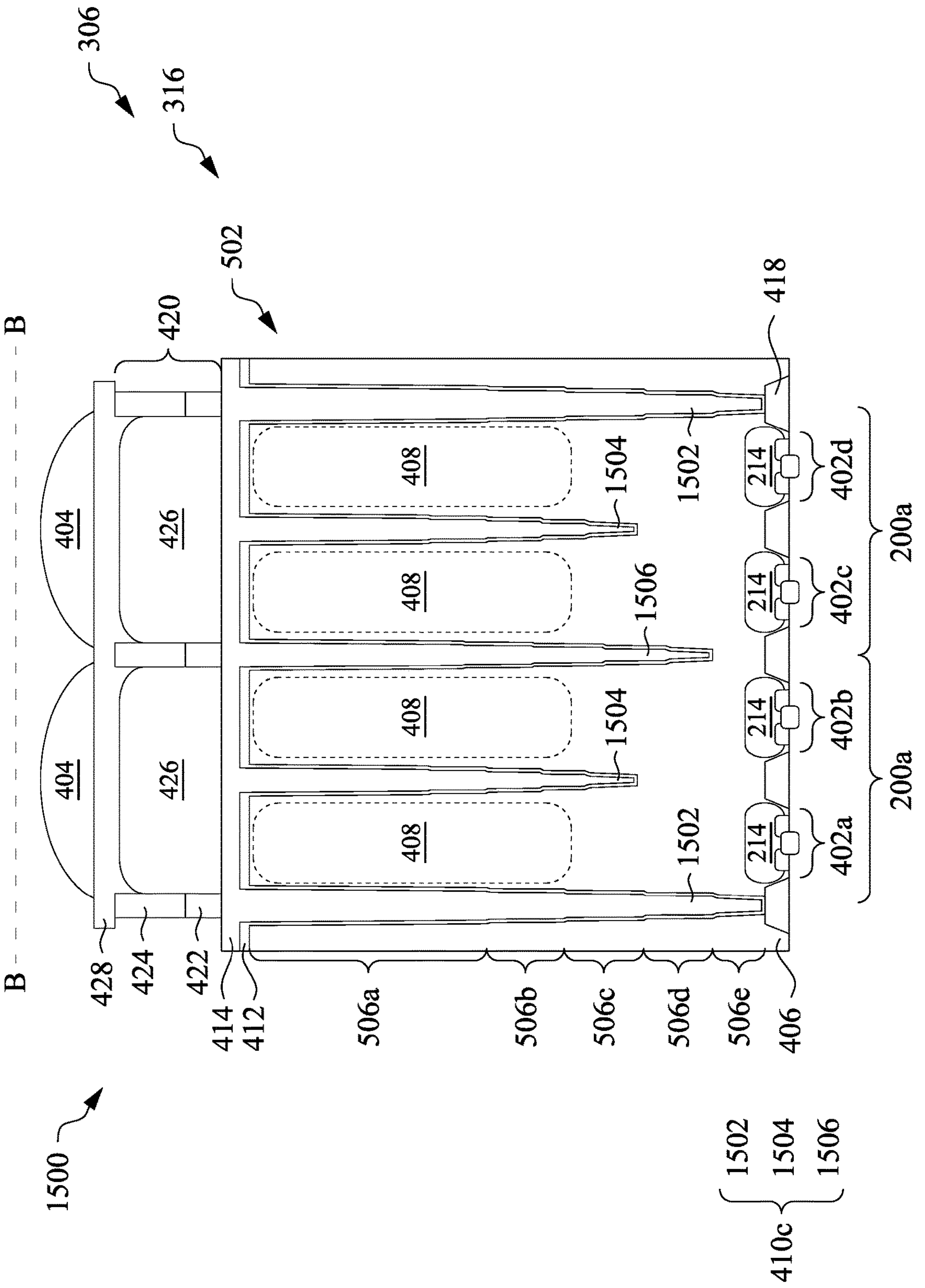

FIGS. 15A-15C are diagrams of example implementations 1500 of a pixel sensor array 316 described herein. The pixel sensor array 316 may be included in a sensor die 306, which may be included in an image sensor device 310. In the example implementations 1500, the DPW regions 416 are omitted from pixel sensor array 316, and pixel sensor array 316 includes DTI structures that have two or more DTI portions that extend to depths in the substrate 406. The different depths of the DTI portions enable photocurrents generated by the photodiodes 408 of a pixel sensor 200*a* to be combined into a unified photocurrent that may be used for autofocus operations for an image sensor device 310 that includes the sensor die 306. Moreover, the different depths of the DTI portions enable photocurrents generated by a plurality of pixel sensors 200*a* in the same QPD region 502 to be combined into a unified photocurrent for further autofocus time reduction and increased autofocus accuracy.

FIG. 15A illustrates a cross-section view along line B-B illustrated in FIG. 5A. FIG. 15A includes an example implementation 1500 in which the pixel sensor array 316 includes a DTI structure 410*a* similar to the DTI structure 410*a* illustrated in FIG. 5B, in which sidewalls of the DTI structure 410*a* taper such that a width of the DTI structure 410*a* continuously reduces in a uniform manner.

FIG. 15A includes an example configuration of the DTI structure 410*a* in which the DTI structure 410*a* includes three or more DTI portions that extend into the substrate 406 from the top surface (e.g., the first surface) of the substrate 406 to different depths in the substrate 406. For example, the DTI structure 410*a* may include DTI portions 1502 that extend into the substrate 406 to the depth D1, may include DTI portions 1504 that extend into the substrate 406 to the depth D2, where the depth D1 is greater relative to the depth D2. Moreover, the DTI structure 410 may include DTI portions 1506 that extend into the substrate 406 to a depth D3 that is greater relative to the depth D2 and lesser relative to the depth D1.

The DTI portions 1502 may extend along an outer parameter of the QPD region 502 and may define a border between the QPD region 502 and adjacent QPD regions 502. The DTI portions 1504 may extend between photodiodes 408 within pixel sensors 200*a* of the QPD region 502. The DTI portions 1506 may extend between pixel sensors 200*a* in the same QPD region 502.

The depth D1 may be selected such that the DTI portions 1502 extend from the top surface (e.g., the first surface) of the substrate 406 to the STI regions 418 at the bottom surface (e.g., the second surface) of the substrate 406. The depth D2 may be selected such that the DTI portions 1504 extend from the top surface (e.g., the first surface) of the substrate 406 into a portion of the substrate 406 such that the substrate 406 separates the DTI portions 1504 from the STI regions 418 at the bottom surface (e.g., the second surface) of the substrate 406. In other words, the DTI portions 1504 do not extend to any STI regions 418 at the bottom surface (e.g., the second surface) of the substrate 406. The depth D3 may be selected such that the DTI portions 1506 extend from the top surface (e.g., the first surface) of the substrate 406 into a portion of the substrate 406 such that the substrate 406 separates the DTI portions 1506 from the STI regions 418 at the bottom surface (e.g., the second surface) of the substrate 406. In other words, the DTI portions 1506 do not extend to any STI regions 418 at the bottom surface (e.g., the second surface) of the substrate 406.

The gap in the substrate 406 between the bottom of a DTI portion 1504 in a pixel sensor 200*a* enables photocurrents generated by the photodiodes 408 of the pixel sensor 200*a* to be binned and combined into a unified photocurrent that is transferred by the transfer transistors 214 of the pixel sensor 200*a*. Moreover, the gap in the substrate 406 between the bottom of a DTI portion 1506 between pixel sensors 200*a* in the same QPD region 502 enables photocurrents generated by the pixel sensors 200*a* in the same QPD region 502 to be binned and combined into a unified photocurrent that is transferred by the transfer transistors 214 of the pixel sensors 200*a* in the same QPD region 502.

In some implementations, the depth D1 is included in a range of approximately 0.5 microns to approximately 10 microns so that a sufficient amount of photon absorption can occur in the photodiodes 408 while providing sufficient electrical isolation and/or optical isolation between adjacent pixel sensors 200*a*. However, other values for the range are within the scope of the present disclosure. In some implementations, the depth D3 is included in a range of approximately 82% to approximately 98% of the depth D1 to reduce the likelihood of uncontrollable implant diffusion while providing sufficient photo-electron overflow between photodiodes 408 in a pixel sensor 200*a*. However, other values for the range are within the scope of the present disclosure. In some implementations, the depth D2 is included in a range of approximately 62% of the depth D1 to approximately 78% of the depth D1 to reduce the likelihood of uncontrollable implant diffusion while providing sufficient photo-electron overflow between photodiodes 408 in a pixel sensor 200*a*. However, other values for the range are within the scope of the present disclosure. In some implementations, the depth D2 is included in a range of approximately 72% of the depth D3 to approximately 88% of the depth D3 to reduce the likelihood of uncontrollable implant diffusion while providing sufficient photo-electron overflow between photodiodes 408 in a pixel sensor 200*a*. However, other values for the range are within the scope of the present disclosure.

In some implementations, a width W1 of a DTI portion 1502, at a top of the DTI portion 1502, is included in a range of approximately 80 nanometers to approximately 200 nanometers so that a sufficient amount of photon absorption can occur in the photodiodes 408 while providing sufficient electrical isolation and/or optical isolation between adjacent pixel sensors 200*a*. However, other values for the range are within the scope of the present disclosure. In some implementations, a width W3 of a DTI portion 1506, at a top of the DTI portion 1506, is included in a range of approximately 82% of the width W1 to approximately 98% of the width W1 to reduce light scattering in the pixel sensor array 316 while achieving a sufficient high yield of pixel sensors 200*a* in the pixel sensor array 316. However, other values for the range are within the scope of the present disclosure. In some implementations, a width W2 of a DTI portion 1504, at a top of the DTI portion 1504, is included in a range of approximately 62% of the width W1 to approximately 78% of the width W1 to reduce light scattering in the pixel sensor array 316 while achieving a sufficient high yield of pixel sensors 200*a* in the pixel sensor array 316. However, other values for the range are within the scope of the present disclosure. In some implementations, a width W2 of a DTI portion 1504, at a top of the DTI portion 1504, is included in a range of approximately 72% of the width W3 to approximately 88% of the width W3 to reduce light scattering in the pixel sensor array 316 while achieving a sufficient high yield of pixel sensors 200*a* in the pixel sensor array 316. However, other values for the range are within the scope of the present disclosure.

FIG. 15B illustrates a cross-section view along line B-B illustrated in FIG. 5A. FIG. 15B includes an example implementation 1500 in which the pixel sensor array 316 includes a DTI structure 410*b* similar to the DTI structure 410*b* illustrated in FIG. 5C, in which the DTI structure 410*b* includes a cross-sectional profile that approximately resembles a bowling pin. In particular, DTI portions 1502, 1504, and/or 1506 of the DTI structure 410*b* may include a flared section 504*a* and a tapered section 504*b*. The DPW regions 416 are omitted, and the DTI portions 1502 extend to the STI regions 418 at the bottom surface (e.g., the second surface) of the substrate 406. The DTI portions 1504 extend into the substrate 406 and do not extend to the STI regions 418 such that gaps in the substrate 406 between the DTI portions 1504 and the STI regions 418 enable photo-electron overflow between the photodiodes 408 of a pixel sensor 200*a*. The DTI portions 1506 extend into the substrate 406 and do not extend to the STI regions 418 such that gaps in the substrate 406 between the DTI portions 1506 and the STI regions 418 enable photo-electron overflow between the pixel sensors 200*a* in the same QPD region 502.

FIG. 15C illustrates a cross-section view along line B-B illustrated in FIG. 5A. FIG. 15C includes an example implementation 1500 in which the pixel sensor array 316 includes a DTI structure 410*c* similar to the DTI structure 410*c* illustrated in FIG. 5D, in which the DTI structure 410*c* includes a stepped cross-sectional profile. In particular, the DTI portions 1502, 1504, and/or 1506 may include a plurality of stepped sections 506*a*-506*e*. The DPW regions 416 are omitted, and the DTI portions 1502 extend to the STI regions 418 at the bottom surface (e.g., the second surface) of the substrate 406. The DTI portions 1504 extend into the substrate 406 and do not extend to the STI regions 418 such that gaps in the substrate 406 between the DTI portions 1504 and the STI regions 418 enable photo-electron overflow between the photodiodes 408 of a pixel sensor 200*a*. The DTI portions 1506 extend into the substrate 406 and do not extend to the STI regions 418 such that gaps in the substrate 406 between the DTI portions 1506 and the STI regions 418 enable photo-electron overflow between the pixel sensors 200*a* in the same QPD region 502.

As indicated above, FIGS. 15A-15C are provided as examples. Other examples may differ from what is described with regard to FIGS. 15A-15C.

Figure 16A:
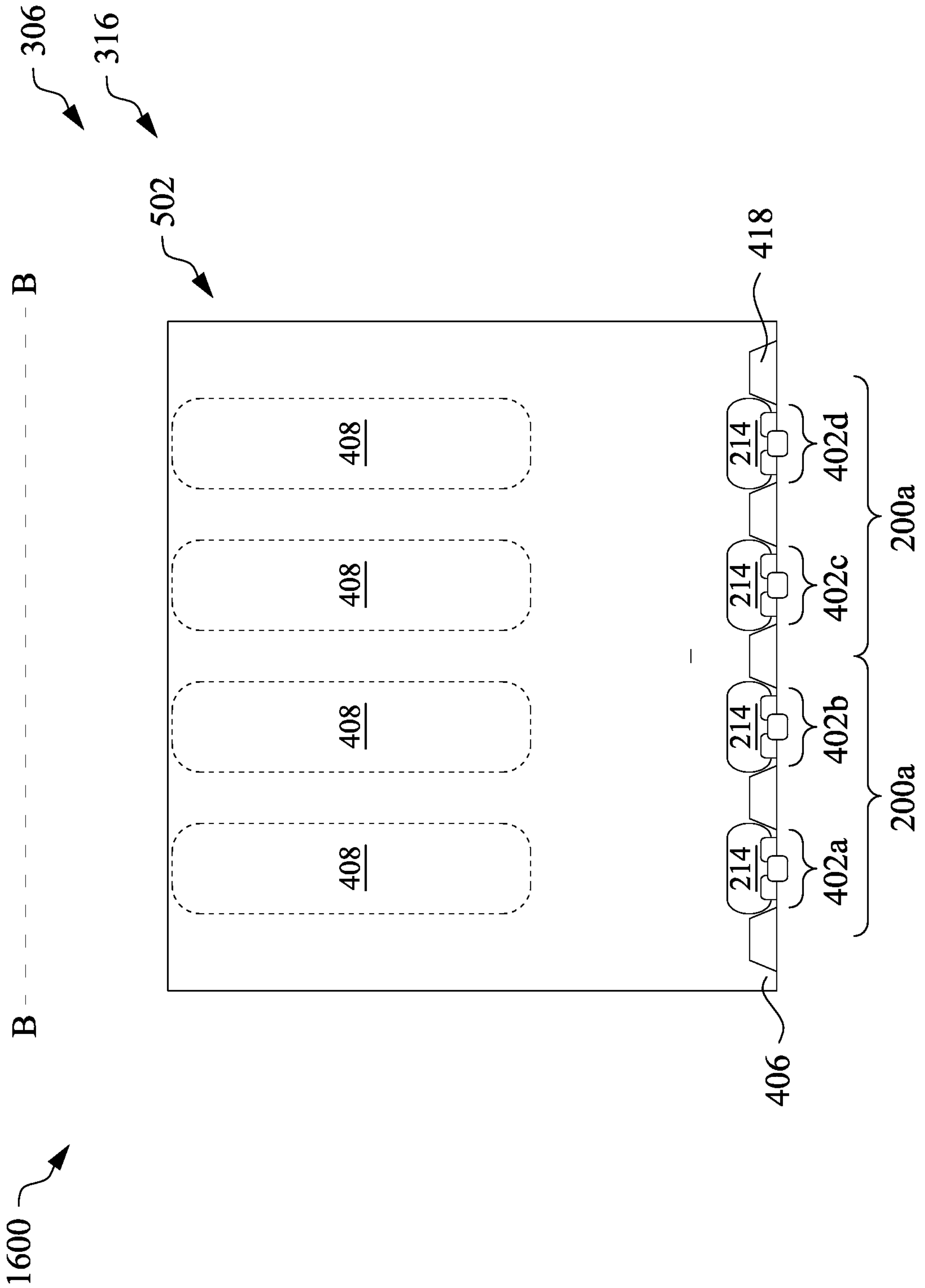
FIGS. 16A-16C are diagrams of an example implementation of forming trenches described herein.
Figure 16B:
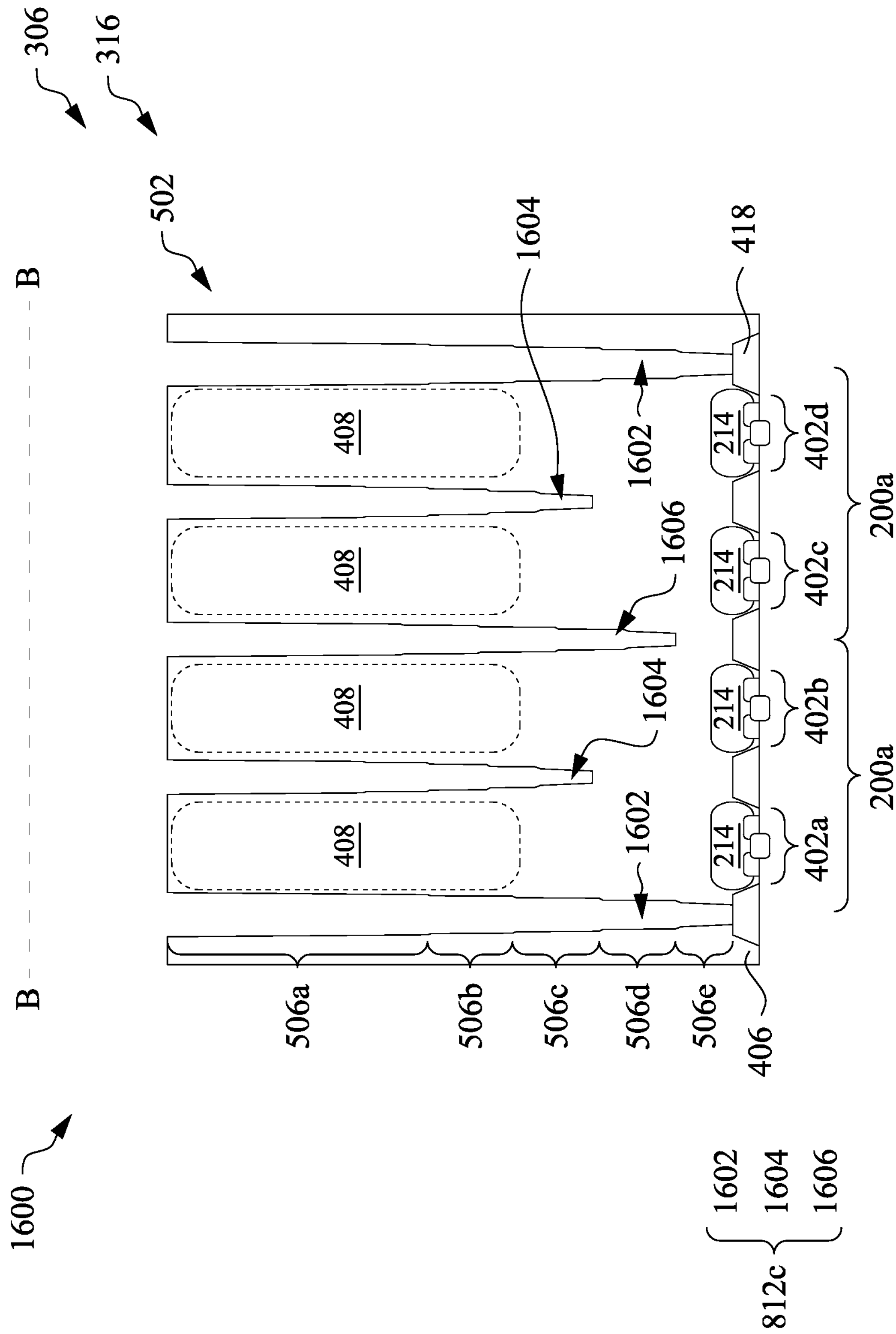
Figure 16C:
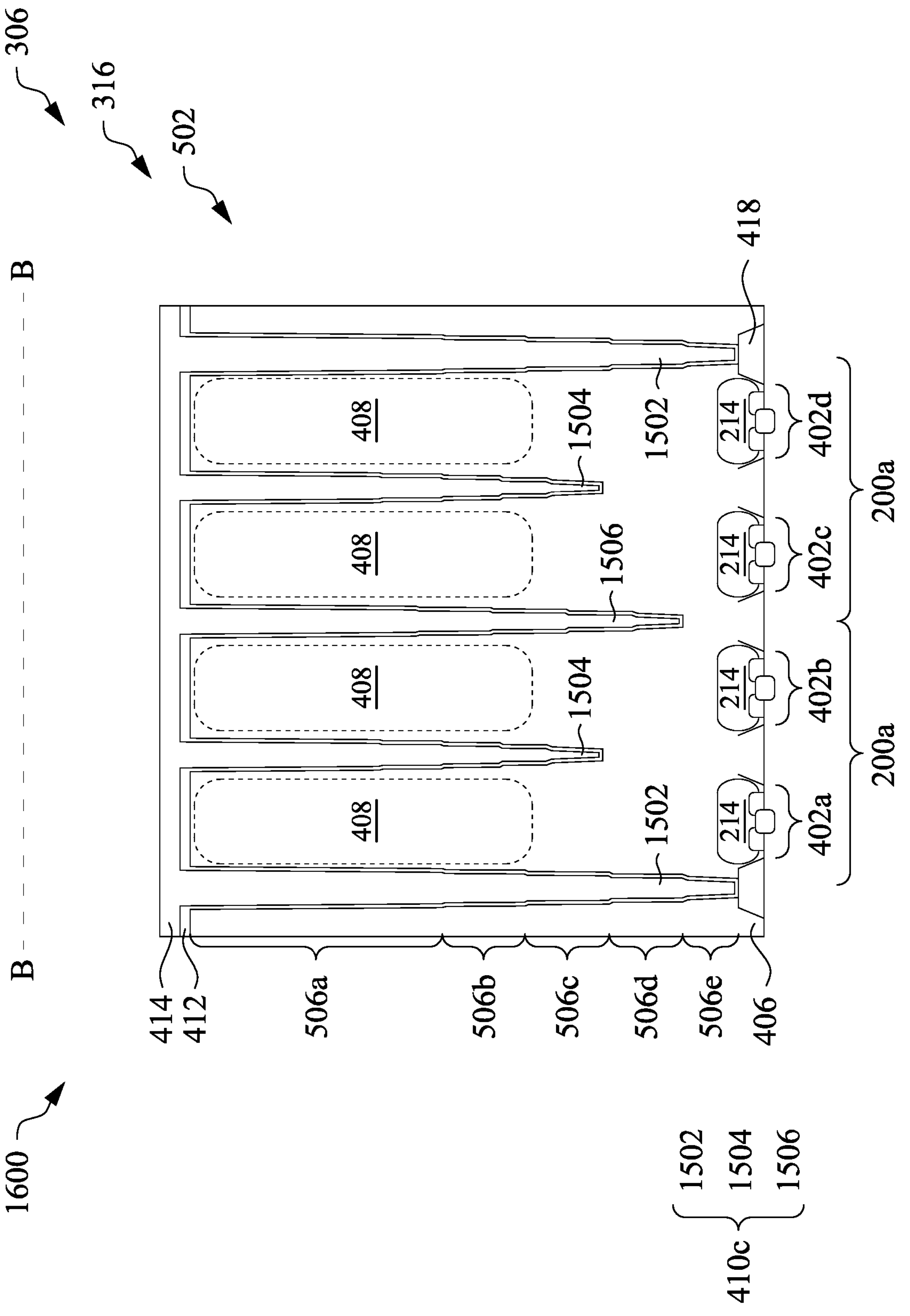

FIGS. 16A-16C are diagrams of an example implementation 1600 of forming trenches described herein. As shown in FIGS. 16A-16C, the example implementation 1600 includes an example of forming trenches 812*c* in a substrate 406 of a sensor die 306 included in an image sensor device 310. The trenches 812*c* may be used to form a DTI structure 410*c* in a pixel sensor array 316 of the sensor die 306, where the DTI structure 410*c* includes a stepped cross-sectional profile having a plurality of stepped sections. In particular, the trenches 812*c* may be used to form a DTI structure 410*c* that includes DTI portions 1502-1506 having different depths in the pixel sensor array 316, as illustrated in FIG. 15C. However, the techniques described in connection with FIGS. 16A-16C may be used to form trenches 812*a* for forming the DTI structure 410*a* of FIG. 15A and/or to form trenches 812*b* for forming the DTI structure 410*b* of FIG. 15B, among other examples.

As shown in FIG. 16A, one or more of the operations described in connection with FIGS. 16A-16C may be performed after one or more operations described in connection with FIGS. 6A-6D and/or FIG. 7 (e.g., after bonding of the sensor wafer 302 and the circuitry wafer 304 to form the image sensor device 310). In some implementations, one or more the semiconductor processing operations described in connection with FIGS. 16A-16C may be performed by one or more of the semiconductor processing tools 102-116. In some implementations, one or more the semiconductor processing operations described in connection with FIGS. 16A-16C may be performed by another semiconductor processing tool.

As shown in FIG. 16B, trenches 812*c* may be formed in the substrate 406 along sides of the photodiodes 408 of the subregions 402*a*-402*d* of the pixel sensors 200*a*. In some implementations, one or more etch-deposition-etch cycles 802 may be performed by one or more of the semiconductor processing tools 102-116 to form trench portions 1602, 1604, and 1606 of the trenches 812*c*. As further shown in FIG. 16B, the trench portions 1602 may extend from a top surface (e.g., a first surface) of the substrate 406 into the substrate 406 to STI regions 418 at a bottom surface (e.g., a second surface) of the substrate 406. The trench portions 1602 may extend along a perimeter of the QPD region 502.

The trench portions 1604 may extend from a top surface (e.g., a first surface) of the substrate 406 into the substrate 406 and do not extend to any STI regions 418. In this way, portions of the substrate 406 remain between the trench portions 1604 and the STI regions 418. The trench portions 1604 may extend in between photodiodes 408 of a pixel sensor 200*a*.

The trench portions 1606 may extend from a top surface (e.g., a first surface) of the substrate 406 into the substrate 406 and do not extend to any STI regions 418. In this way, portions of the substrate 406 remain between the trench portions 1606 and the STI regions 418. The trench portions 1606 may extend in between pixel sensors 200*a* of the same QPD region 502.

As shown in FIG. 16C, the trenches 812*c* may be filled in with one or more dielectric materials to form a DTI structure 410*c* that includes DTI portions 1502-1506. For example, the trenches 812*c* may be filled with a high-k dielectric liner 412 and an oxide layer 414, among other examples. In some implementations, the trenches 812*c* may be filled in with the one or more dielectric materials as described above in connection with FIG. 12A. Moreover, additional processing operations described in connection with FIGS. 12B-12F may be performed to manufacture the pixel sensor array 316 of the sensor die 306.

As indicated above, FIGS. 16A-16C are provided as an example. Other examples may differ from what is described with regard to FIGS. 16A-16C.

Figure 17:
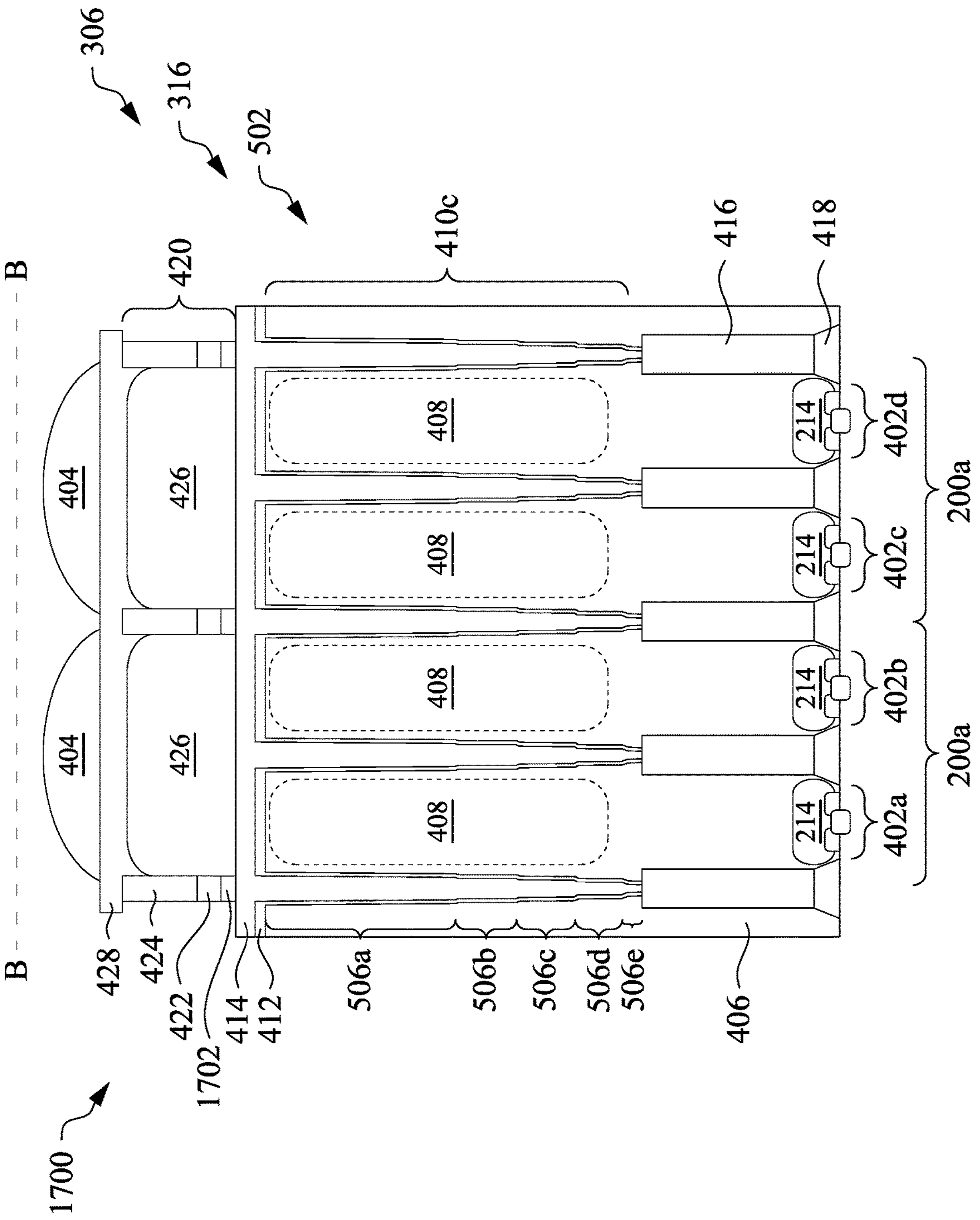
FIG. 17 is a diagram of an example implementation of a pixel sensor array described herein.

FIG. 17 is a diagram of an example implementation 1700 of a pixel sensor array 316 described herein. The pixel sensor array 316 may be included in a sensor die 306, which may be included in an image sensor device 310. The example implementation 1700 of the pixel sensor array 316 illustrated in FIG. 17 may be similar to the example implementation illustrated in FIG. 5D. For example, the pixel sensor array 316 in the example implementation 1700 may include an example configuration of a DTI structure 410*c* that may be included in the pixel sensors 200*a* of a QPD region 502, where the DTI structure 410*c* includes a stepped cross-sectional profile having a plurality of stepped sections 506*a*-506*e* that change in width in a stepped manner (e.g., in a non-linear and/or in a non-uniform manner).

However, the example implementation 1700 of the pixel sensor array 316 illustrated in FIG. 17 includes an additional ceramic layer 1702 in the grid structure 420. The ceramic layer 1702 may enable the height of the grid structure 420 to be increased to provide increased crosstalk mitigation, whereas the grid structure 420 in the example implementation illustrated in FIG. 5D may be less complex to manufacture. The ceramic layer 1702 may be included under the metal layer 422 or in another location in the grid structure 420. The ceramic layer 1702 may include titanium nitride (TiN) and/or another suitable ceramic material.

In some implementations, a thickness of the ceramic layer 1702 may be included in a range of approximately 270 angstroms to approximately 330 angstroms. However, other values for the range are within the scope of the present disclosure. In some implementations, a thickness of the metal layer 422 may be included in a range of approximately 1800 angstroms to approximately 2200 angstroms. However, other values for the range are within the scope of the present disclosure. In some implementations, a thickness of the dielectric layer 424 may be included in a range of approximately 3000 angstroms to approximately 4000 angstroms. However, other values for the range are within the scope of the present disclosure.

While the ceramic layer 1702 is illustrated as being included in the example implementation 1700 of the pixel sensor array 316, the ceramic layer 1702 may be included in a grid structure 420 of any other example implementation of the pixel sensor array 316 illustrated and/or described herein.

As indicated above, FIG. 17 is as an example. Other examples may differ from what is described with regard to FIGS. 17.

FIGS. 18A-18D are diagrams of an example implementation 1800 of the pixel sensor array 316 described herein. The pixel sensor array 316 may be included on the sensor die 306 of the image sensor device 310. The example implementation 1800 includes an alternative implementation of the pixel sensor array 316 to the example implementation 500 of FIG. 5A. The configurations of pixel sensors 200*a* in the example implementation 1800 is similar to the configurations of pixel sensors 200*a* in the example implementation 500, except that the micro lenses 404 in the example implementation 1800 are offset (or off-centered) relative to the other structures of the pixel sensors 200*a*. The offset micro lenses 404 enable the pixel sensor array 316 to be used in implementations in which incident light is directed toward the pixel sensors 200*a* at an angle (e.g., the incident light is received off-axis) in a manner that increases photon absorption, QE, and/or FWC for the pixel sensors 200*a*.

Figure 18A:
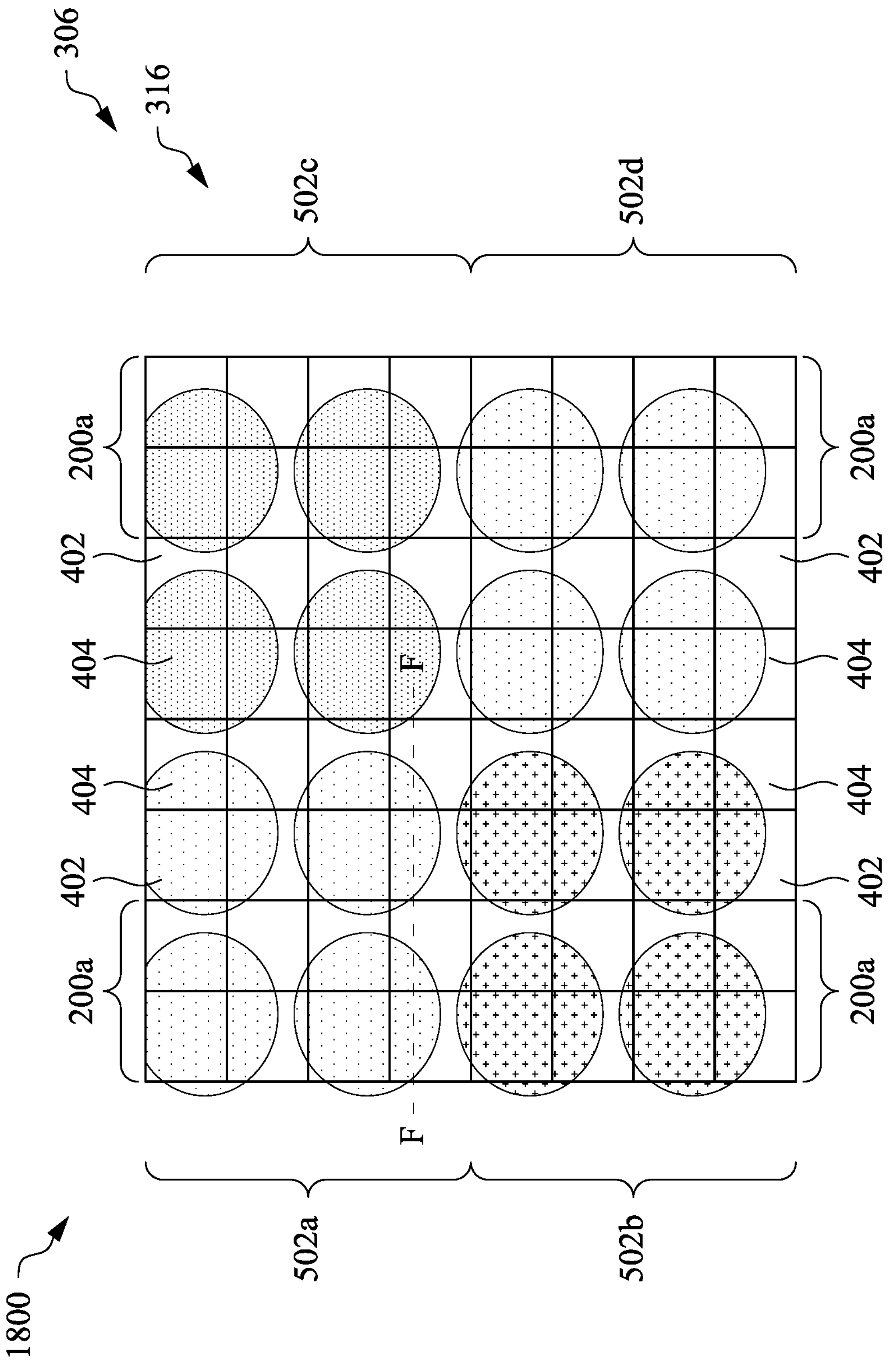
FIGS. 18A-18D are diagrams of an example implementation of the pixel sensor array described herein.

FIG. 18A illustrates a top-down view of the example implementation 1800 of the pixel sensor array 316. As shown in FIG. 18A, the QPD regions 502*a*-502*d* may be arranged in a grid configuration. Similarly, the pixel sensors 200*a* in each QPD region may be arranged in a grid configuration (e.g., a 2×2 grid on the sensor die 306, as shown in FIG. 18A, or another grid configuration), and the subregions 402 of each pixel sensor 200*a* may be arranged in a grid configuration.

Each of the pixel sensors 200*a* in a particular QPD region may be configured to absorb photons of light in a particular wavelength range of visible light (e.g., red light, blue light, or green light). For example, the pixel sensors 200*a* in the QPD region 502*a* may be configured to absorb photons of light in a particular wavelength range of visible light corresponding to green light, the pixel sensors 200*a* in the QPD region 502*b* may be configured to absorb photons of light in a particular wavelength range of visible light corresponding to blue light, the pixel sensors 200*a* in the QPD region 502*c* may be configured to absorb photons of light in a particular wavelength range of visible light corresponding to red light, and so on.

Each of the QPD regions 502*a*-502*d* may be configured for quadradic photodetection to support and enable autofocus operations for the image sensor device 310. Each of the QPD regions 502*a*-502*d* may include 4 pixel sensors 200*a*, for a total of 16 pixel sensors 200*a*. The pixel sensor array 316 may include one or more of the 16-cell QPD regions illustrated in FIG. 18A. However, other quantities of pixel sensors 200*a* in a QPD region 502 are within the scope of the present disclosure. A pixel sensor 200*a* in the 16-cell QPD region may include a plurality of subregions 402 and a micro lens (e.g., a single micro lens) 404 over the plurality of subregions 402. Each subregion 402 of a pixel sensor 200*a* may include a photodiode that is configured to generate a photocurrent based on photon absorption in the photodiode. The photocurrents generated by the photodiodes in the subregions 402 of a pixel sensor 200*a* may be binned such that a single unified photocurrent is provided from the pixel sensor 200*a* to the circuitry on the circuitry die 308 for performing autofocus for the image sensor device 310.

As further shown in FIG. 18A, the micro lenses 404 may be offset (or off-centered) relative to the pixel sensors 200*a*. The offset micro lenses 404 enable the pixel sensor array 316 to be used in implementations in which incident light is directed toward the pixel sensors 200*a* at an angle (e.g., the incident light is received off-axis) in a manner that increases photon absorption, QE, and/or FWC for the pixel sensors 200*a*.

Figure 18B:
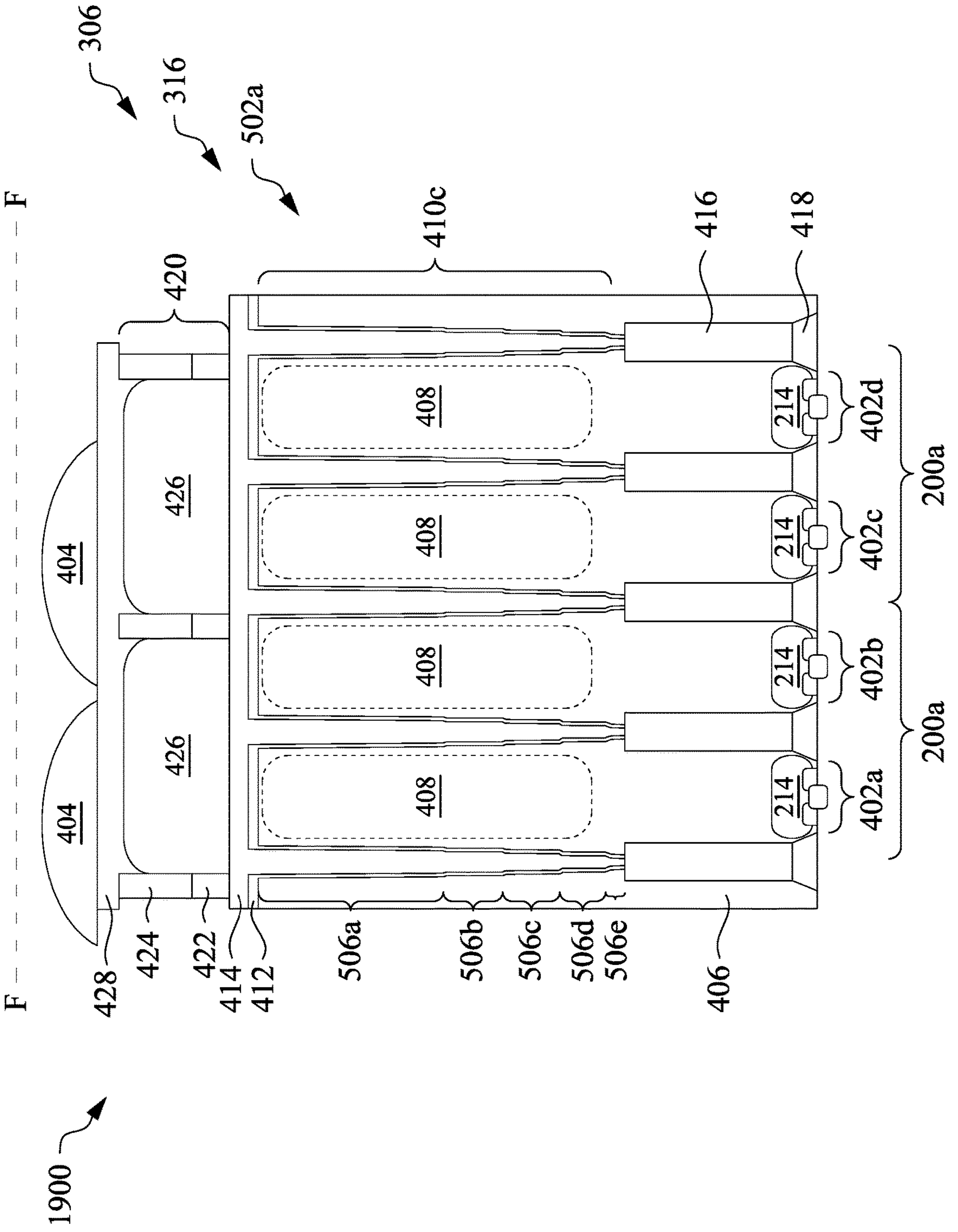
Figure 18C:
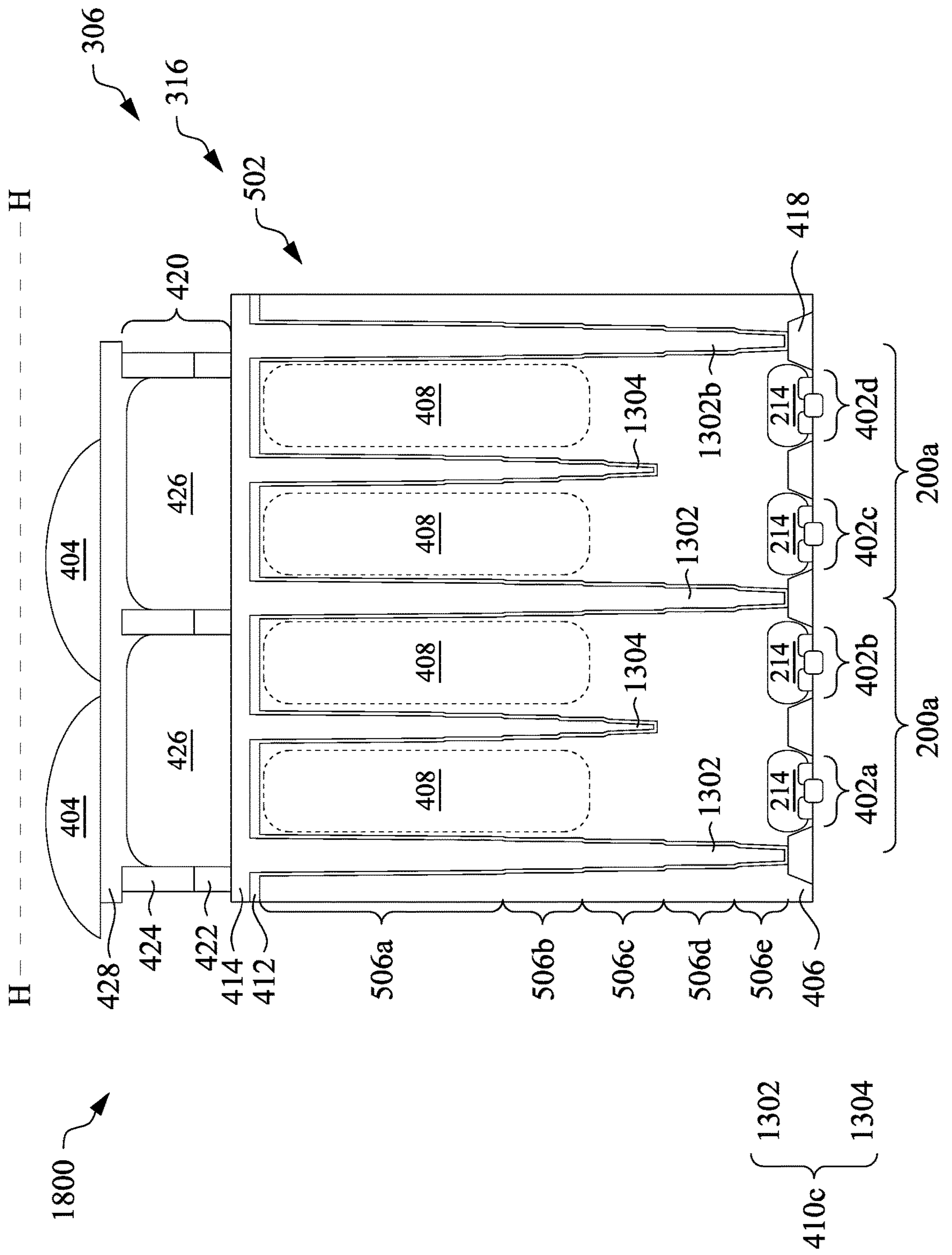
Figure 18D:
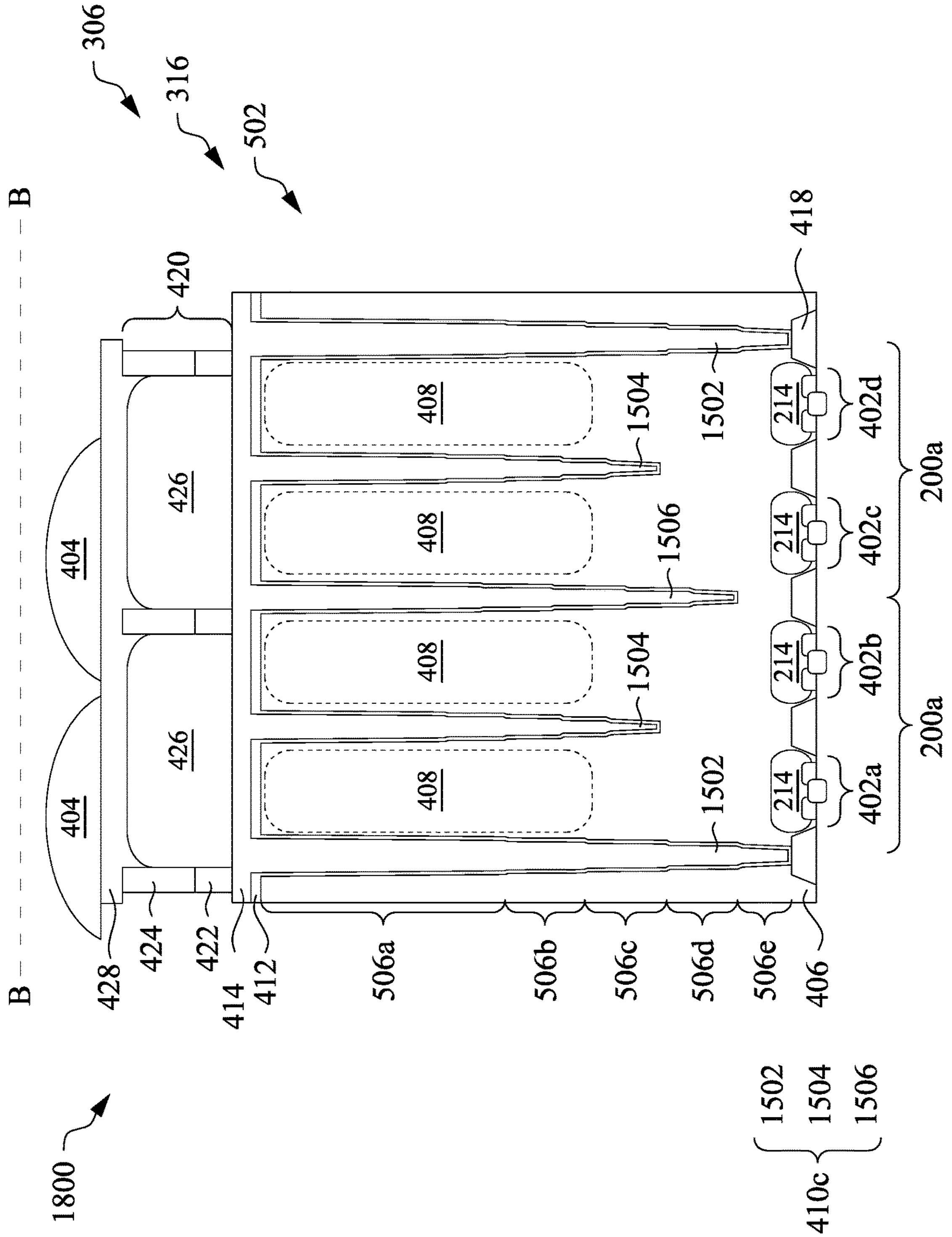

FIGS. 18B-18D illustrate cross-section views along line F-F illustrated in FIG. 18A. As shown in FIGS. 18B-18D, the offset micro lenses 404 may be included in the pixel sensor array 316 along with one or more implementations of a DTI structure 410*c* described herein. As further shown in FIGS. 18B-18D, the grid structure 420 may additionally and/or alternatively offset relative to the pixel sensors 200*a*. For example, and as shown in FIG. 18B, the offset micro lenses 404 and/or the offset grid structure 420 may be included in the pixel sensor array 316 along with an implementation of the DTI structure 410*c* illustrated in FIG. 5D. As another example, and as shown in FIG. 18C, the offset micro lenses 404 and/or the offset grid structure 420 may be included in the pixel sensor array 316 along with an implementation of the DTI structure 410*c* illustrated in FIG. 13C. As another example, and as shown in FIG. 18D, the offset micro lenses 404 and/or the offset grid structure 420 may be included in the pixel sensor array 316 along with an implementation of the DTI structure 410*c* illustrated in FIG. 15C.

Additionally and/or alternatively, the offset micro lenses 404 and/or the offset grid structure 420 may be included in the pixel sensor array 316 along with one or more implementations of a DTI structure 410*a* illustrated in FIGS. 5B, 13A, and/or 15A, among other examples. Additionally and/or alternatively, the offset micro lenses 404 and/or the offset grid structure 420 may be included in the pixel sensor array 316 along with one or more implementations of a DTI structure 410*b* illustrated in FIGS. 5C, 13B, and/or 15B, among other examples.

As indicated above, FIGS. 18A-18D are provided as examples. Other examples may differ from what is described with regard to FIGS. 18A-18D.

Figure 19A:
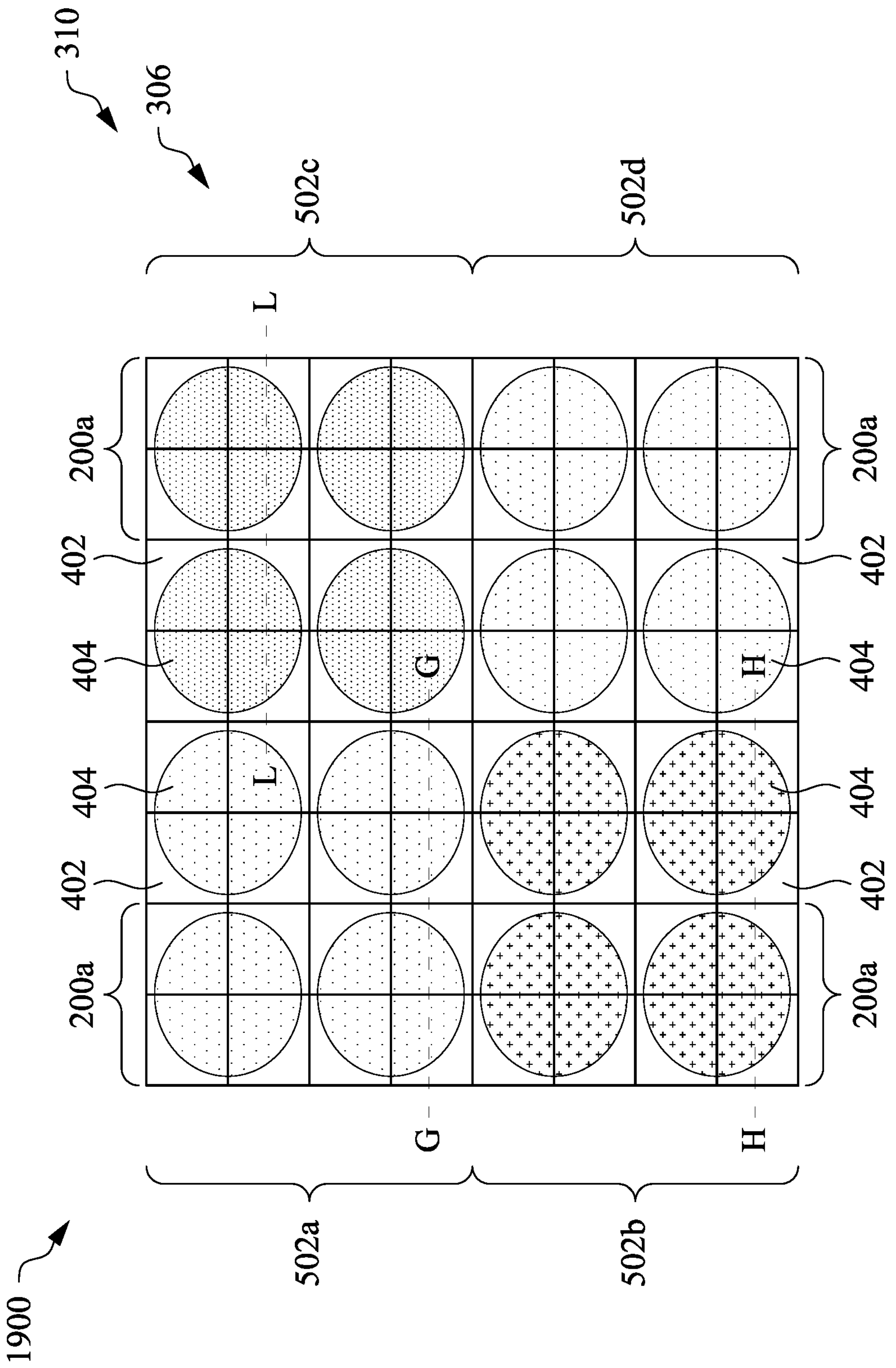
FIGS. 19A-19D are diagrams of an example implementation of the pixel sensor array described herein.
Figure 19B:
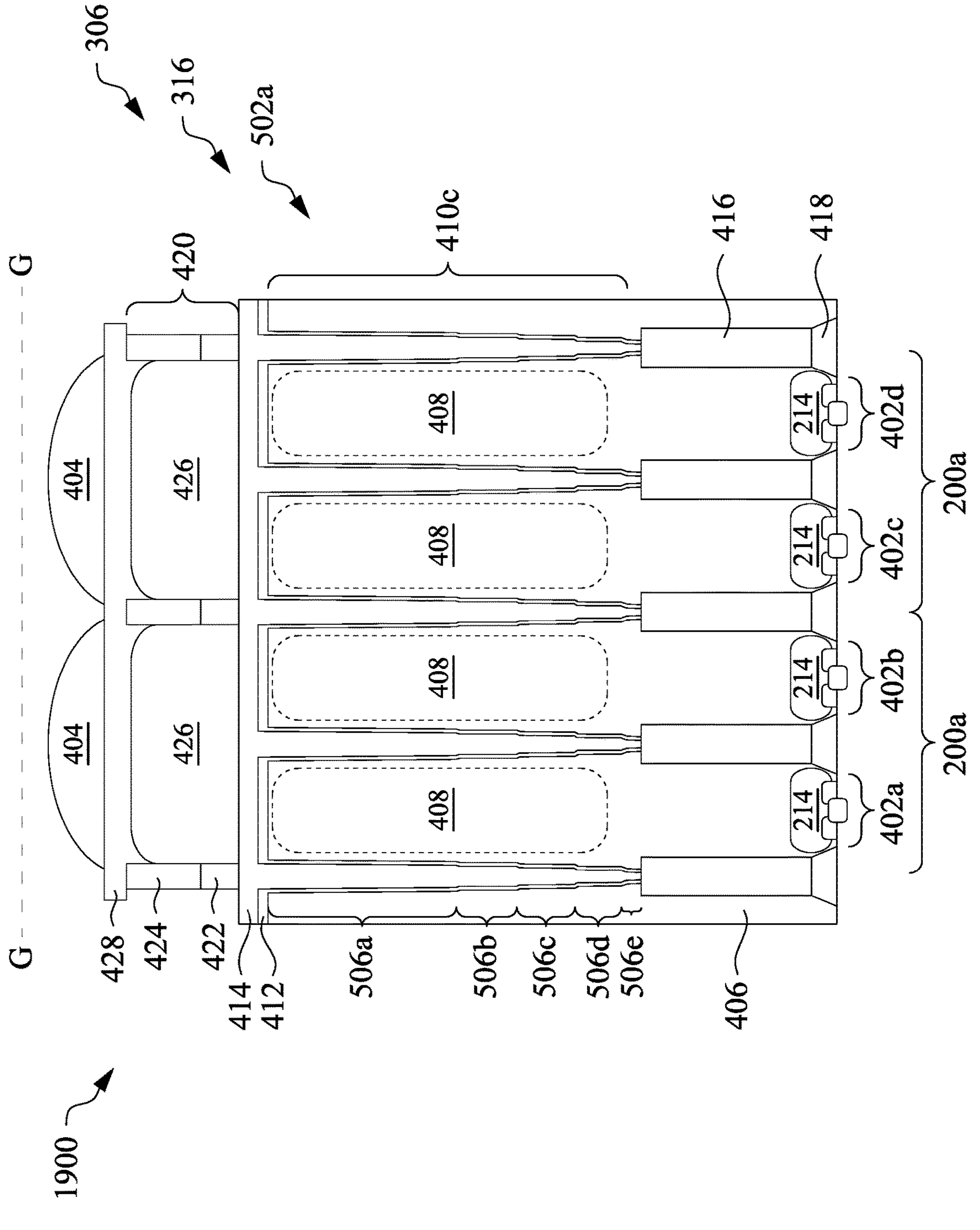
Figure 19C:
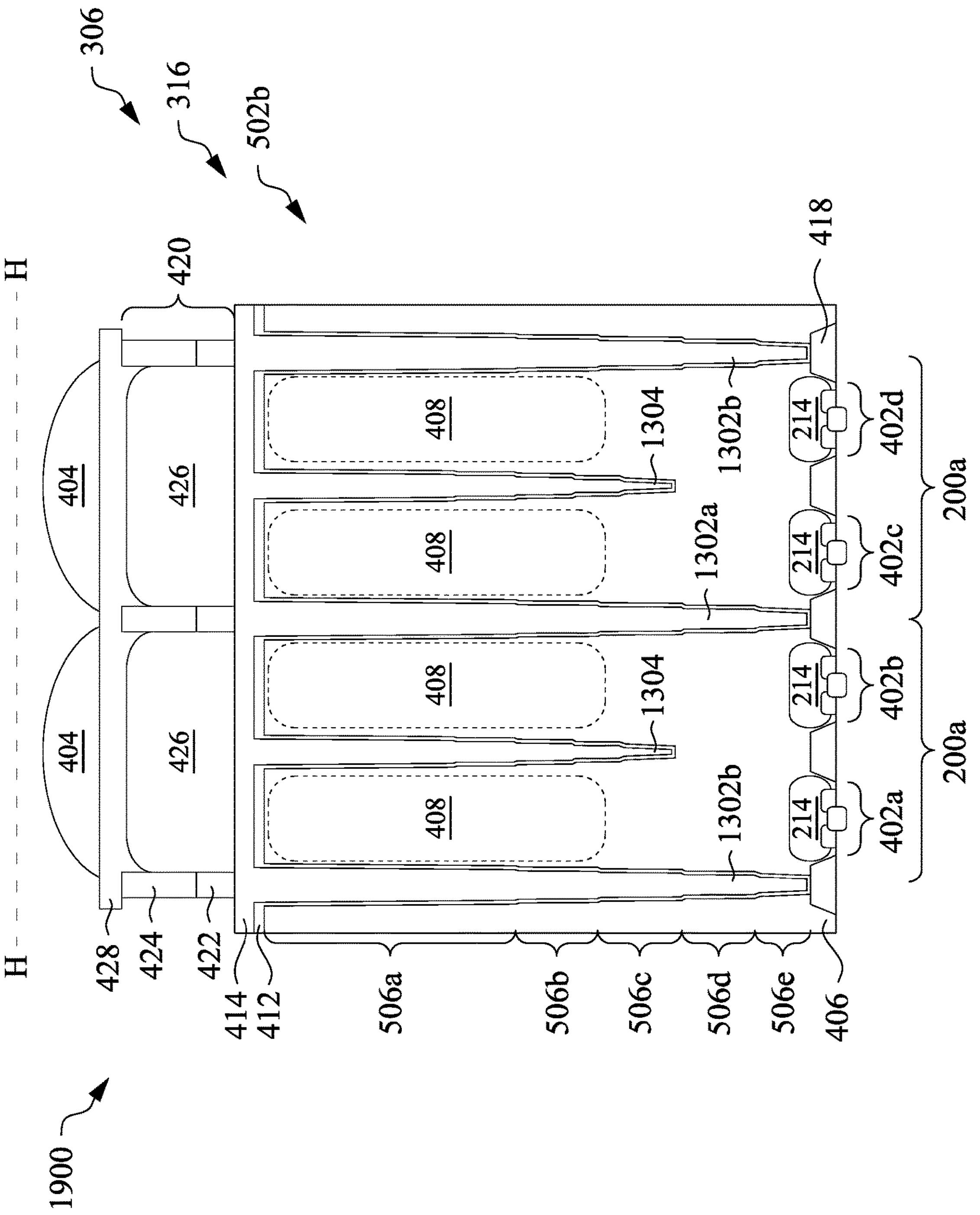
Figure 19D:
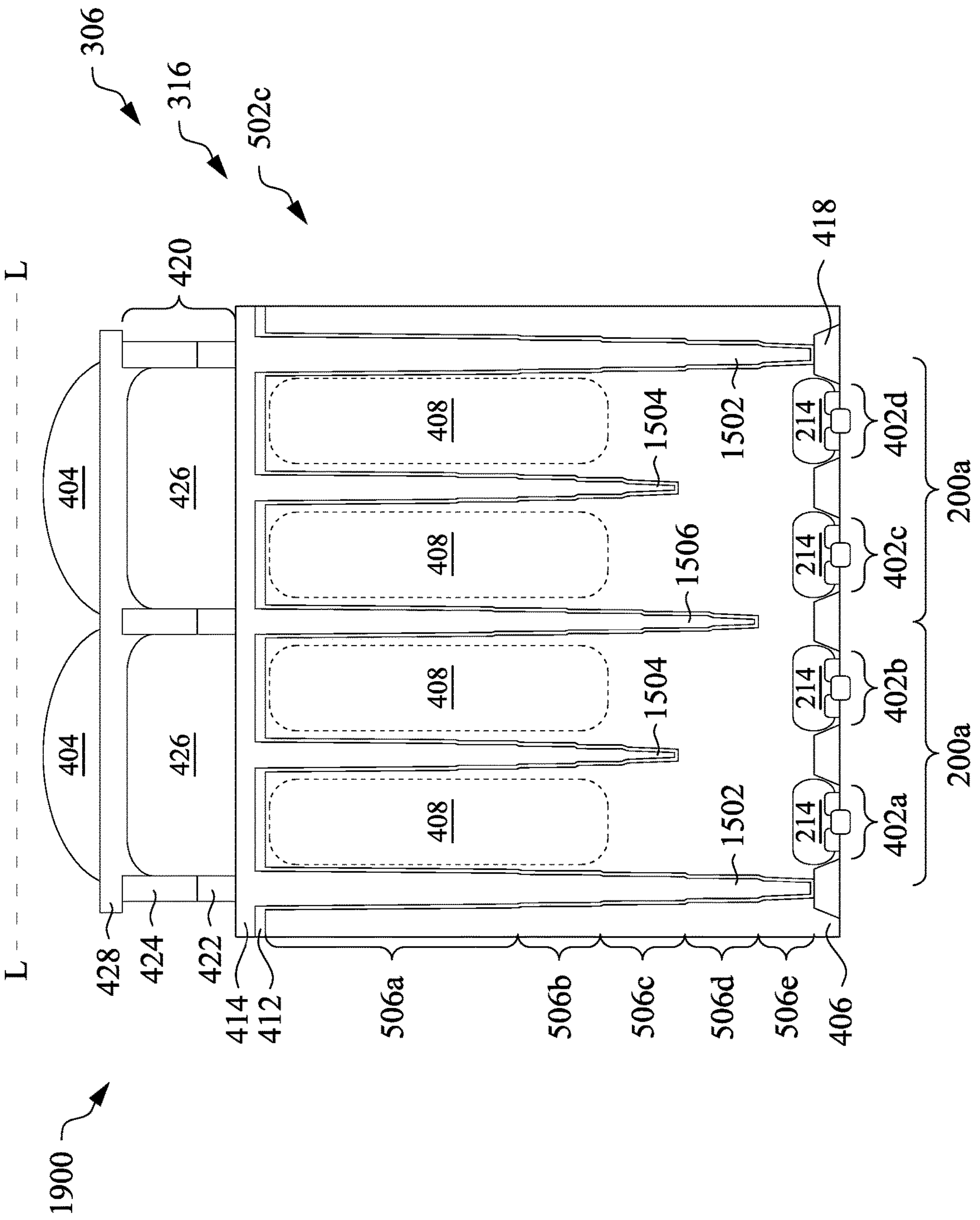

FIGS. 19A-19D are diagrams of an example implementation 1900 of the pixel sensor array 316 described herein. The pixel sensor array 316 may be included on the sensor die 306 of the image sensor device 310. As shown in FIG. 19A, the example implementation 1900 includes an alternative implementation of the pixel sensor array 316 to the example implementation 500 of FIG. 5A. As shown in FIGS. 19B-19D, the pixel sensor array 316 may include two or more QPD regions 502 that include different DTI structure configurations described herein. This enables tuning of optical and electrical performance of the image sensor device 310. For example, the different combinations of DTI structure configurations in the pixel sensor array 316 may enable tuning of the QE of the image sensor device 310, may enable tuning of the FWC of the image sensor device 310, and/or may enable tuning of another parameter of the image sensor device 310, among other examples.

FIG. 19B illustrates a cross-section view along line G-G in FIG. 19A. As shown in FIG. 19B, the QPD region 502*a* may include a DTI structure 410*c* having a configuration illustrated in FIG. 5D. FIG. 19C illustrates a cross-section view along line H-H in FIG. 19A. As shown in FIG. 19C, the QPD region 502*b* may include a DTI structure 410*c* having a configuration illustrated in FIG. 13C. FIG. 19C illustrates a cross-section view along line L-L in FIG. 19A. As shown in FIG. 19D, the QPD region 502*c* may include a DTI structure 410*c* having a configuration illustrated in FIG. 15C.

As indicated above, FIGS. 19A-19D are provided as examples. Other examples may differ from what is described with regard to FIGS. 19A-19D. In particular, any combination of example implementations of DTI structures 410*a*-410*c* described herein may be combined in the pixel sensor array 316.

Figure 20:
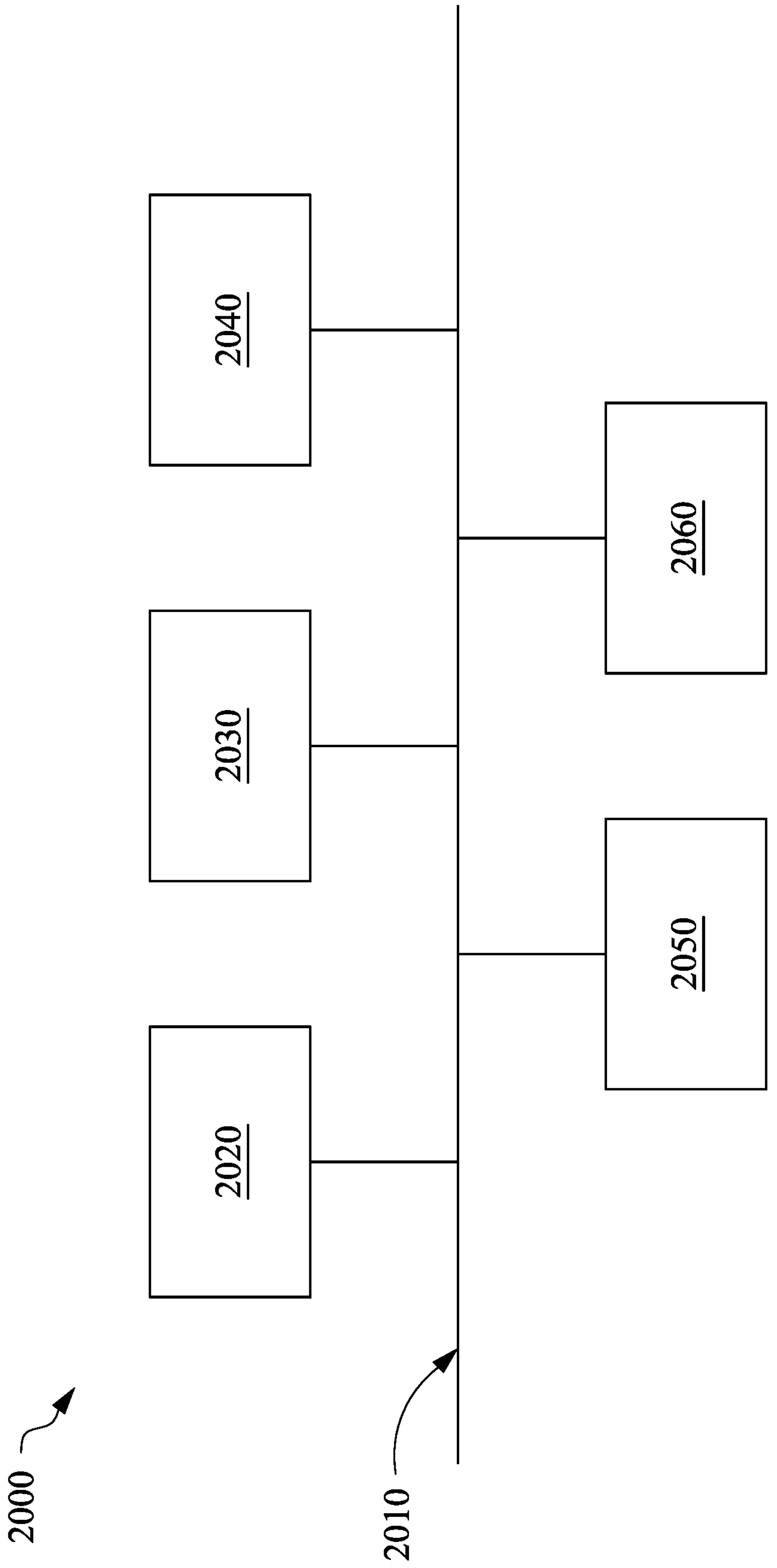
FIG. 20 is a diagram of example components of a device described herein.

FIG. 20 is a diagram of example components of a device 2000 described herein. In some implementations, one or more of the semiconductor processing tools 102-116 and/or the wafer/die transport tool 118 may include one or more devices 2000 and/or one or more components of the device 2000. As shown in FIG. 20, the device 2000 may include a bus 2010, a processor 2020, a memory 2030, an input component 2040, an output component 2050, and/or a communication component 2060.

The bus 2010 may include one or more components that enable wired and/or wireless communication among the components of the device 2000. The bus 2010 may couple together two or more components of FIG. 20, such as via operative coupling, communicative coupling, electronic coupling, and/or electric coupling. For example, the bus 2010 may include an electrical connection (e.g., a wire, a trace, and/or a lead) and/or a wireless bus. The processor 2020 may include a central processing unit, a graphics processing unit, a microprocessor, a controller, a microcontroller, a digital signal processor, a field-programmable gate array, an application-specific integrated circuit, and/or another type of processing component. The processor 2020 may be implemented in hardware, firmware, or a combination of hardware and software. In some implementations, the processor 2020 may include one or more processors capable of being programmed to perform one or more operations or processes described elsewhere herein.

The memory 2030 may include volatile and/or nonvolatile memory. For example, the memory 2030 may include random access memory (RAM), read only memory (ROM), a hard disk drive, and/or another type of memory (e.g., a flash memory, a magnetic memory, and/or an optical memory). The memory 2030 may include internal memory (e.g., RAM, ROM, or a hard disk drive) and/or removable memory (e.g., removable via a universal serial bus connection). The memory 2030 may be a non-transitory computer-readable medium. The memory 2030 may store information, one or more instructions, and/or software (e.g., one or more software applications) related to the operation of the device 2000. In some implementations, the memory 2030 may include one or more memories that are coupled (e.g., communicatively coupled) to one or more processors (e.g., processor 2020), such as via the bus 2010. Communicative coupling between a processor 2020 and a memory 2030 may enable the processor 2020 to read and/or process information stored in the memory 2030 and/or to store information in the memory 2030.

The input component 2040 may enable the device 2000 to receive input, such as user input and/or sensed input. For example, the input component 2040 may include a touch screen, a keyboard, a keypad, a mouse, a button, a microphone, a switch, a sensor, a global positioning system sensor, an accelerometer, a gyroscope, and/or an actuator. The output component 2050 may enable the device 2000 to provide output, such as via a display, a speaker, and/or a light-emitting diode. The communication component 2060 may enable the device 2000 to communicate with other devices via a wired connection and/or a wireless connection. For example, the communication component 2060 may include a receiver, a transmitter, a transceiver, a modem, a network interface card, and/or an antenna.

The device 2000 may perform one or more operations or processes described herein. For example, a non-transitory computer-readable medium (e.g., memory 2030) may store a set of instructions (e.g., one or more instructions or code) for execution by the processor 2020. The processor 2020 may execute the set of instructions to perform one or more operations or processes described herein. In some implementations, execution of the set of instructions, by one or more processors 2020, causes the one or more processors 2020 and/or the device 2000 to perform one or more operations or processes described herein. In some implementations, hardwired circuitry may be used instead of or in combination with the instructions to perform one or more operations or processes described herein. Additionally, or alternatively, the processor 2020 may be configured to perform one or more operations or processes described herein. Thus, implementations described herein are not limited to any specific combination of hardware circuitry and software.

The number and arrangement of components shown in FIG. 20 are provided as an example. The device 2000 may include additional components, fewer components, different components, or differently arranged components than those shown in FIG. 20. Additionally, or alternatively, a set of components (e.g., one or more components) of the device 2000 may perform one or more functions described as being performed by another set of components of the device 2000.

Figure 21:
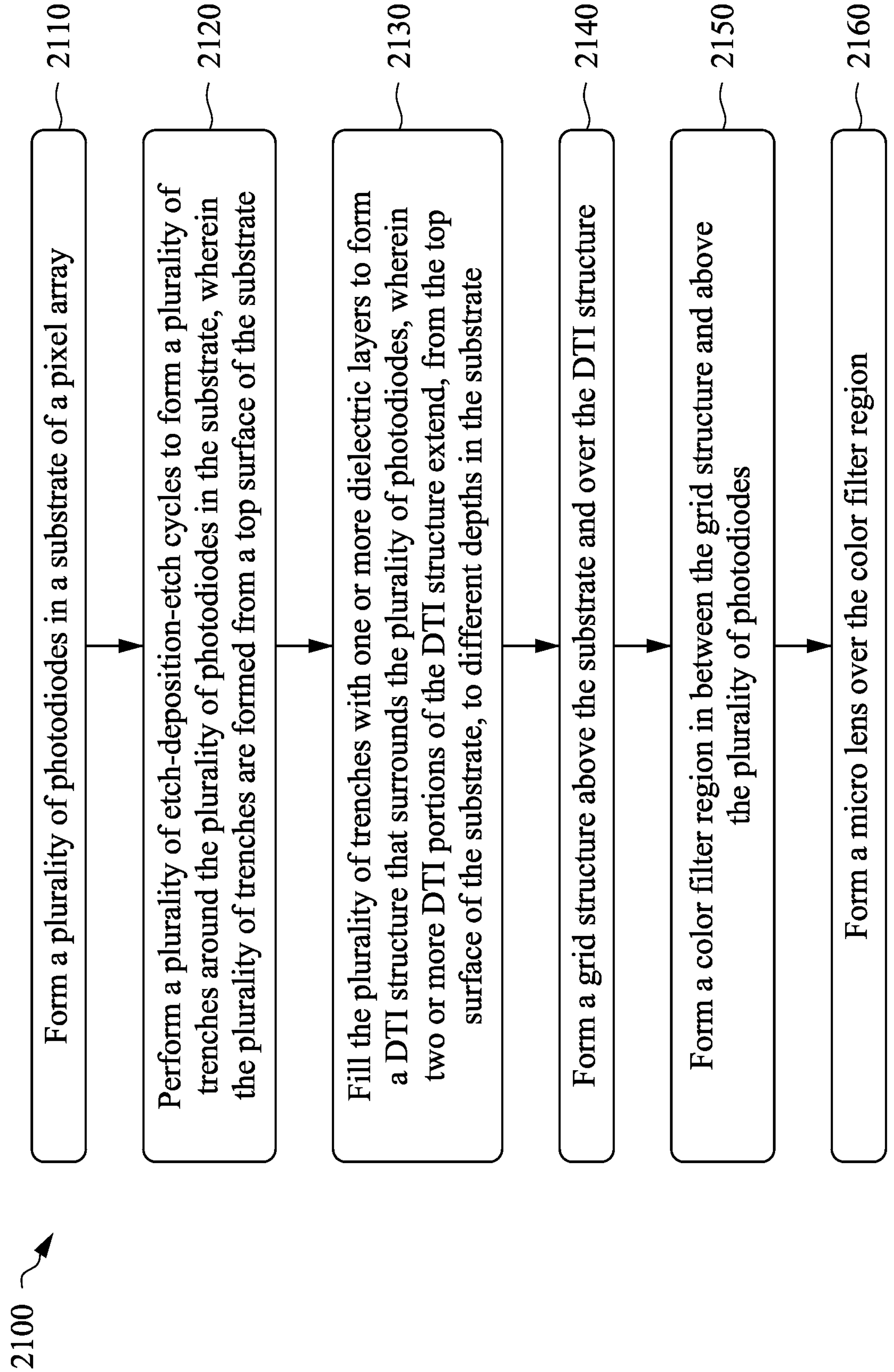
FIG. 21 is a flowchart of an example process associated with forming a pixel sensor array described herein.

FIG. 21 is a flowchart of an example process 2100 associated with forming a pixel sensor array described herein. In some implementations, one or more process blocks of FIG. 21 are performed by one or more semiconductor processing devices (e.g., one or more of the semiconductor processing devices 102-116). Additionally, or alternatively, one or more process blocks of FIG. 21 may be performed by one or more components of device 2000, such as processor 2020, memory 2030, input component 2040, output component 2050, and/or communication component 2060.

As shown in FIG. 21, process 2100 may include forming a plurality of photodiodes in a substrate of a pixel sensor array (block 2110). For example, one or more of the semiconductor processing devices 102-116 may form a plurality of photodiodes 408 in a substrate 406 of a pixel sensor array 316, as described herein.

As further shown in FIG. 21, process 2100 may include performing a plurality of etch-deposition-etch cycles to form a plurality of trenches around the plurality of photodiodes in the substrate (block 2120). For example, one or more of the semiconductor processing devices 102-116 may perform a plurality of etch-deposition-etch cycles 802 to form a plurality of trenches (e.g., trenches 812, 812*a*, 812*b*, 812*c*, trench portions 1402, 1404, 1602, 1604, 1606) around the plurality of photodiodes 408 in the substrate 406, as described herein. In some implementations, the plurality of trenches are formed from a top surface of the substrate 406.

As further shown in FIG. 21, process 2100 may include filling the plurality of trenches with one or more dielectric layers to form a DTI structure that surrounds the plurality of photodiodes (block 2130). For example, one or more of the semiconductor processing devices 102-116 may fill the plurality of trenches with one or more dielectric layers (e.g., a high-k dielectric liner 412, an oxide layer 414) to form a DTI structure 410 that surrounds the plurality of photodiodes 408, as described herein. In some implementations, two or more DTI portions (e.g., DTI portions 1302, 1304, 1502, 1504, 1506) of the DTI structure 410 extend, from the top surface of the substrate 406, to different depths in the substrate.

As further shown in FIG. 21, process 2100 may include forming a grid structure above the substrate and over the DTI structure (block 2140). For example, one or more of the semiconductor processing devices 102-116 may form a grid structure 420 above the substrate 406 and over the DTI structure 410, as described herein.

As further shown in FIG. 21, process 2100 may include forming a color filter region in between the grid structure and above the plurality of photodiodes (block 2150). For example, one or more of the semiconductor processing devices 102-116 may form a color filter region 426 in between the grid structure 420 and above the plurality of photodiodes 408, as described herein.

As further shown in FIG. 21, process 2100 may include forming a micro lens over the color filter region (block 2160). For example, one or more of the semiconductor processing devices 102-116 may form a micro lens 404 over the color filter region 426, as described herein.

Process 2100 may include additional implementations, such as any single implementation or any combination of implementations described below and/or in connection with one or more other processes described elsewhere herein.

In a first implementation, a bias voltage frequency, that is used in the plurality of etch-deposition-etch cycles 802, is selected to achieve a particular profile for the DTI structure 410.

In a second implementation, alone or in combination with the first implementation, performing a first etch-deposition-etch cycle 802, of the plurality of etch-deposition-etch cycles 802, includes performing a first etch operation 804 to form the plurality of trenches to a first depth in the substrate 406, performing a deposition operation 806 to deposit a sidewall protection layer 818 in the plurality of trenches, and performing a second etch operation 808 to remove a portion of the sidewall protection layer 816 from bottom surfaces of the plurality of trenches, where the sidewall protection layer 816 protects sidewalls of the plurality of trenches during a second etch-deposition-etch cycle 802 to increase the depth of the plurality of trenches from the first depth to a second depth.

In a third implementation, alone or in combination with one or more of the first and second implementations, the first etch operation 804 includes an isotropic etch operation, and the second etch operation 808 includes an anisotropic etch operation as a result of the sidewall protection layer 818.

In a fourth implementation, alone or in combination with one or more of the first through third implementations, performing the plurality of etch-deposition-etch cycles 802 to form the plurality of trenches around the plurality of photodiodes 408 in the substrate 406 includes forming a first trench, of the plurality of trenches, such that the first trench extends to a first STI region 418 at a bottom surface of the substrate 406, and forming a second trench, of the plurality of trenches, such that the second trench does not extend to any STI region at the bottom surface of the substrate.

In a fifth implementation, alone or in combination with one or more of the first through fourth implementations, performing the plurality of etch-deposition-etch cycles 802 to form the plurality of trenches around the plurality of photodiodes 408 in the substrate includes forming a third trench, of the plurality of trenches, such that the third trench does not extend to any STI region at the bottom surface of the substrate 406, where the third trench extends to a greater depth in the substrate 406, from the top surface of the substrate 406, relative to the second trench.

In a sixth implementation, alone or in combination with one or more of the first through fifth implementations, forming the micro lens 404 over the color filter region 426 includes forming the micro lens 404 such that the micro lens 404 is at least partially offset relative to the color filter region 426.

Although FIG. 21 shows example blocks of process 2100, in some implementations, process 2100 includes additional blocks, fewer blocks, different blocks, or differently arranged blocks than those depicted in FIG. 21. Additionally, or alternatively, two or more of the blocks of process 2100 may be performed in parallel.

In this way, a pixel sensor array of an image sensor device described herein may include a DTI structure that includes a plurality of DTI portions that extend into a substrate of the image sensor device. Two or more subsets of the plurality of DTI portions may extend around photodiodes of a pixel sensor of the pixel sensor array, and may extend into the substrate to different depths. The different depths enable the photocurrents generated by the photodiodes to be binned and used to generate unified photocurrent. In particular, the different depths enable photons to intermix in the photodiodes, which enables QPD binning for increased PDAF performance. The increased PDAF performance may include increased autofocus speed, increased high dynamic range, increased QE and/or increased FWC, among other examples.

As described in greater detail above, some implementations described herein provide a pixel sensor array. The pixel sensor array includes a plurality of pixel sensors arranged in a grid, where the plurality of pixel sensors correspond to a QPD region of the pixel sensor array, and where a pixel sensor, of the plurality of pixel sensors, comprises: a first photodiode in a substrate of the pixel sensor array a second photodiode horizontally adjacent with the first photodiode in the substrate of the pixel sensor array a color filter region over the first photodiode and the second photodiode. The pixel sensor array includes a DTI structure that includes a first DTI portion that extends from a top surface of the substrate and into the substrate along an outer side of the first photodiode, a second DTI portion that extends from the top surface of the substrate and into the substrate along an outer side of the second photodiode, and a third DTI portion that extends from the top surface of the substrate into the substrate and between the first photodiode and the second photodiode. A depth of the third DTI portion, relative to the top surface of the substrate, is lesser than a depth of the first DTI portion relative to the top surface of the substrate. The depth of the third DTI portion is lesser than a depth of the second DTI portion relative to the top surface of the substrate.

As described in greater detail above, some implementations described herein provide a method. The method includes forming a plurality of photodiodes in a substrate of a pixel sensor array. The method includes performing a plurality of etch-deposition-etch cycles to form a plurality of trenches around the plurality of photodiodes in the substrate, where the plurality of trenches are formed from a top surface of the substrate. The method includes filling the plurality of trenches with one or more dielectric layers to form a DTI structure that surrounds the plurality of photodiodes, where two or more DTI portions of the DTI structure extend, from the top surface of the substrate, to different depths in the substrate. The method includes forming a grid structure above the substrate and over the DTI structure. The method includes forming a color filter region in between the grid structure and above the plurality of photodiodes. The method includes forming a micro lens over the color filter region.

As described in greater detail above, some implementations described herein provide an image sensor device. The image sensor device includes a sensor die that includes a plurality of QPD regions and a DTI structure surrounding photodiodes of a QPD region of the plurality of QPD regions such that the photodiodes are configured to generate a unified photocurrent. The image sensor device includes an integrated circuitry die, bonded with the sensor die and configured to receive the unified photocurrent and to perform PDAF for the image sensor device based on the unified photocurrent.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
forming a plurality of photodiodes in a substrate of a pixel sensor array;
performing a plurality of etch-deposition-etch cycles to form a plurality of trenches around the plurality of photodiodes in the substrate,
wherein the plurality of trenches are formed from a top surface of the substrate;
filling the plurality of trenches with one or more dielectric layers to form a deep trench isolation (DTI) structure that surrounds the plurality of photodiodes,
wherein three or more DTI portions of the DTI structure extend, from the top surface of the substrate, to different depths in the substrate;
forming a grid structure above the substrate and over the DTI structure;
forming a color filter region in between the grid structure and above the plurality of photodiodes; and
forming a micro lens over the color filter region.

2. The method of claim 1,
wherein a bias voltage frequency, that is used in the plurality of etch-deposition-etch cycles, is selected to achieve a particular profile for the DTI structure.

3. The method of claim 1,
wherein performing a first etch-deposition-etch cycle, of the plurality of etch-deposition-etch cycles, comprises:
performing a first etch operation to form the plurality of trenches to a first depth in the substrate;
performing a deposition operation to deposit a sidewall protection layer in the plurality of trenches; and
performing a second etch operation to remove a portion of the sidewall protection layer from bottom surfaces of the plurality of trenches,
wherein the sidewall protection layer protects sidewalls of the plurality of trenches during a second etch-deposition-etch cycle to increase the depth of the plurality of trenches from the first depth to a second depth.

4. The method of claim 3,
wherein the first etch operation comprises an isotropic etch operation; and
wherein the second etch operation comprises an anisotropic etch operation as a result of the sidewall protection layer.

5. The method of claim 1,
wherein performing the plurality of etch-deposition-etch cycles to form the plurality of trenches around the plurality of photodiodes in the substrate comprises:
forming a first trench, of the plurality of trenches, such that the first trench extends to a first shallow trench isolation (STI) region at a bottom surface of the substrate; and
forming a second trench, of the plurality of trenches, such that the second trench does not extend to any STI region at the bottom surface of the substrate.

6. The method of claim 5,
wherein performing the plurality of etch-deposition-etch cycles to form the plurality of trenches around the plurality of photodiodes in the substrate comprises:
forming a third trench, of the plurality of trenches, such that the third trench does not extend to any STI region at the bottom surface of the substrate,
wherein the third trench extends to a greater depth in the substrate, from the top surface of the substrate, relative to the second trench.

7. The method of claim 1,
wherein forming the micro lens over the color filter region comprises:
forming the micro lens such that the micro lens is at least partially offset relative to the color filter region.

8. A method, comprising:
forming a plurality of pixel sensors arranged in a grid,
wherein the plurality of pixel sensors correspond to a quadratic photo detection (QPD) region of the pixel sensor array, and
wherein a pixel sensor, of the plurality of pixel sensors, comprises:
a first photodiode in a substrate of the pixel sensor array;
a second photodiode horizontally adjacent with the first photodiode in the substrate of the pixel sensor array; and
a color filter region over the first photodiode and the second photodiode;
forming a deep trench isolation (DTI) structure, comprising:
a first DTI portion that extends from a top surface of the substrate and into the substrate along an outer side of the first photodiode;
a second DTI portion that extends from the top surface of the substrate and into the substrate along an outer side of the second photodiode; and
a third DTI portion that extends from the top surface of the substrate into the substrate and between the first photodiode and the second photodiode,
wherein a depth of the third DTI portion, relative to the top surface of the substrate, is less than a depth of the first DTI portion relative to the top surface of the substrate, and
wherein the depth of the third DTI portion is less than a depth of the second DTI portion relative to the top surface of the substrate, and the depth of the first DTI portion is different from the depth of the second DTI portion.

9. The method of claim 8,
wherein at least one of the first DTI portion, the second DTI portion, or the third DTI portion comprises:
a flared section; and
a tapered section below the flared section.

10. The method of claim 8,
wherein at least one of the first DTI portion, the second DTI portion, or the third DTI portion comprises:
a tapered profile that continuously changes in width from the top surface of the substrate toward a bottom surface of the substrate.

11. The method of claim 8,
wherein at least one of the first DTI portion, the second DTI portion, or the third DTI portion comprises:
a plurality of stepped sections that change in width from the top surface of the substrate toward a bottom surface of the substrate.

12. The method of claim 8,
wherein the first DTI portion continuously extends from the top surface of the substrate to a first shallow trench isolation (STI) region at a bottom surface of the substrate;
wherein the second DTI portion continuously extends from the top surface of the substrate to a second STI region at the bottom surface of the substrate; and wherein the third DTI portion is spaced apart, by the substrate, from a third STI region at the bottom surface of the substrate.

13. The method of claim 8, wherein the pixel sensor comprises a first pixel sensor of the plurality of pixel sensors;

wherein the plurality of pixel sensors comprises a second pixel sensor adjacent to the first pixel sensor in the grid; and wherein the second DTI portion extends along an outer side of a third photodiode of the second pixel sensor.

14. A method of forming an image sensor device, comprising:

forming a sensor die, comprising:

a plurality of quadratic photo detection (QPD) regions; and a deep trench isolation (DTI) structure surrounding photodiodes of a QPD region of the plurality of QPD regions such that the photodiodes are configured to generate a unified photocurrent, wherein three or more DTI portions of the DTI structure extend, from a top surface of a substrate, to different depths in the substrate, wherein a depth of a first DTI portion is greater than a depth of a second DTI portion; and wherein a depth of a third DTI portion is less than the depth of the first DTI portion and the depth of the second DTI portion; and forming an integrated circuitry die, bonded with the sensor die, configured to:

receive the unified photocurrent; and perform phase detection autofocus (PDAF) for the image sensor device based on the unified photocurrent.

15. The method of claim 14, wherein the photodiodes are included in pixel sensors of the QPD region; and wherein the pixel sensors are arranged in a 2×2 grid on the sensor die.

16. The method of claim 15, wherein:

the first DTI portion surrounds an outer perimeter of the 2×2 grid; and the second DTI portion is in between the pixel sensors in the 2×2 grid.

17. The method of claim 16, wherein the:

third DTI portion is in between the photodiodes of the pixel sensors.

18. The method of claim 14, wherein the depth of the second DTI portion is between 62% and 78% of the first DTI portion.

19. The method of claim 14, wherein at least one of the first DTI portion, the second DTI portion, or the third DTI portion comprises:

a flared section; and a tapered section below the flared section.

20. The method of claim 14, wherein at least one of the first DTI portion, the second DTI portion, or the third DTI portion comprises:

a tapered profile that continuously changes in width from the top surface of the substrate toward a bottom surface of the substrate.

* * * * *